(12) United States Patent
Cernea et al.

(10) Patent No.: US 12,096,630 B2
(45) Date of Patent: Sep. 17, 2024

(54) STAIRCASE STRUCTURES FOR ELECTRICALLY CONNECTING MULTIPLE HORIZONTAL CONDUCTIVE LAYERS OF A 3-DIMENSIONAL MEMORY DEVICE

(71) Applicant: SUNRISE MEMORY CORPORATION, Fremont, CA (US)

(72) Inventors: Raul Adrian Cernea, Santa Clara, CA (US); Wu-Yi Henry Chien, San Jose, CA (US); Eli Harari, Saratoga, CA (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 0 days.

(21) Appl. No.: 16/577,469

(22) Filed: Sep. 20, 2019

(65) Prior Publication Data

US 2020/0098779 A1    Mar. 26, 2020

Related U.S. Application Data

(60) Provisional application No. 62/771,922, filed on Nov. 27, 2018, provisional application No. 62/734,175, filed on Sep. 20, 2018.

(51) Int. Cl.
| | |
|---|---|
| *H10B 43/20* | (2023.01) |
| *H01L 21/285* | (2006.01) |
| *H01L 21/306* | (2006.01) |
| *H01L 21/3213* | (2006.01) |
| *H01L 21/768* | (2006.01) |
| *H01L 23/522* | (2006.01) |

(Continued)

(52) U.S. Cl.
CPC ....... *H10B 43/20* (2023.02); *H01L 21/28525* (2013.01); *H01L 21/30604* (2013.01); *H01L 21/32133* (2013.01); *H01L 21/76816* (2013.01); *H01L 21/76877* (2013.01); *H01L 23/5226* (2013.01); *H01L 23/5283* (2013.01); *H01L 23/53271* (2013.01); *H10B 43/30* (2023.02)

(58) Field of Classification Search
CPC ......... H01L 27/11578; H01L 27/11568; H01L 21/76186; H01L 21/76877; H01L 21/11578; H01L 23/528; H01L 29/7926; H10B 43/20
See application file for complete search history.

(56) References Cited

U.S. PATENT DOCUMENTS

| 8,581,323 B2 | 11/2013 | Uenaka et al. |
| 9,343,405 B2 | 5/2016 | Matsuda |

(Continued)

FOREIGN PATENT DOCUMENTS

| KR | 20120085603 | 8/2012 |

OTHER PUBLICATIONS

"PCT Search Report and Written Opinion, PCT/US2019/052164", Feb. 27, 2020.

*Primary Examiner* — Samuel A Gebremariam
*Assistant Examiner* — Jonas T Beardsley
(74) *Attorney, Agent, or Firm* — Edward C. Kwok; VLP Law Group LLP

(57) ABSTRACT

Various methods and various staircase structures formed out of the active strips of a memory structure (e.g., a memory array having a three-dimensional arrangement of NOR memory strings) above a semiconductor substrate allows efficient electrical connections to semiconductor layers within the active strips.

10 Claims, 53 Drawing Sheets

(51) Int. Cl.
*H01L 23/528* (2006.01)
*H01L 23/532* (2006.01)
*H10B 43/30* (2023.01)

(56) References Cited

U.S. PATENT DOCUMENTS

| | | | |
|---|---|---|---|
| 9,455,268 B2 | 9/2016 | Oh et al. | |
| 9,620,605 B2 | 4/2017 | Liang et al. | |
| 9,633,944 B2 | 4/2017 | Kim | |
| 10,008,511 B2 | 6/2018 | Lee | |
| 10,056,433 B2 | 8/2018 | Kiyotoshi et al. | |
| 10,211,219 B2 | 2/2019 | Kito et al. | |
| 10,217,667 B2 | 2/2019 | Or-Bach et al. | |
| 2002/0028541 A1* | 3/2002 | Lee | G11C 16/3427 438/149 |
| 2007/0252201 A1* | 11/2007 | Kito | H01L 27/105 257/331 |
| 2008/0073635 A1* | 3/2008 | Kiyotoshi | H10B 43/30 257/E21.409 |
| 2009/0309152 A1* | 12/2009 | Knoefler | H10B 43/10 438/257 |
| 2010/0219392 A1 | 9/2010 | Awaya et al. | |
| 2010/0254191 A1 | 10/2010 | Son et al. | |
| 2010/0320526 A1* | 12/2010 | Kidoh | H01L 23/522 257/E21.409 |
| 2011/0169071 A1 | 7/2011 | Uenaka et al. | |
| 2015/0115455 A1 | 4/2015 | Chen | |
| 2015/0380418 A1 | 12/2015 | Zhang et al. | |
| 2016/0020169 A1* | 1/2016 | Matsuda | H01L 21/76802 438/622 |
| 2017/0053906 A1 | 2/2017 | Or-Bach et al. | |
| 2017/0092371 A1 | 3/2017 | Harari | |
| 2017/0316981 A1 | 11/2017 | Chen et al. | |
| 2018/0151497 A1 | 5/2018 | Makala et al. | |
| 2019/0355672 A1 | 11/2019 | Fujita et al. | |
| 2019/0393241 A1* | 12/2019 | Baek | H10B 43/50 |
| 2020/0258897 A1 | 8/2020 | Yan et al. | |

* cited by examiner

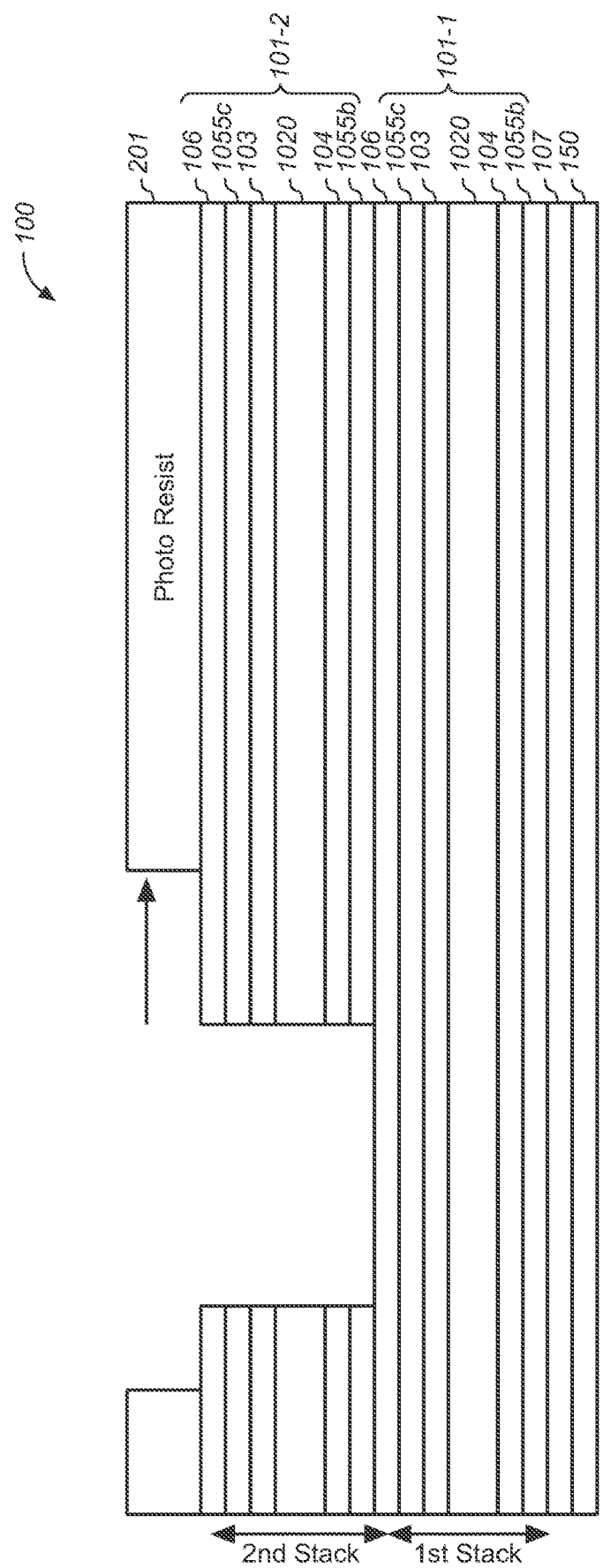
FIG. 2iii

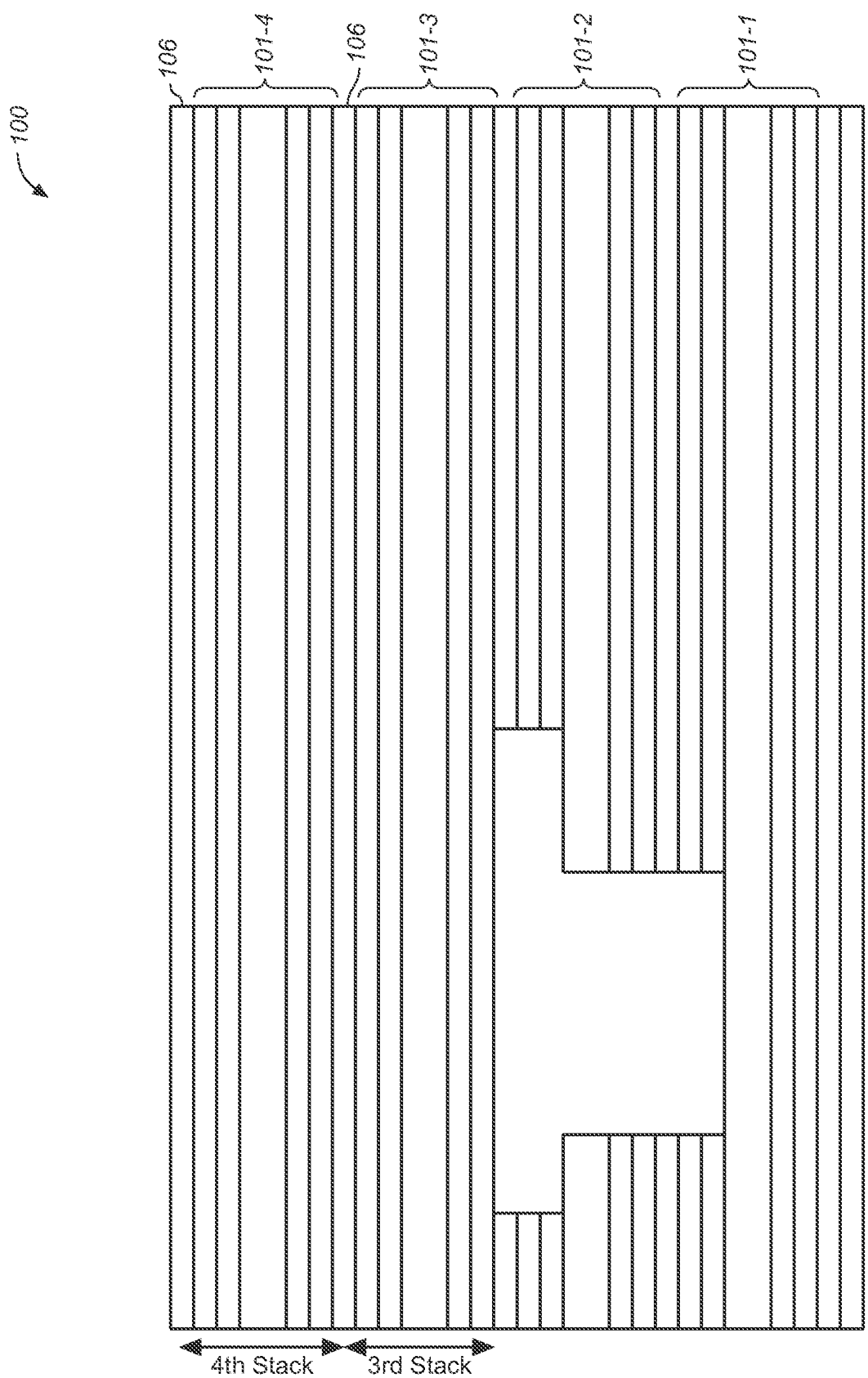

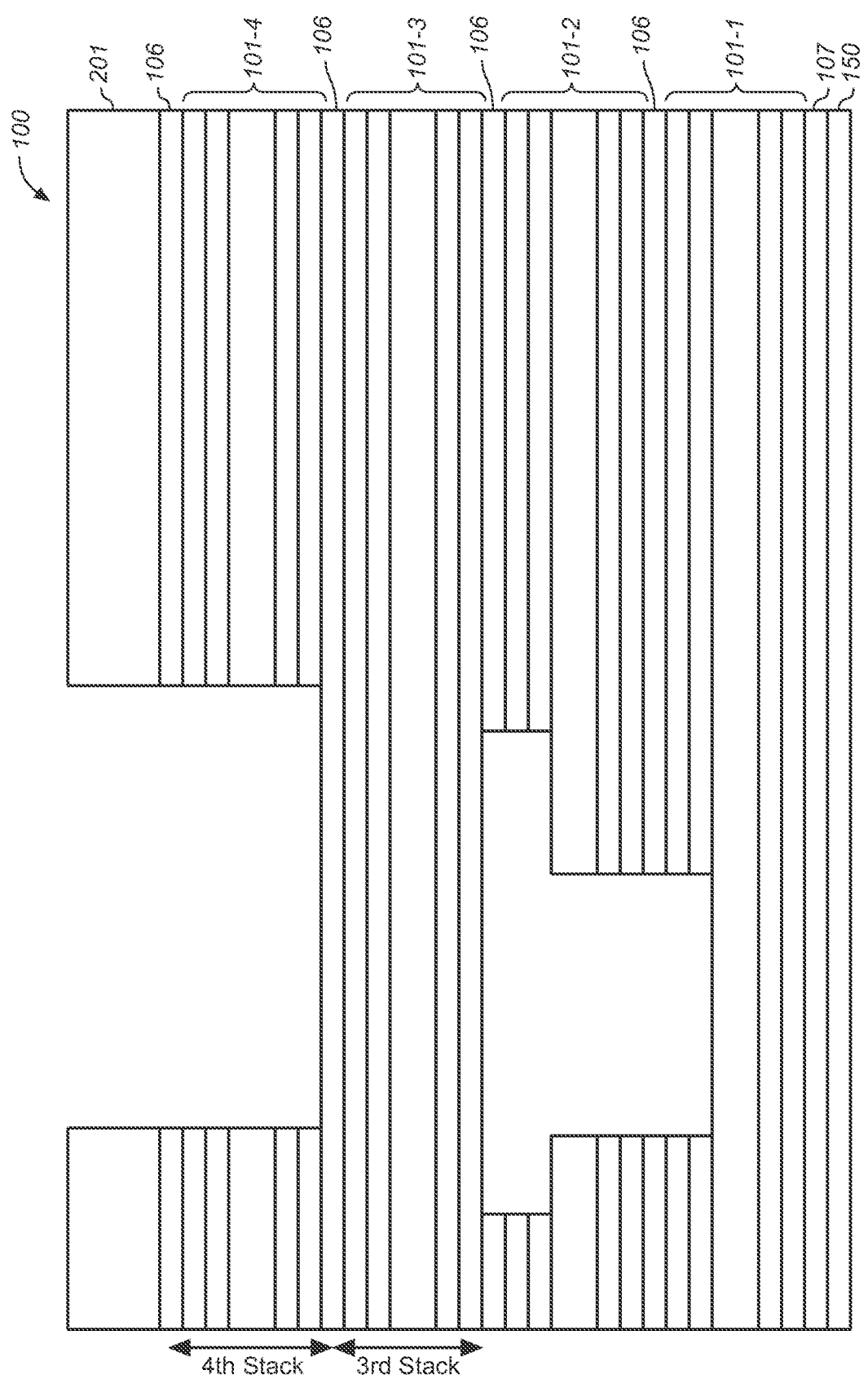

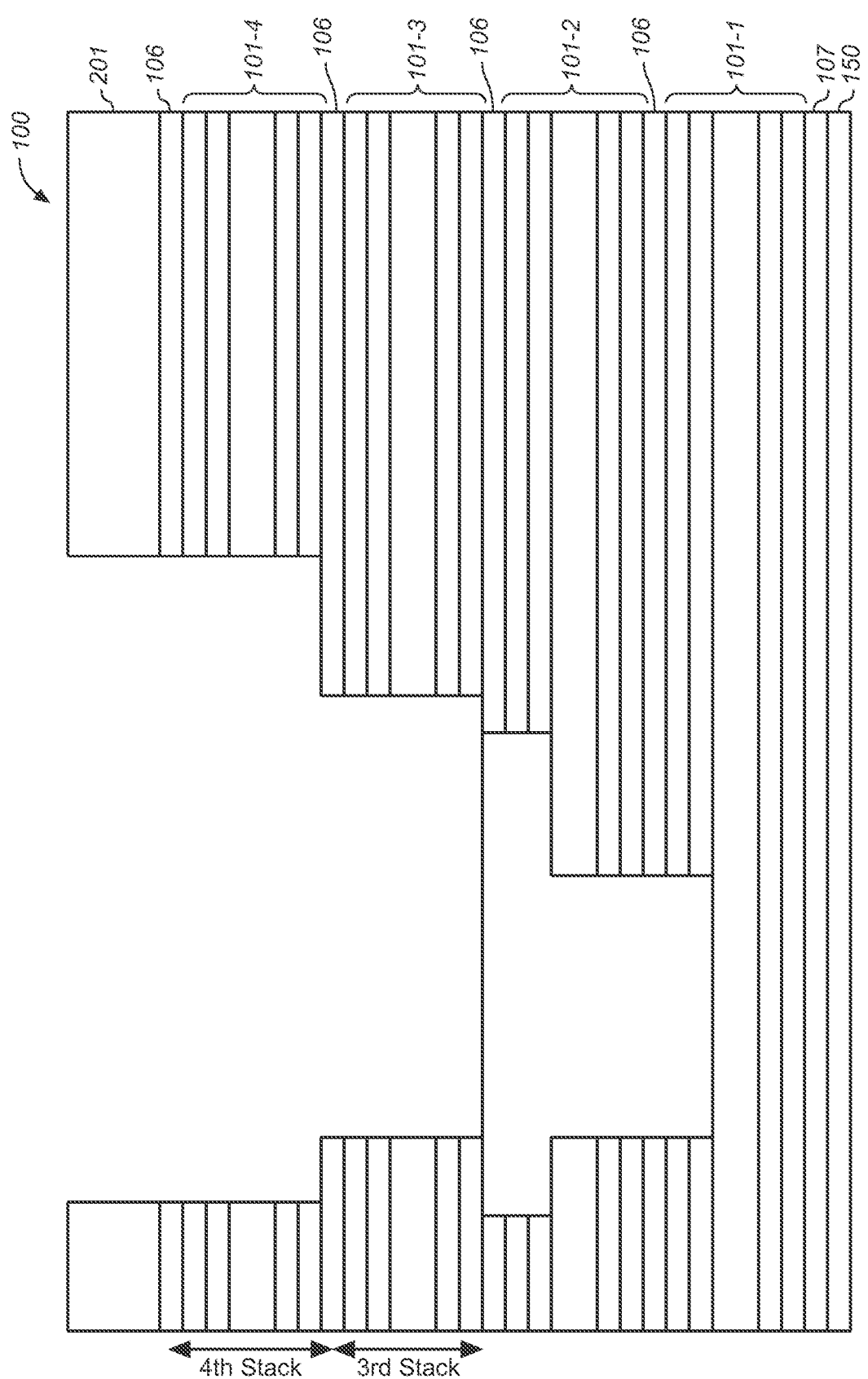
FIG. 2viii

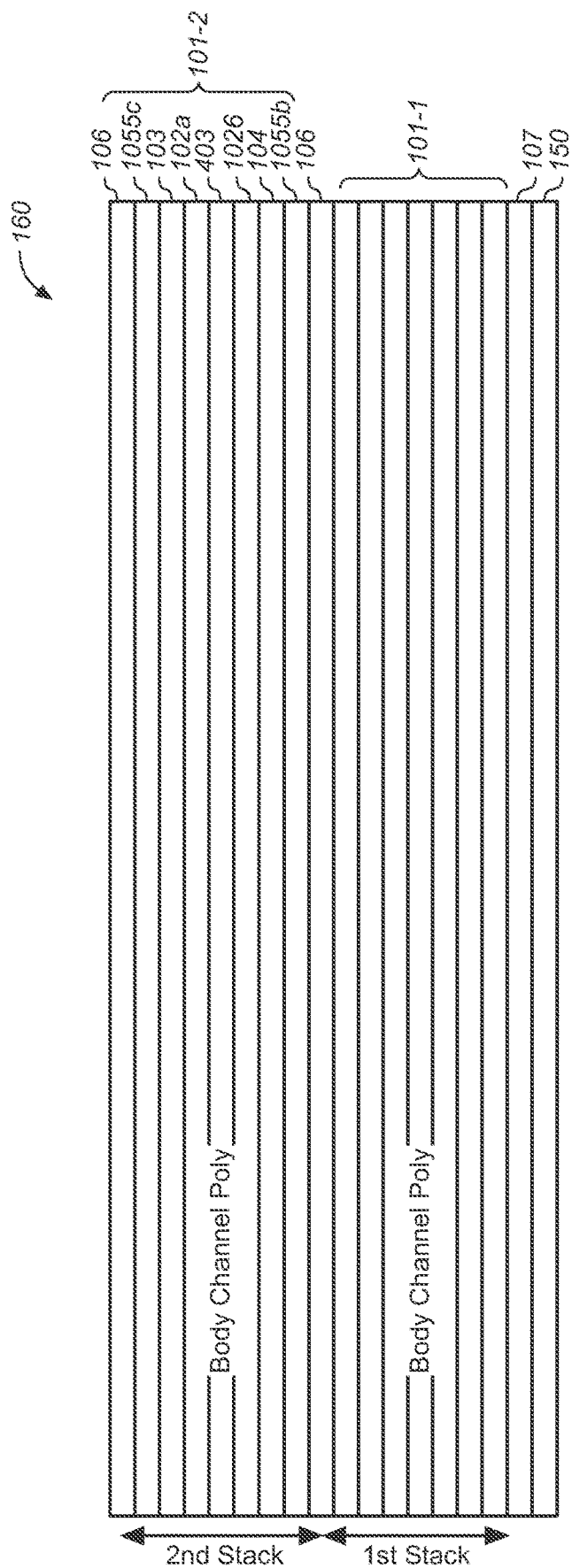
FIG. 2xii

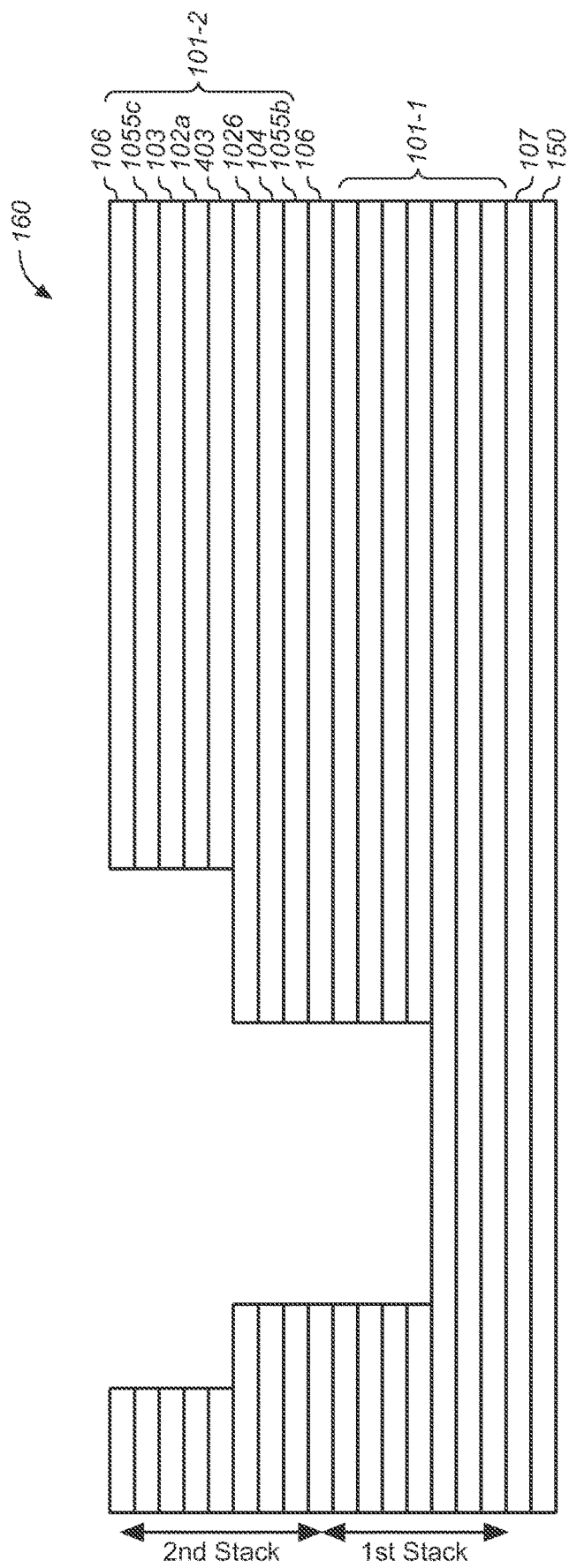
FIG. 2xiii

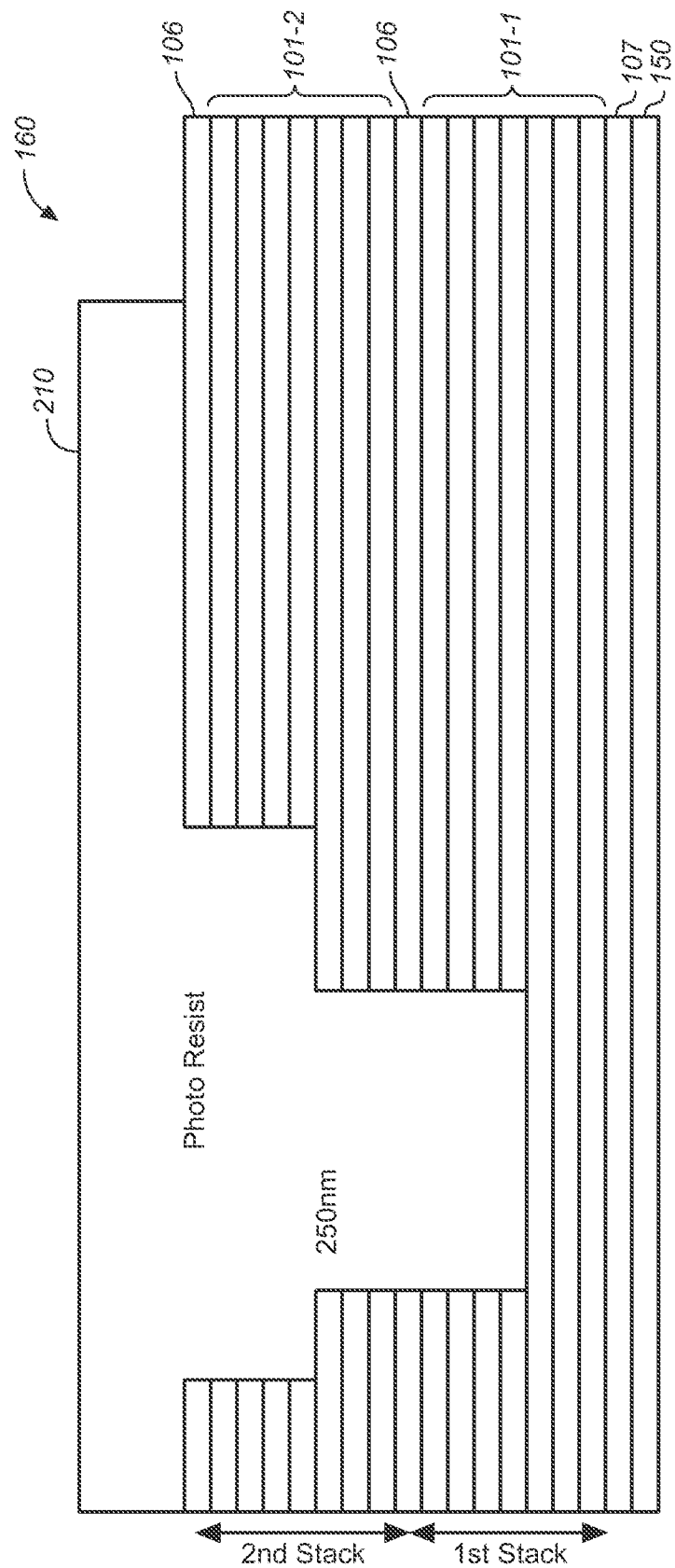
FIG. 2xiv

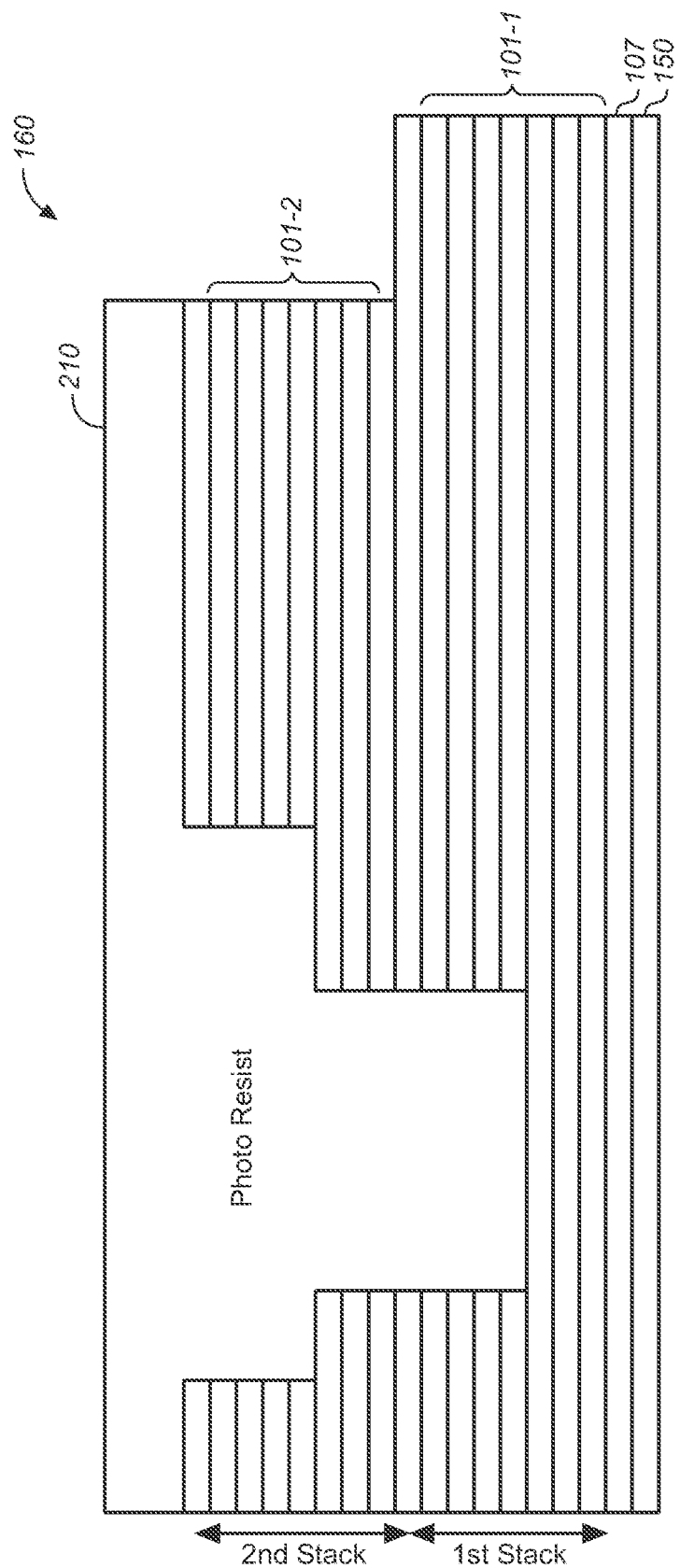

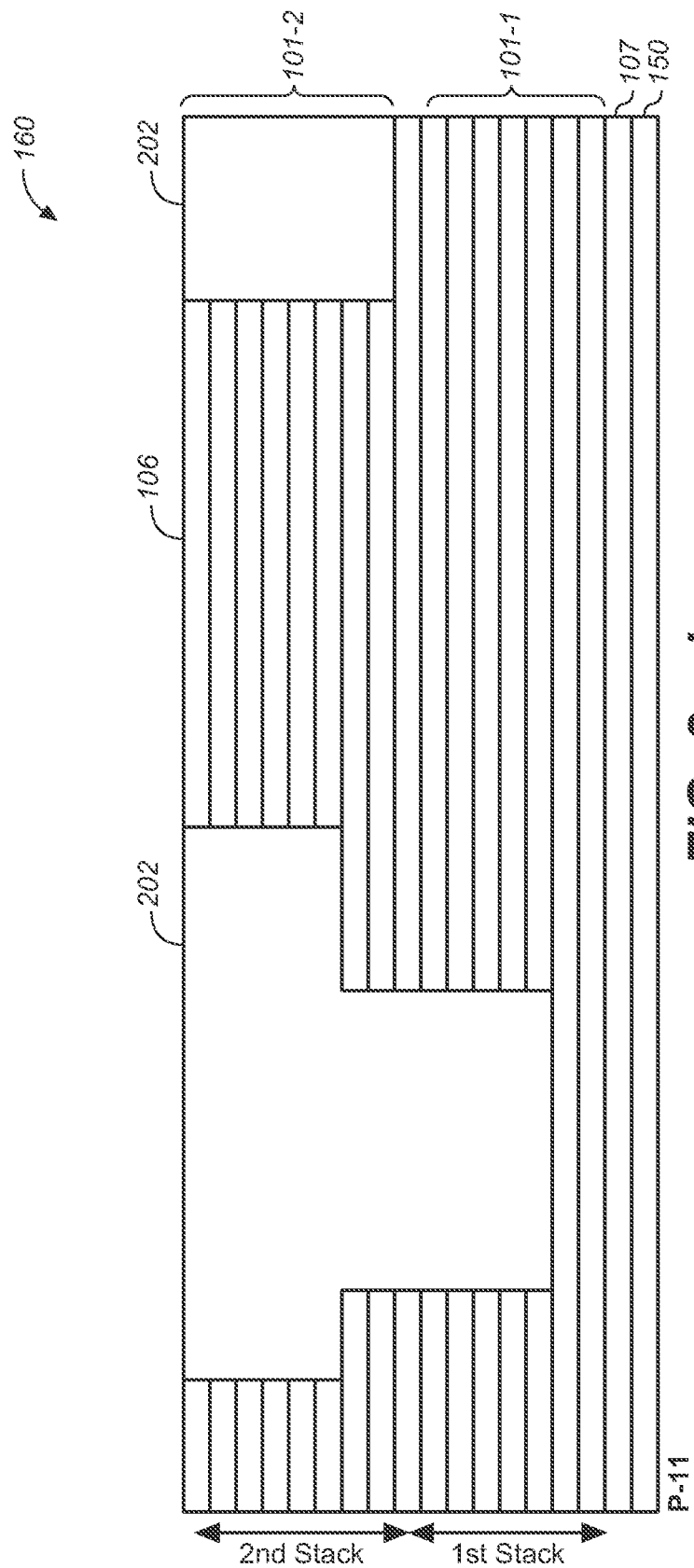
FIG. 2xvi

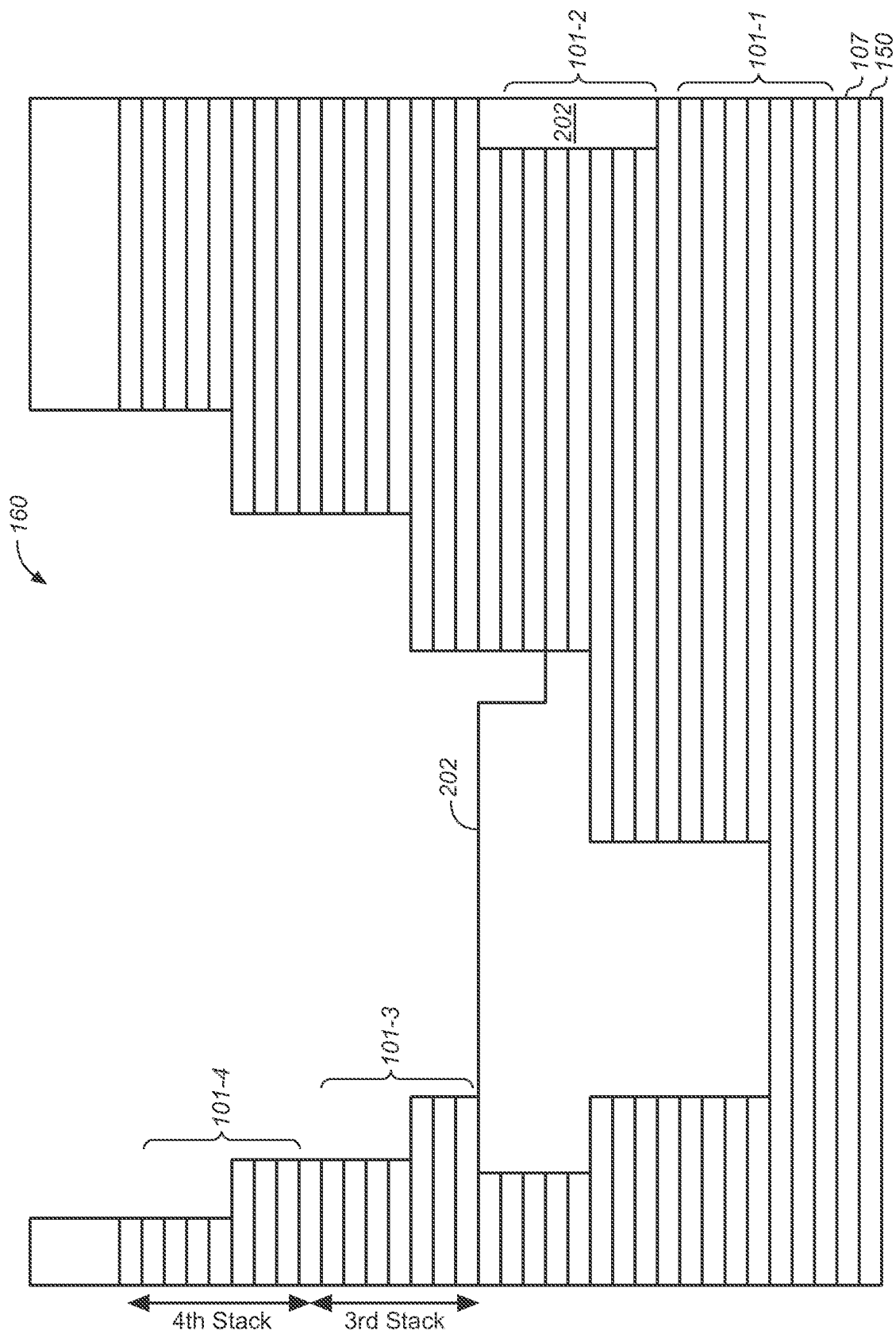
FIG. 2xvii

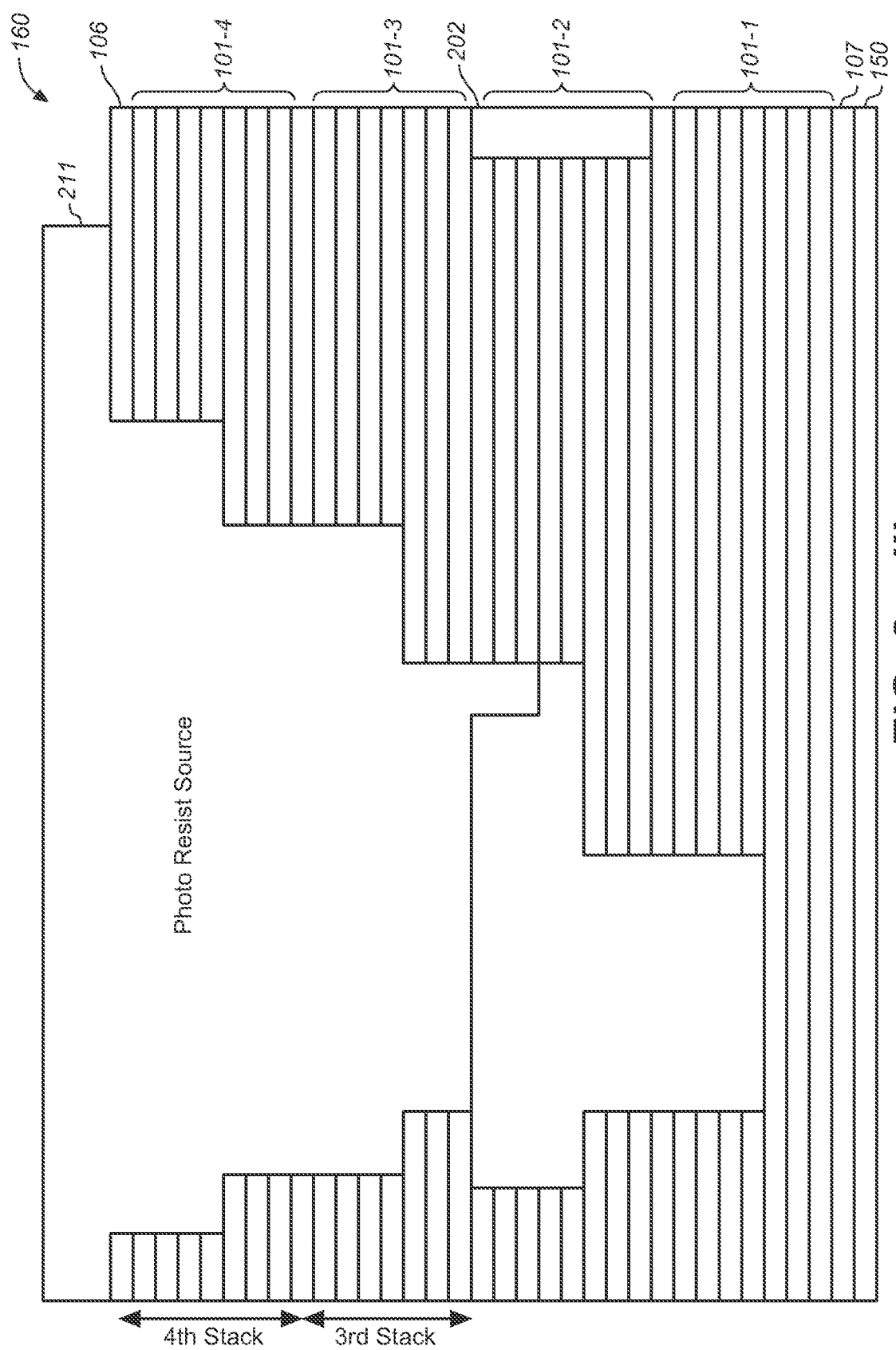

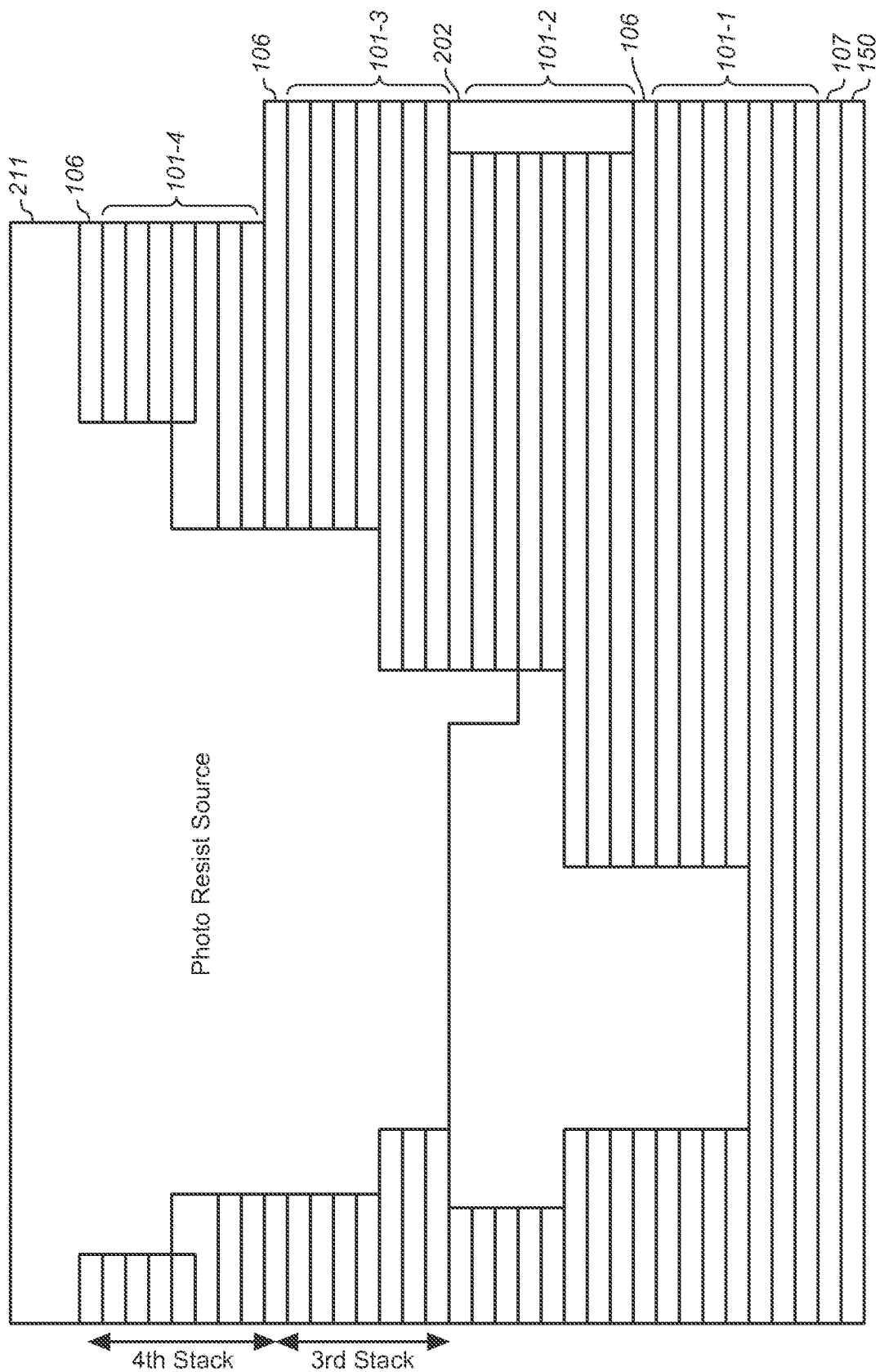

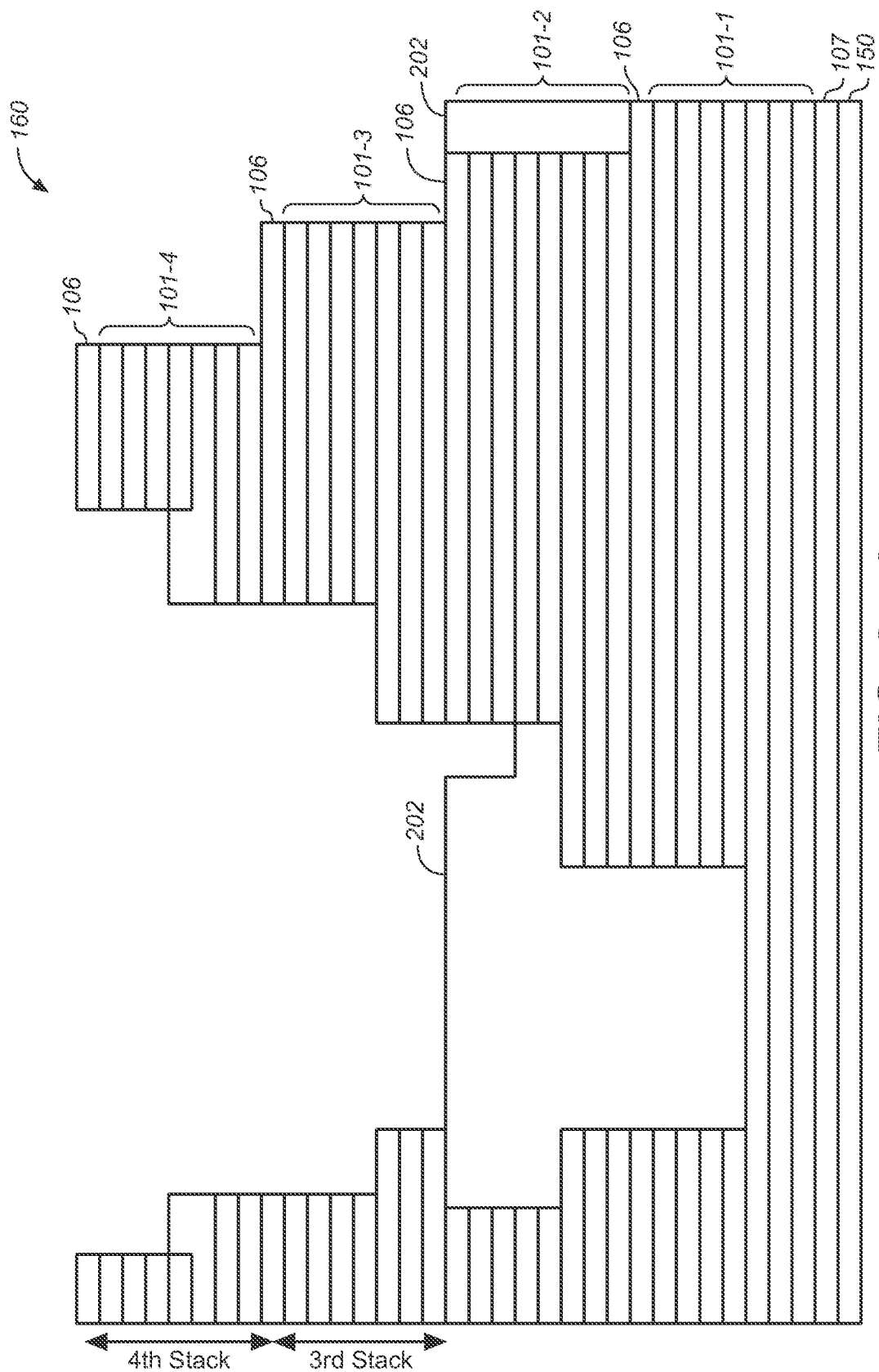
FIG. 2xxi

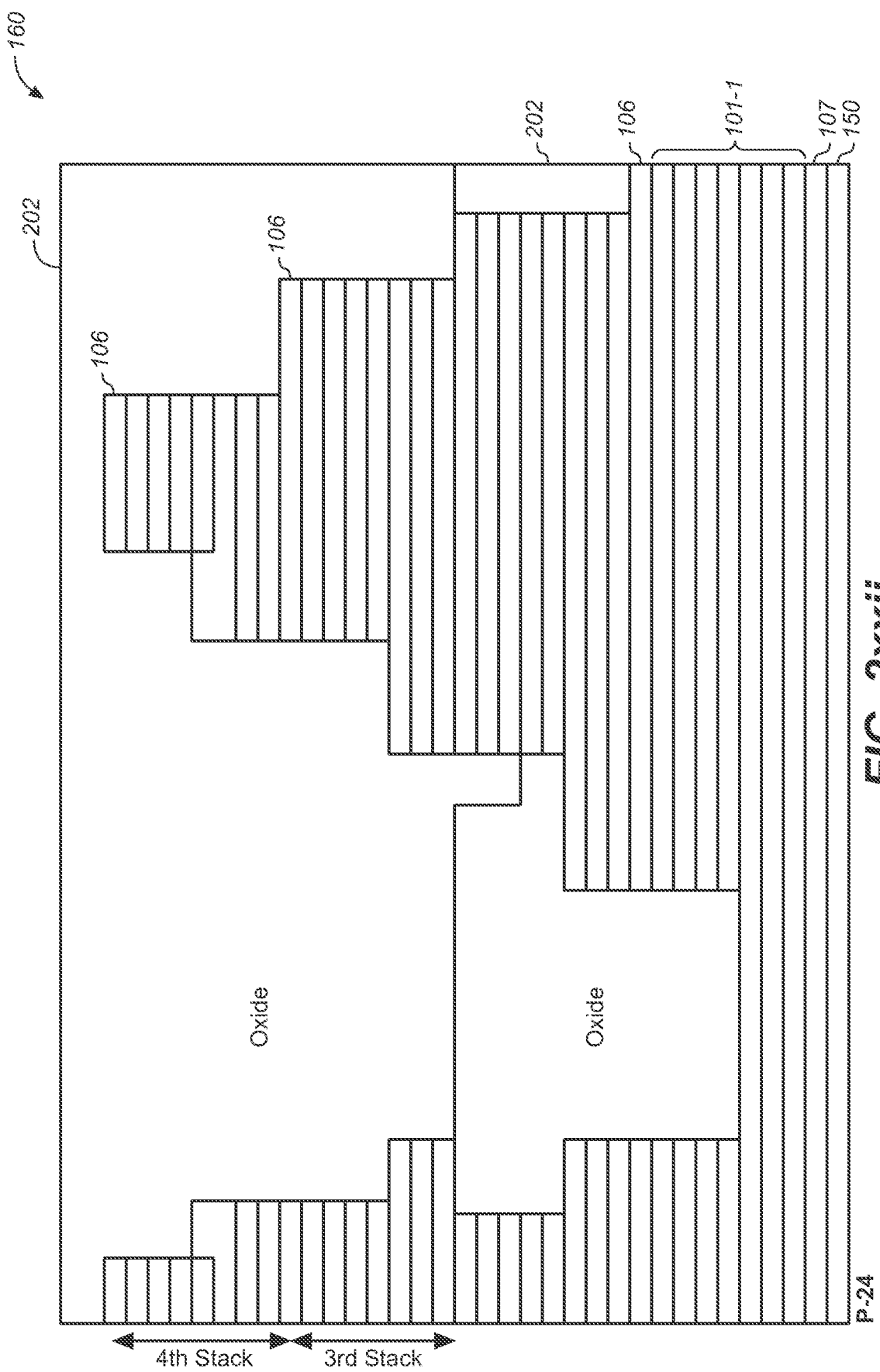

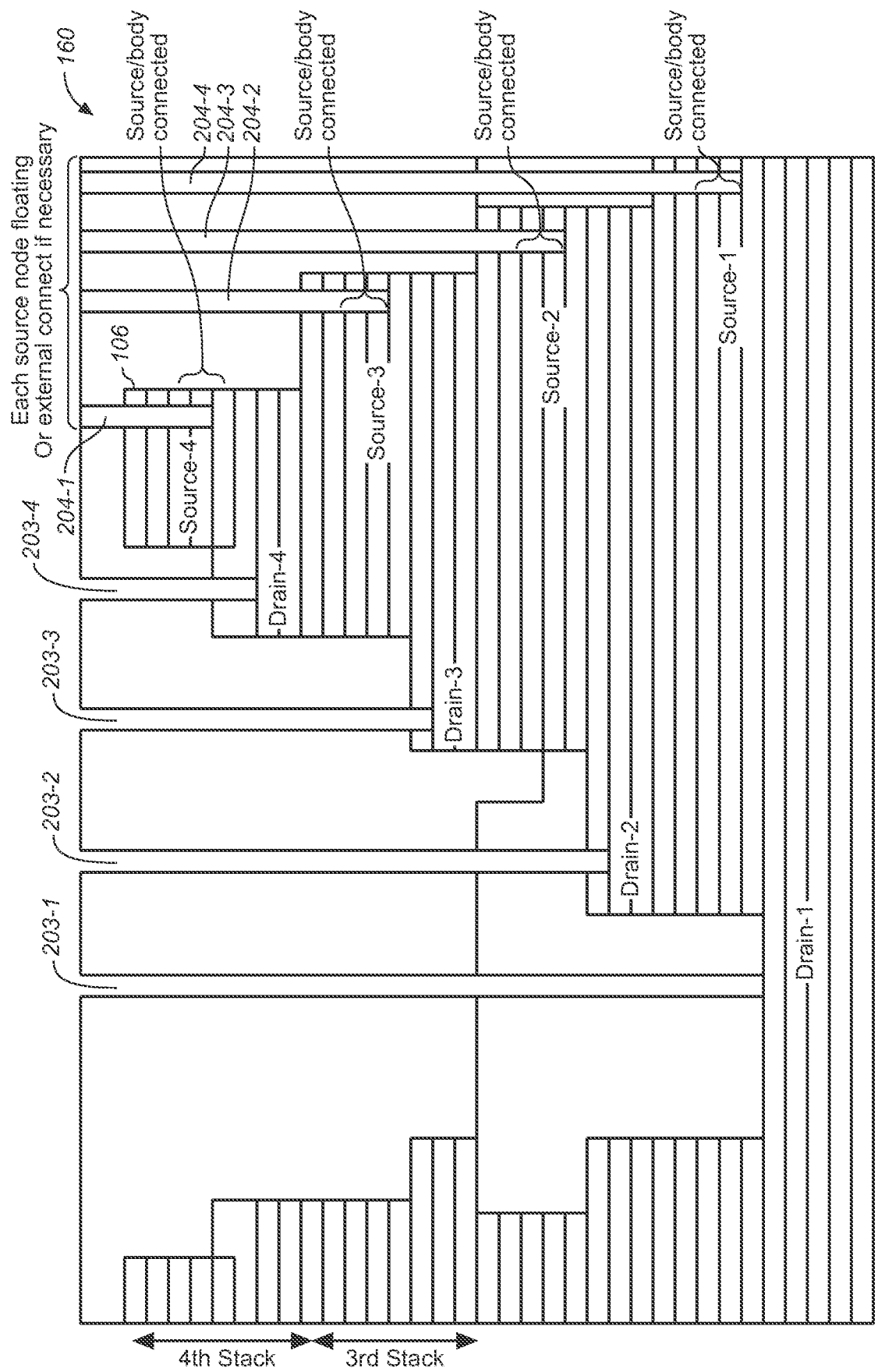
FIG. 2xxiii

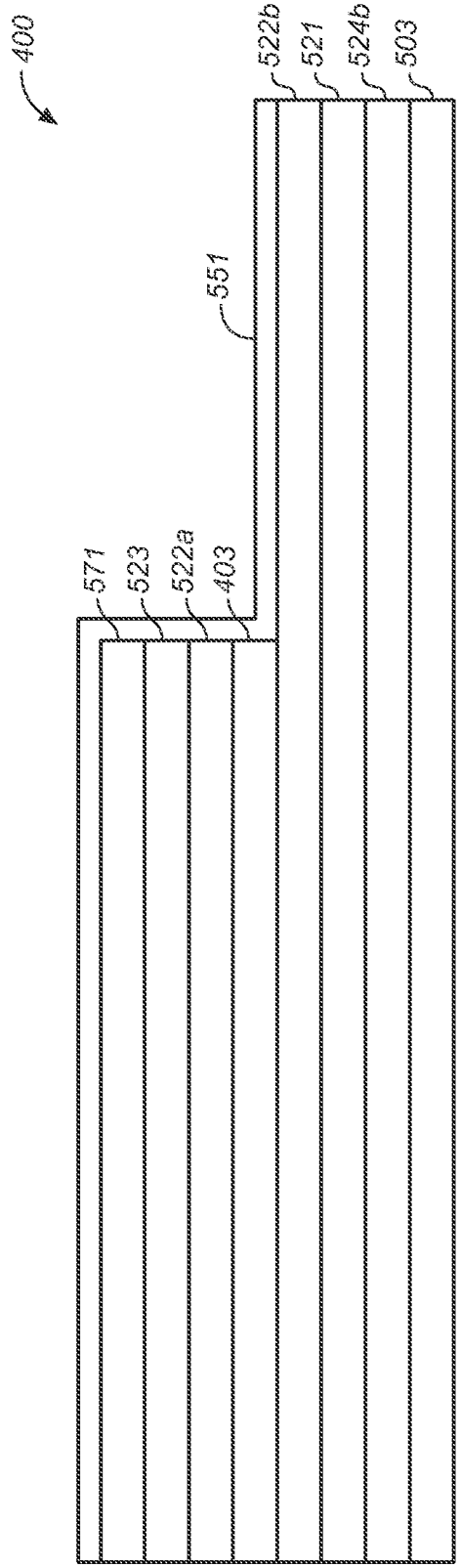
FIG. 3iii
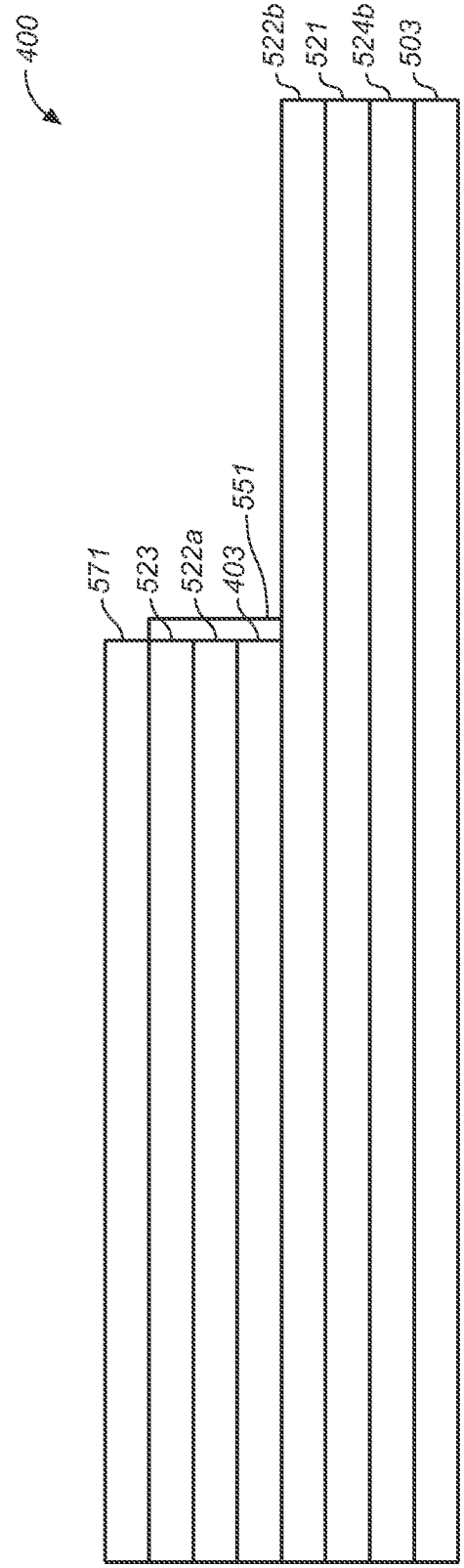
FIG. 3iv

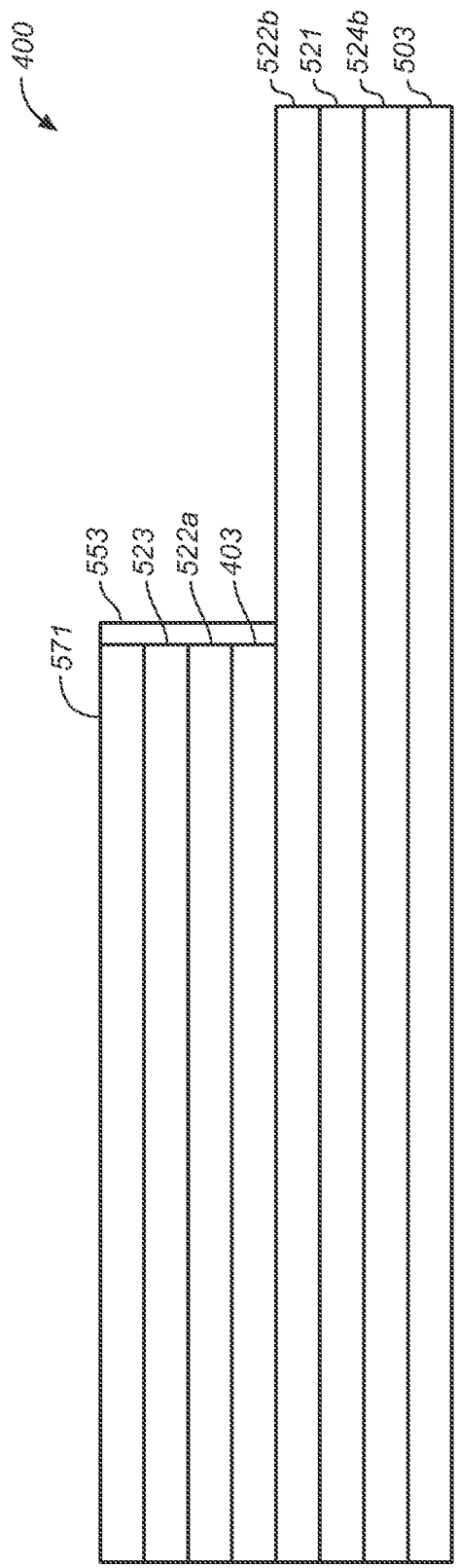
FIG. 3vii
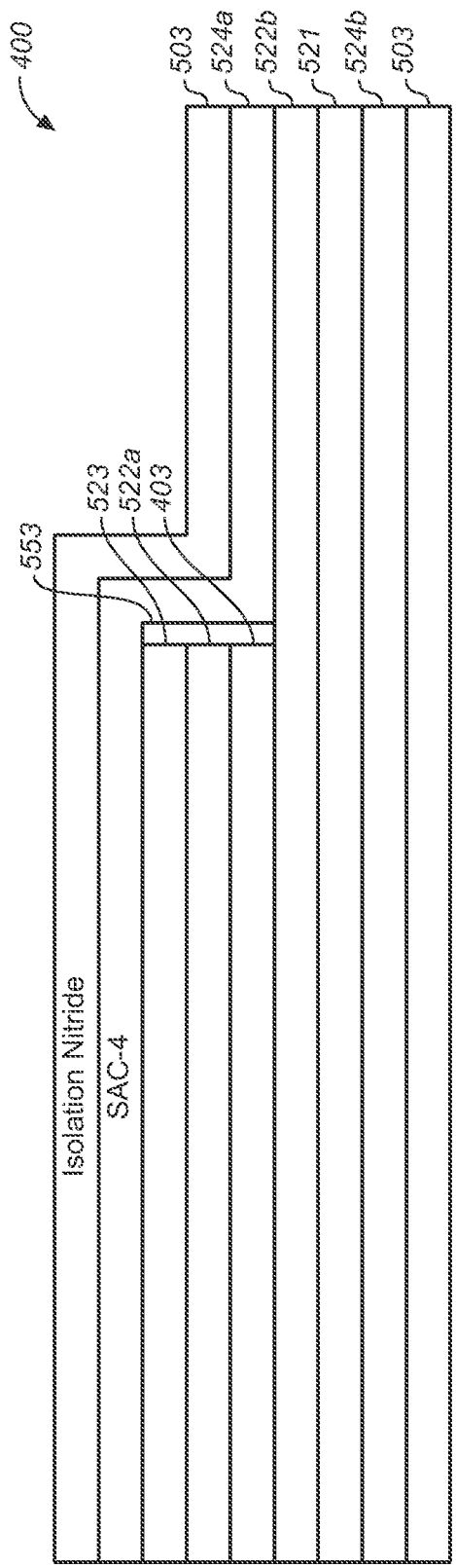
FIG. 3viii

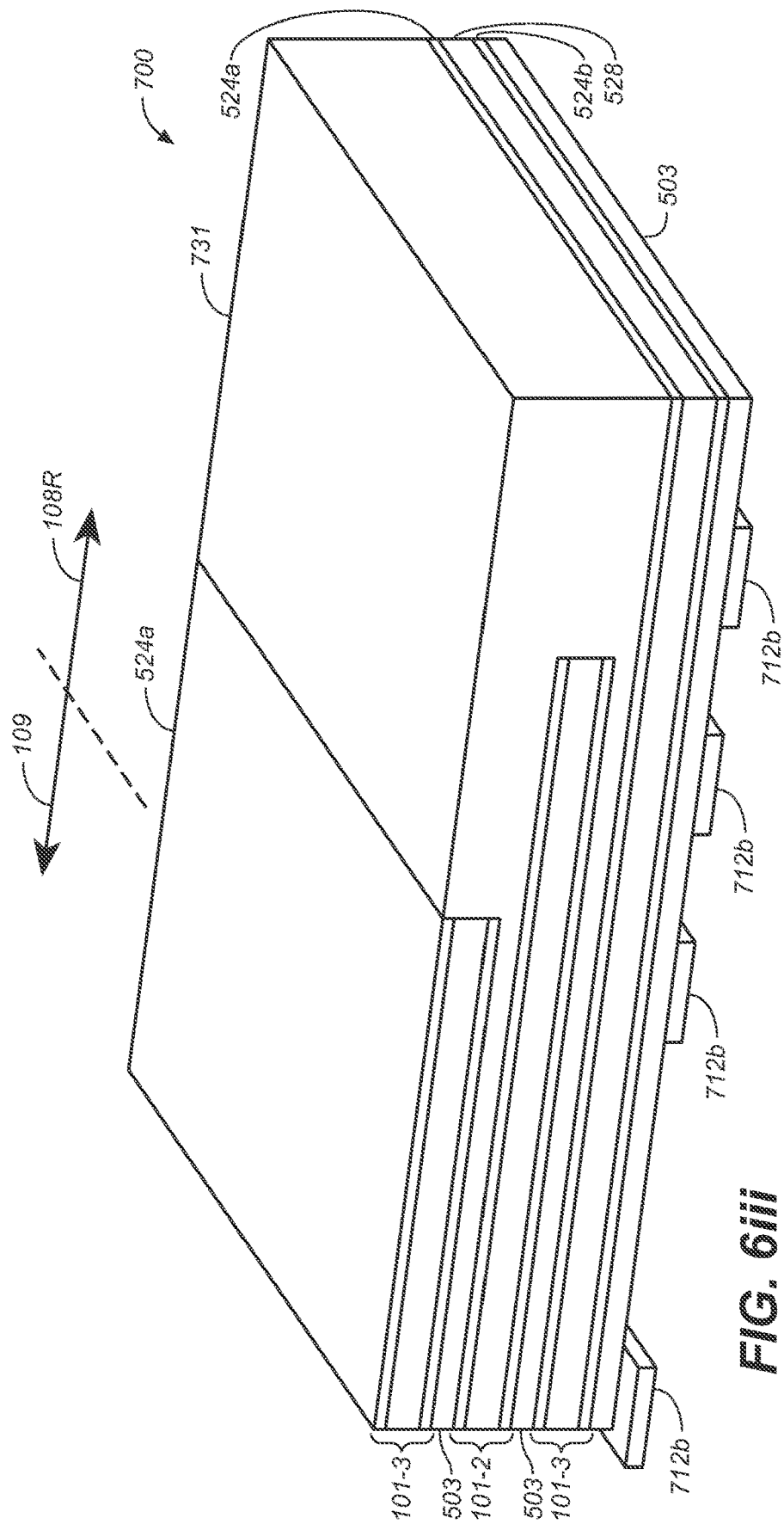
FIG. 6iii

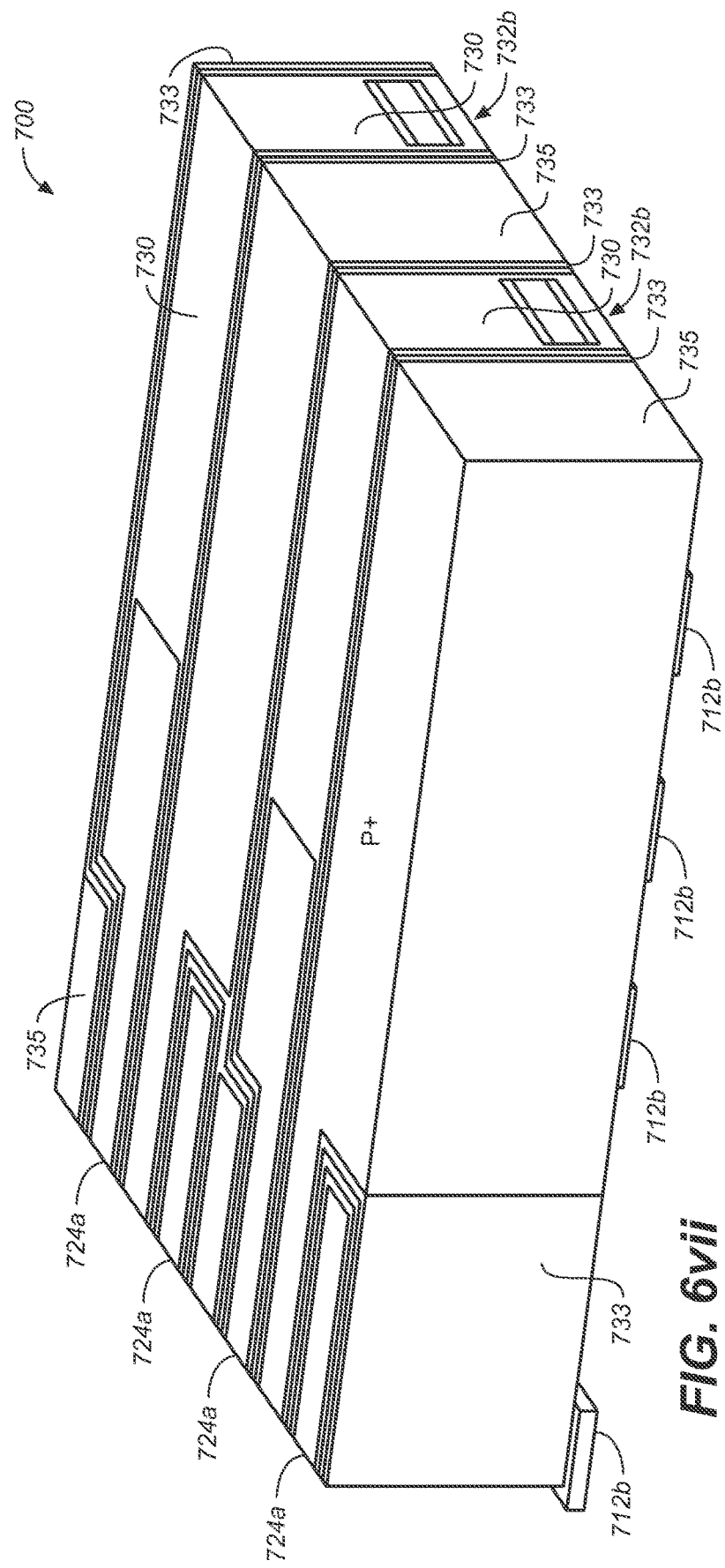
FIG. 6vii

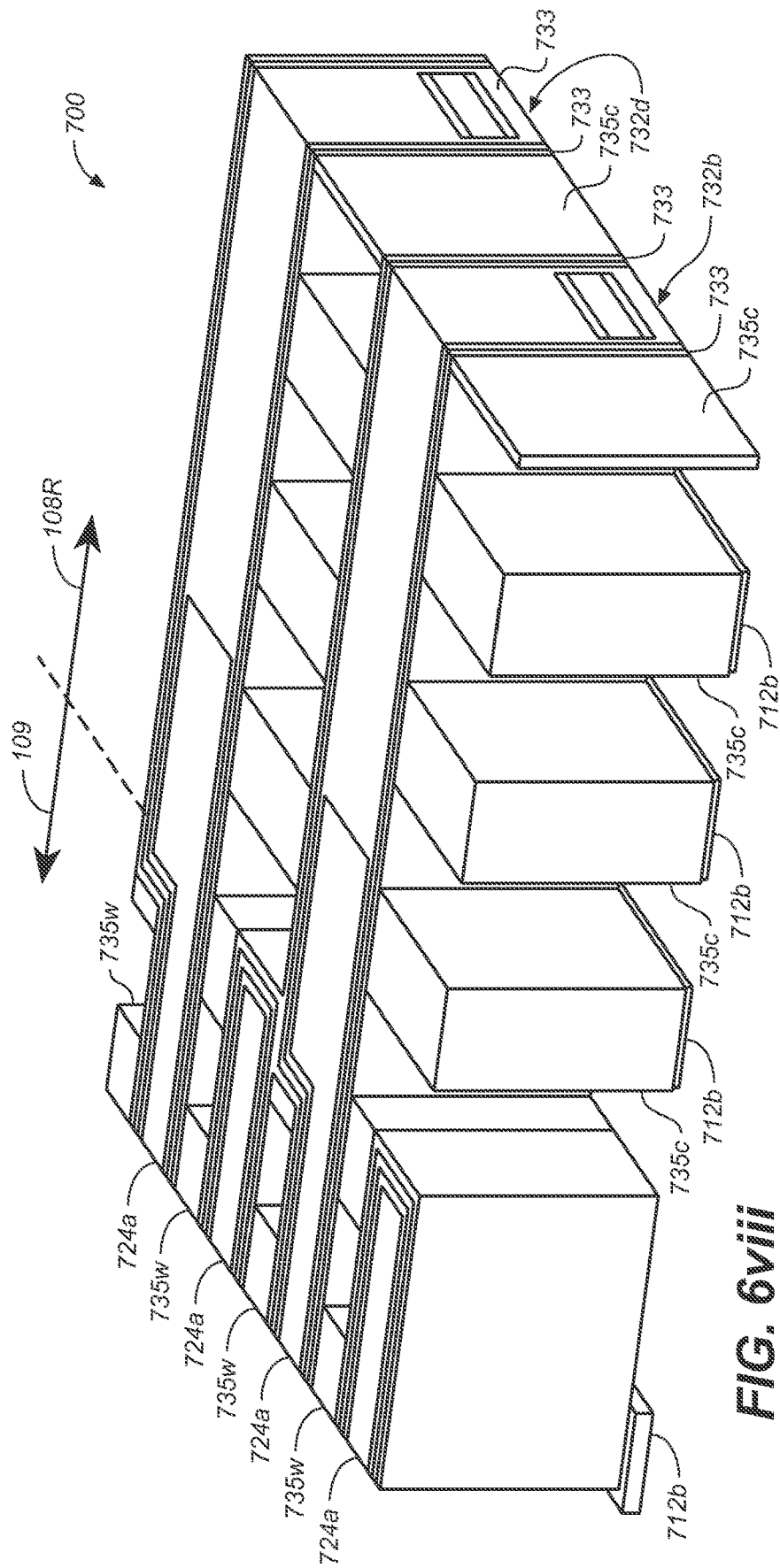
FIG. 6viii

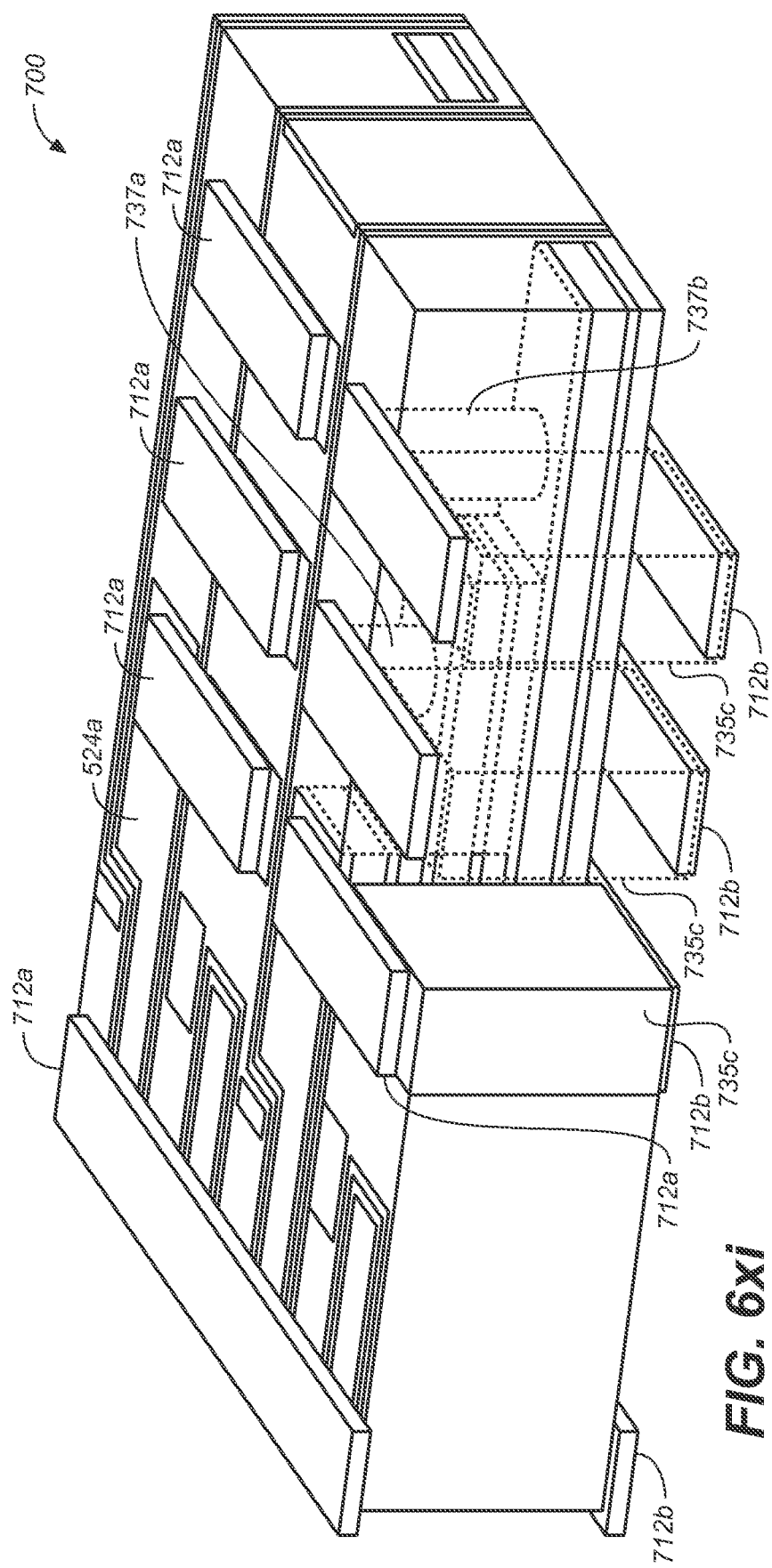

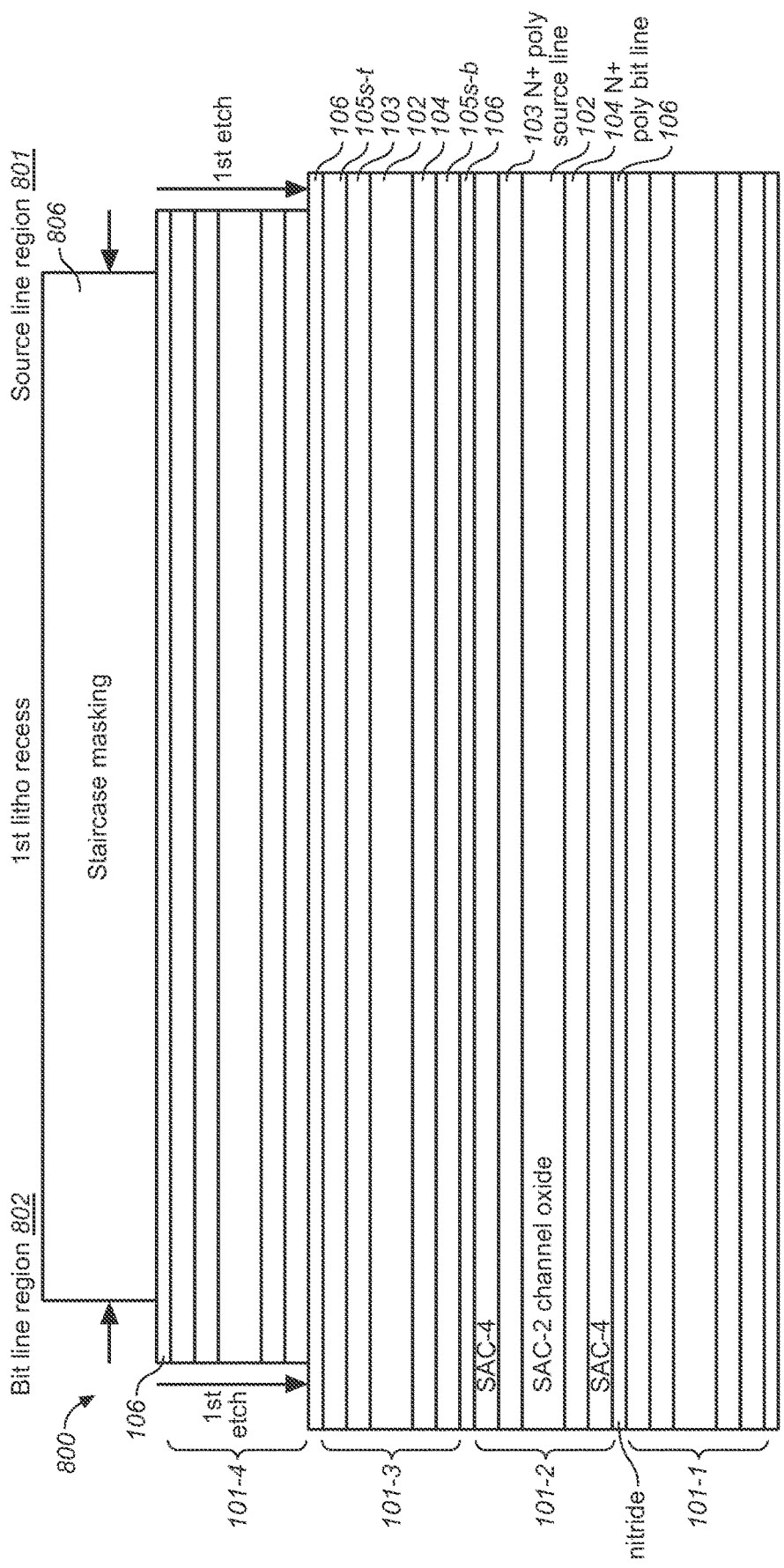
FIG. 7lll

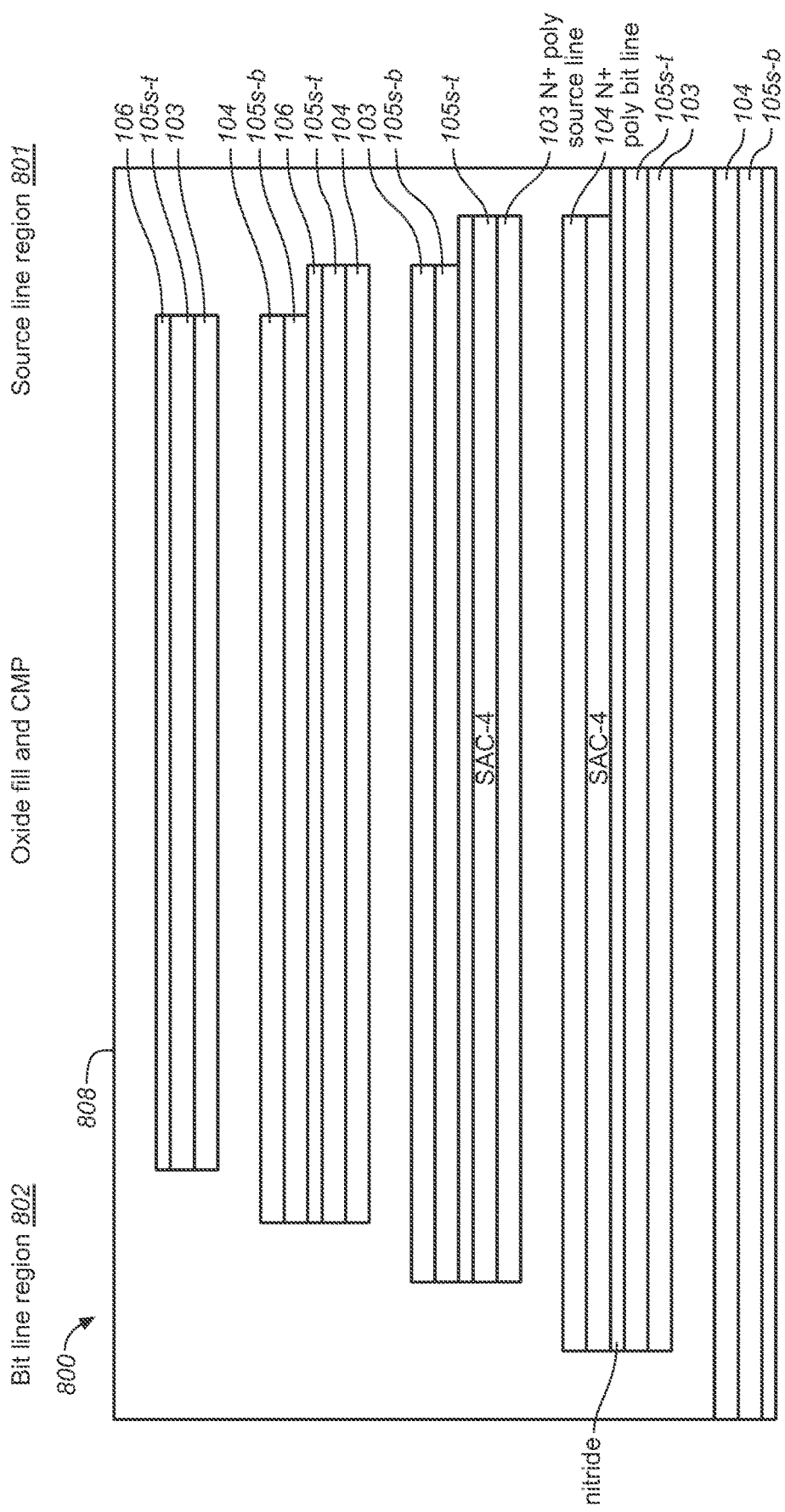
FIG. 7Vii

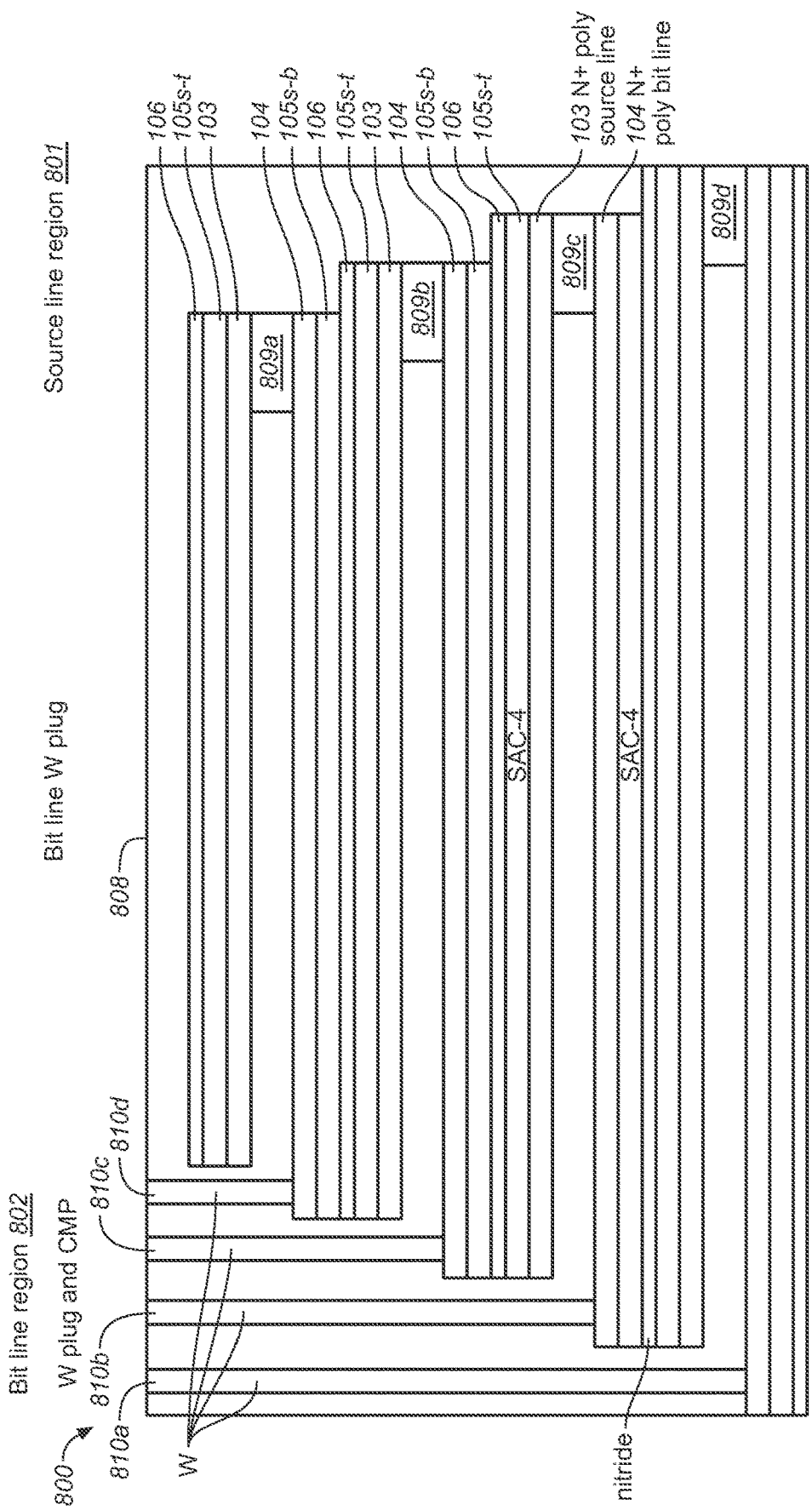
FIG. 7viii

STAIRCASE STRUCTURES FOR ELECTRICALLY CONNECTING MULTIPLE HORIZONTAL CONDUCTIVE LAYERS OF A 3-DIMENSIONAL MEMORY DEVICE

CROSS REFERENCE TO RELATED APPLICATIONS

The present application relates to and claims priority of (i) U.S. provisional application ("Provisional Application V"), Ser. No. 62/734,175, entitled "Staircase Structures for Electrically Connecting Multiple Horizontal Conductive Layers of a 3-Dimensional Memory Device," filed on Sep. 20, 2018, and (ii) U.S. provisional patent application ("Provisional Application VI"), Ser. No. 62/771,922, entitled "Staircase Structures for Electrically Connecting Multiple Horizontal Conductive Layers of a 3-Dimensional Memory Device," filed on Nov. 27, 2018.

The present application also relates to (i) U.S. provisional patent application ("Provisional Application I"), Ser. No. 62/697,085, entitled "Fabrication Method for a 3-Dimensional NOR Memory Array," filed Jul. 12, 2018; (ii) U.S. provisional patent application ("Provisional Application II"), Ser. No. 62/697,060, entitled "Device Structure for a 3-Dimensional NOR Memory Array and Methods for Improved Erase Operations Applied Thereto," filed Jul. 12, 2018; U.S. provisional patent application ("Provisional Application III"), Ser. No. 62/630,214, entitled "Three-Dimensional Vertical NOR Flash Thin-film Transistor Strings," filed on Feb. 13, 2018; and (iv) U.S. provisional patent application ("Provisional Application IV"), Ser. No. 62/611,205, entitled "3D NOR Memory Array with Very Fine Pitch: Device and Method," filed on Dec. 28, 2017.

The present application also relates to (i) U.S. patent application ("Non-Provisional Application I"), Ser. No. 16/006,612, entitled "Replacement Metal and Strut for 3D Memory Array", filed on Jun. 12, 2018; (ii) U.S. patent application ("Non-Provisional Application II"), Ser. No. 16/012,731, entitled "3-Dimensional NOR Memory Array Architecture and Methods for Fabrication Thereof," filed on Jun. 19, 2018; and (iii) U.S. patent application ("Non-provisional Application III"), Ser. No. 15/248,420, entitled "Capacitive-Coupled Non-Volatile Thin-film Transistor Strings in Three-Dimensional Arrays," filed Aug. 26, 2016.

The disclosures of Provisional Applications I, II, III, IV, V and VI, and Non-provisional Applications I, II and III are hereby incorporated by reference in their entireties.

BACKGROUND OF THE INVENTION

1. Field of the Invention

The present invention relates to non-volatile NOR-type memory strings. In particular, the present invention relates providing electrical connection to multiple conductor layers in a 3-dimensional structure of such a non-volatile NOR-type memory string.

2. Discussion of the Related Art

Provisional Applications I and II and Non-provisional Applications I, II and III disclose numerous examples of thin-film storage transistors being organized in arrays of NOR-type memory strings ("NOR memory strings") in 3-dimensional memory structure. In each NOR-memory string, thin-film storage transistors are formed along horizontal strips each having multiple semiconductor or conductive layers serving as source, drain and channel regions of the thin-film storage transistors. During read, programming and erase operations, one or more of these semiconductor or conductive layers are connected to voltage sources to achieve the appropriate bias conditions or to other circuitry (e.g., sense amplifiers) required for the respective operations.

SUMMARY

According to the embodiments of the present invention, various methods and various staircase structures formed out of the active strips of a memory structure (e.g., a memory array having a three-dimensional arrangement of NOR memory strings) above a semiconductor substrate allows efficient electrical connections to semiconductor layers within the active strips.

The present invention is better understood upon consideration of the detailed description below, in conjunction with the accompanying drawings.

BRIEF DESCRIPTION OF THE DRAWINGS

FIG. 1b illustrates schematically the semiconductor and conductor layers of an active strip 101 in memory structure 100 of FIG. 1a.

FIGS. 2(xii) to 2(xxiii) illustrate one method for fabricating a staircase structure in staircase portion 108 of memory structure 160, which allows connection to both source and drain polysilicon layers in the active layers, in accordance with one embodiment of the present invention.

FIG. 4(ii) shows a perspective view of the staircase structure in FIG. 4(i), in accordance with one embodiment of the present invention.

DETAILED DESCRIPTION OF THE PREFERRED EMBODIMENTS

Figure 1A:
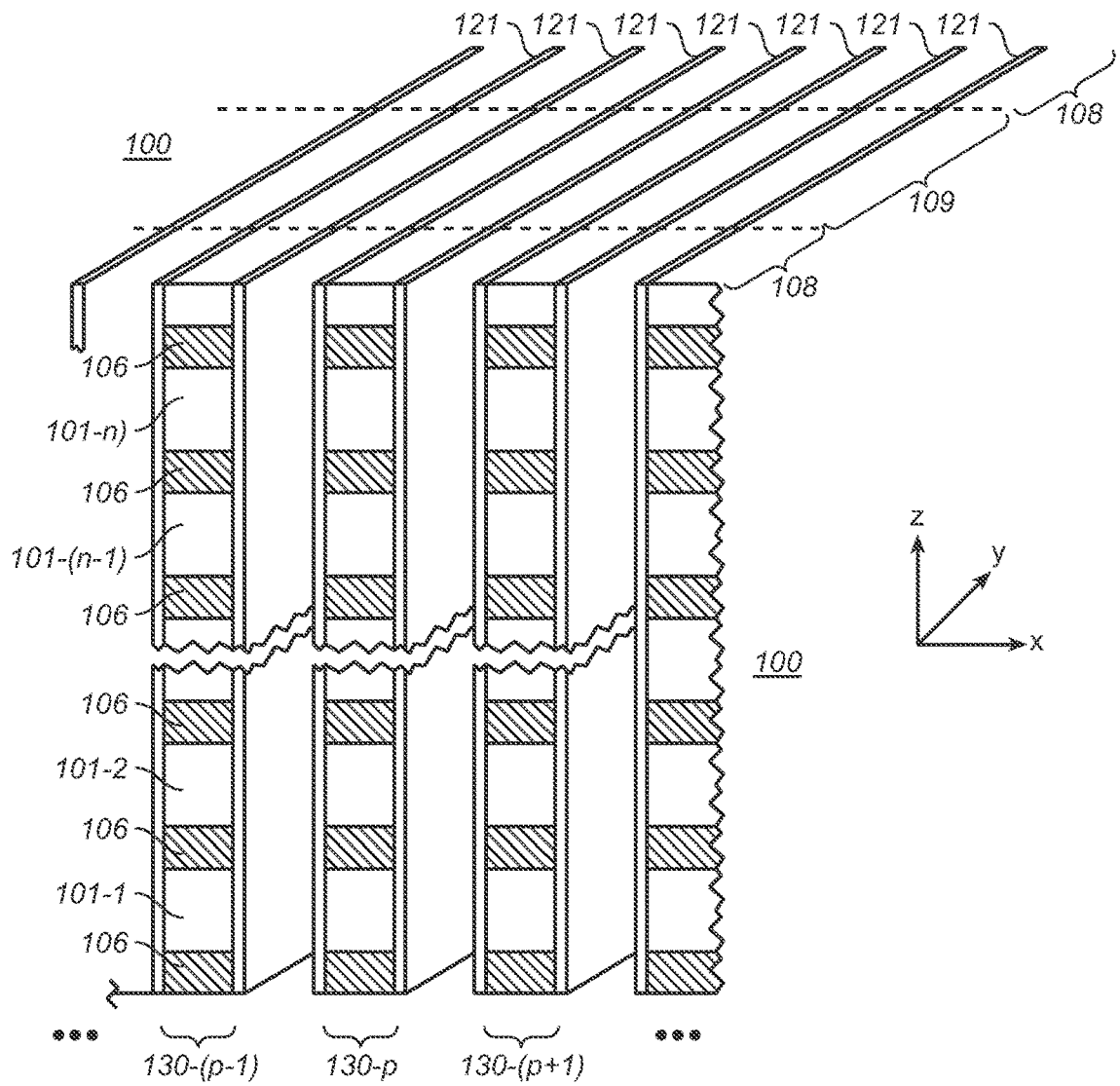
FIG. 1a illustrates schematically memory structure 100 containing NOR memory strings of the type to which the present invention is applicable.

To simplify the following detailed description, like elements in the drawings are assigned like reference numerals. The figures, although drawn for clarity of illustration, are not drawn to scale.

High-density structures representing arrays of generally non-volatile memory cells have been described in Non-provisional Applications I, II and III. The memory arrays of Non-provisional Applications I, II and III are organized as stacks of connected storage transistors ("active stacks") fabricated over a semiconductor substrate. Specifically, Non-provisional Applications I, II and III disclose multiple strips of semiconductor layers ("active strips") in each active stack, with each active strip including storage transistors that are organized as one or more NOR-type memory strings ("NOR memory strings"). The semiconductor substrate on which the memory array is constructed may include various types of support circuitry, such as power supply circuits, address decoders, sense amplifiers, input and output circuits, comparators, and control and other logic circuits.

FIG. 1a illustrates schematically memory structure 100 containing NOR memory strings that can be fabricated using methods of the present invention. In this context, a NOR memory string consists of individually and independently addressable storage transistors sharing a common source region and a common drain region. As described in Non-provisional Applications I, II and III, each memory string may be formed along one side of an active strip, which includes multiple layers of dielectric, semiconductor and conductor materials. As shown in FIG. 1a, memory structure 100 is organized as m active stacks each containing n active strips, where m and n can be any integer. For example, m may be 1, 2, 4, 8, 16, 32, 64, . . . , 8192 or greater. Similarly, n may be 1, 2, 4, 8, . . . , 64 or greater.

In FIG. 1a, memory structure 100 is represented by active stacks 130-($p$−1), 130-$p$, 130-($p$+1). In each active stack, n active strips, labeled 101-1, 102-1, . . . , 101-$n$, are separated and electrically isolated from each other by isolation layers 106. Isolation layer 106 may be, for example, a silicon nitride. Each active stack is covered on the outside by a layer of charge storage material 121 (e.g., an oxide-nitride-oxide ("ONO") triple-layer, as is known to those of ordinary skill in the art). Numerous conductive columns (not shown), separated from the active strips by charge storage material 121, are provided in the space between the active stacks. These conductive columns serve as gate electrodes for the storage transistors. In fact, during read, write and erase operations, each conductive column serve as a "word line" to select and operate the selected one of the storage transistors formed on the active strips of two adjacent active stacks. In the detailed description below, to simplify the detailed description and for reference convenience, the direction substantially perpendicular to the surface of the semiconductor substrate ("vertical") is labeled z. the direction along the length of each active strip is labeled y, and the direction along the width of each active strip is labeled x. The x and y directions are also referred to as "horizontal". One or more interconnect layers ("global interconnect layers") may be formed above or below memory structure 100 (or both) to interconnect the terminals of the storage transistors in the NOR strings of memory structure 100 to circuitry in the semiconductor substrate.

One or more portions 108 in each active stack each include at least one "staircase" structure or at least one "reverse staircase" structure. A stair case structure, as well as a reverse staircase structure, allows electrical access to a semiconductor or conductor layer in an active strip (e.g., the common drain region, or "bit line") from one of the global interconnect layers through conductor-filled vias, in the case of a staircase structure, or through buried contacts, in the case of a reverse staircase structure. In FIG. 1a, portions 108 ("staircase portions 108") are provided in the front and at the back of each active stack. Storage transistors are formed in the portion or portions of the active stack outside of the staircase portion or portions. In FIG. 1a, array portion 109 is provided between staircase portions 108. In this context, within each staircase portion, a reverse staircase structure is formed by having each active strip extend successively further along the y direction than the active strip below it, to allow buried contacts to connect the semiconductor or conductor layers in the active strip to circuitry in the semiconductor substrate and any global interconnect layer under memory structure 100, without risking the buried contacts being electrically shorted to another active strip. Likewise, in a staircase portion, a staircase structure is formed by having each active strip extend successively further in the y-direction than the active strip immediately above it, to allow conductor-filled vias to connect the semiconductor or conductor layers of the active strip to circuitry in the semiconductor substrate through one or more global interconnect layers provided above memory structure 100, without risking the vertical conductors being shorted to another active strip.

Figure 1B:
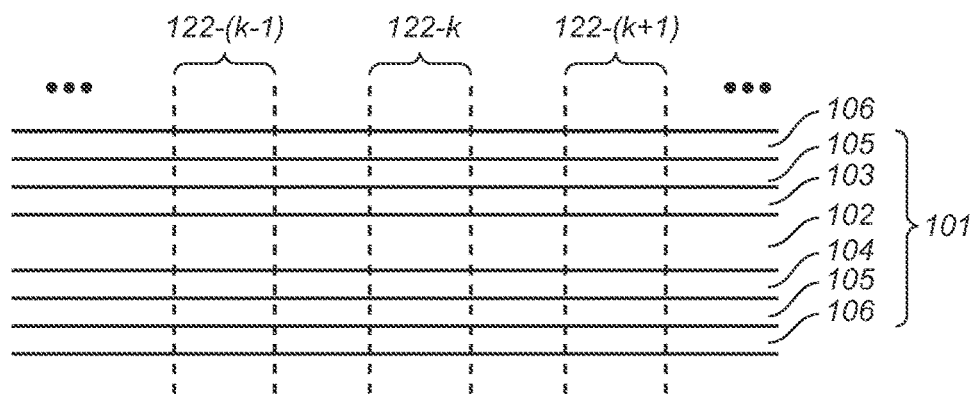
Figure 2I:
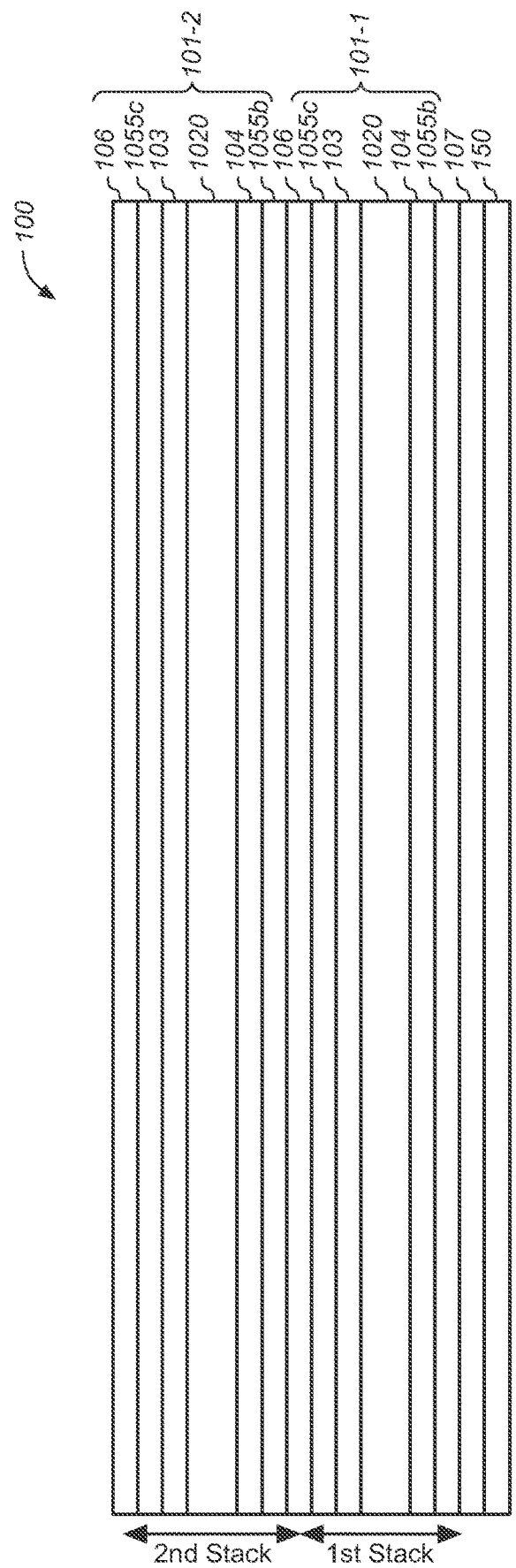
FIGS. 2(i) to 2(xi) illustrate one method for fabricating a staircase structure in staircase portion 108 of memory structure 100, in accordance with one embodiment of the present invention.
Figure 2I:
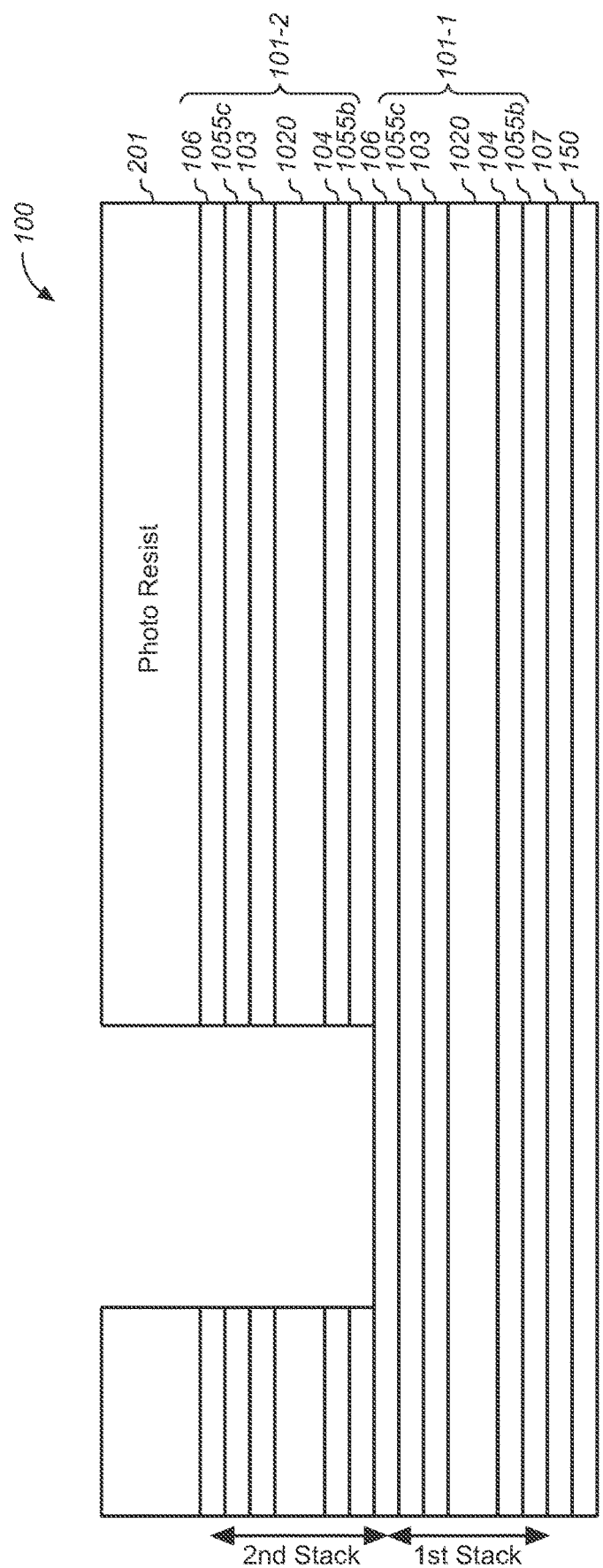
Figure 2I:
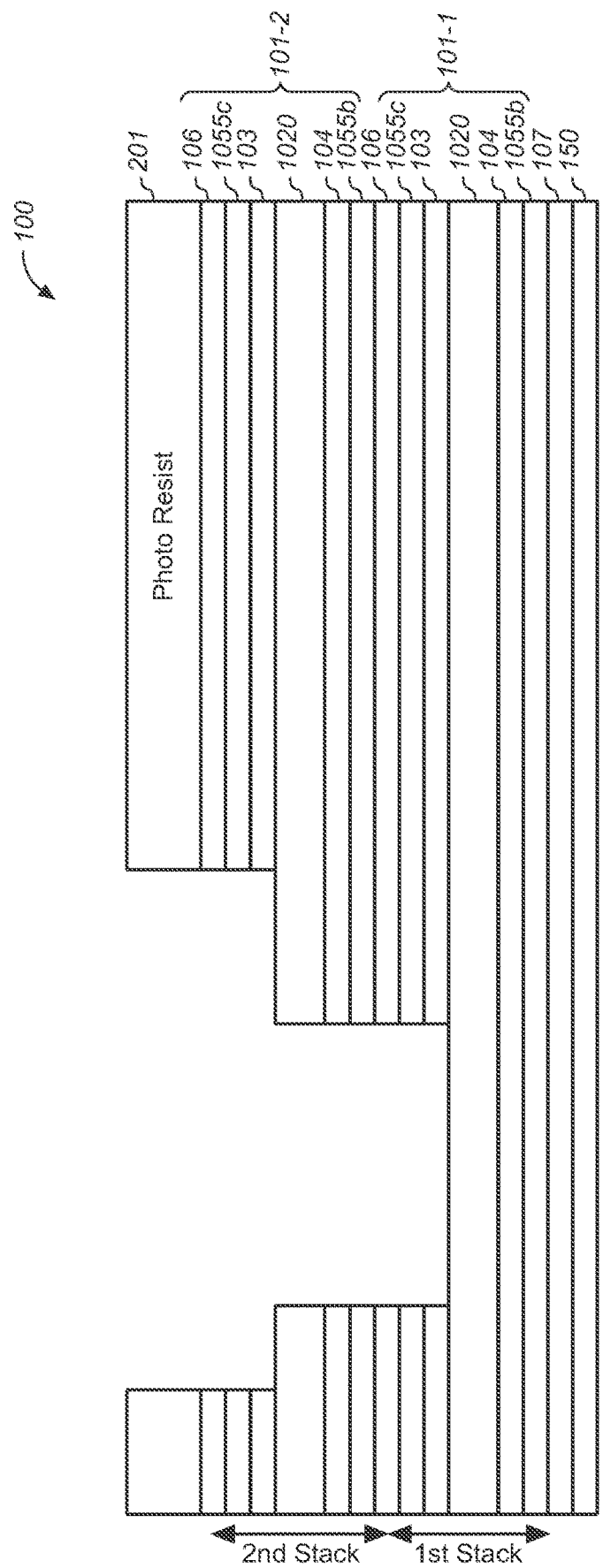
Figure 2V:
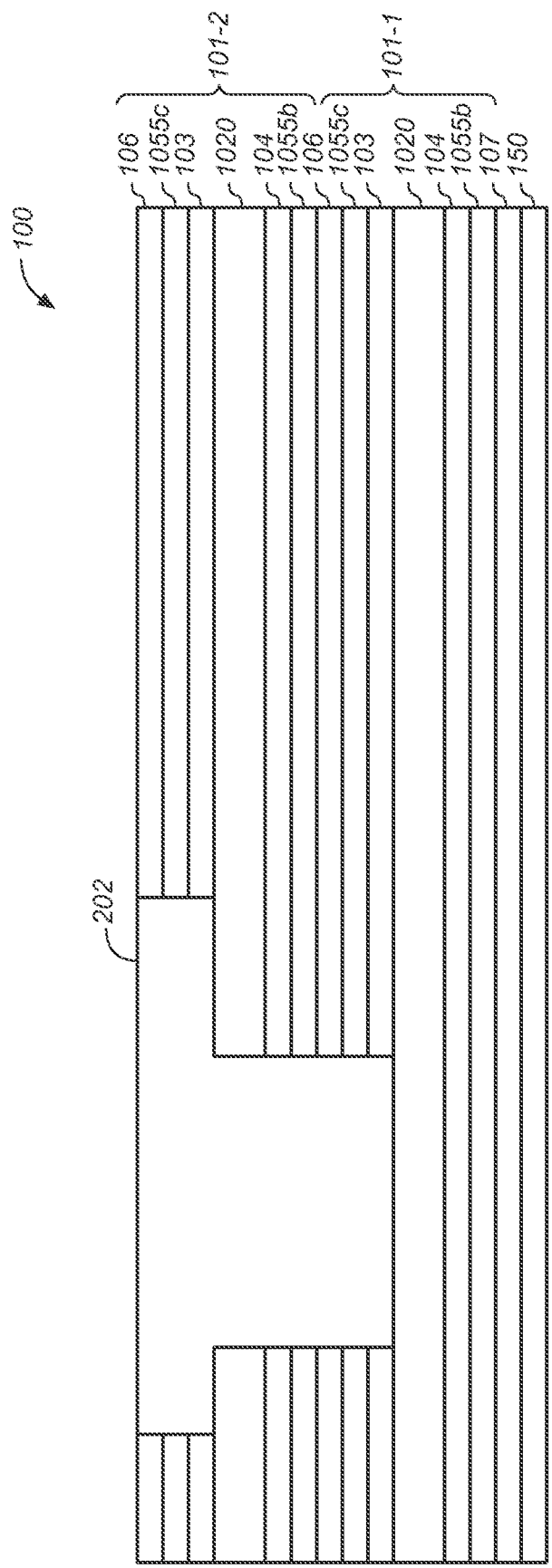
Figure 2I:
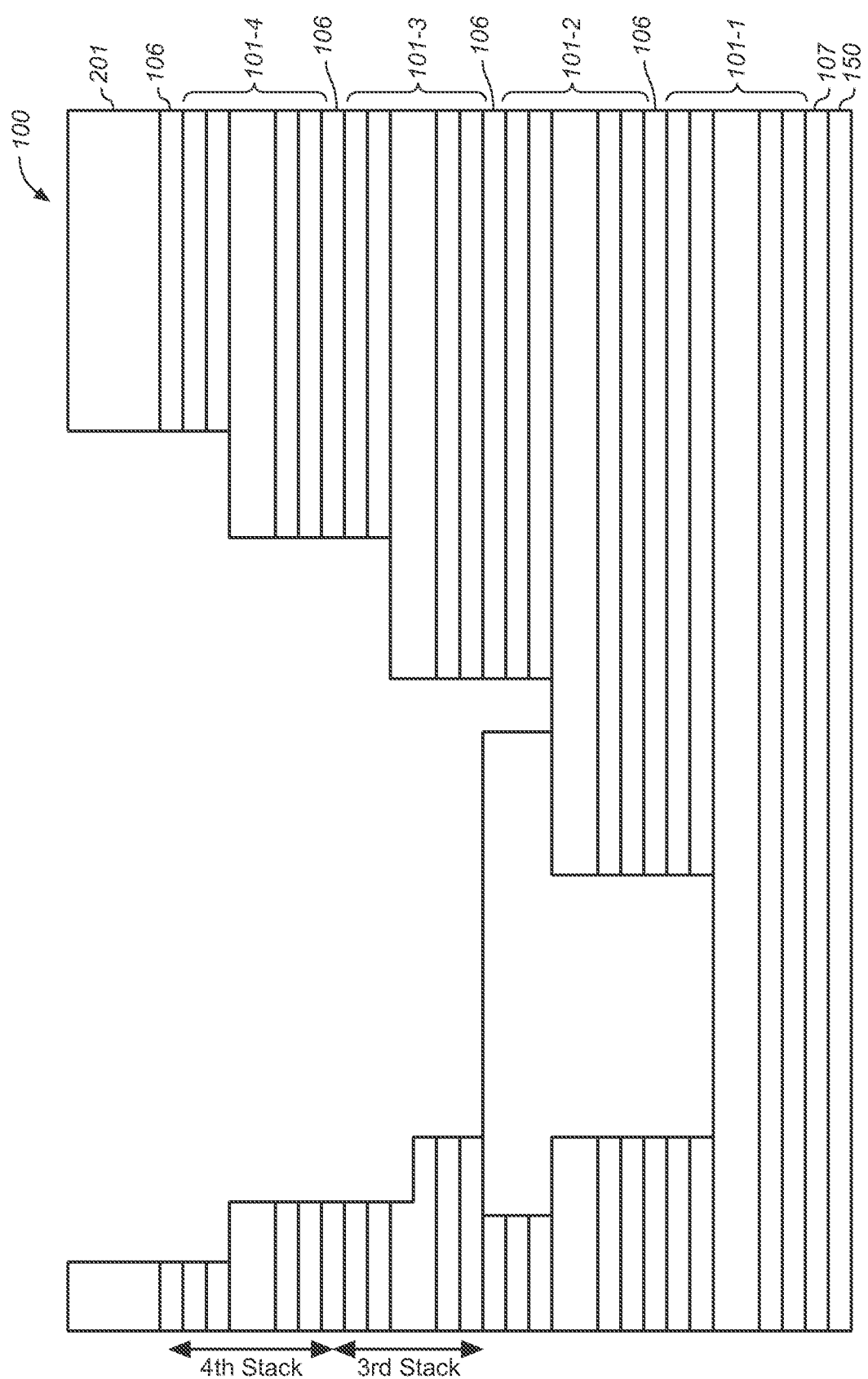
Figure 2X:
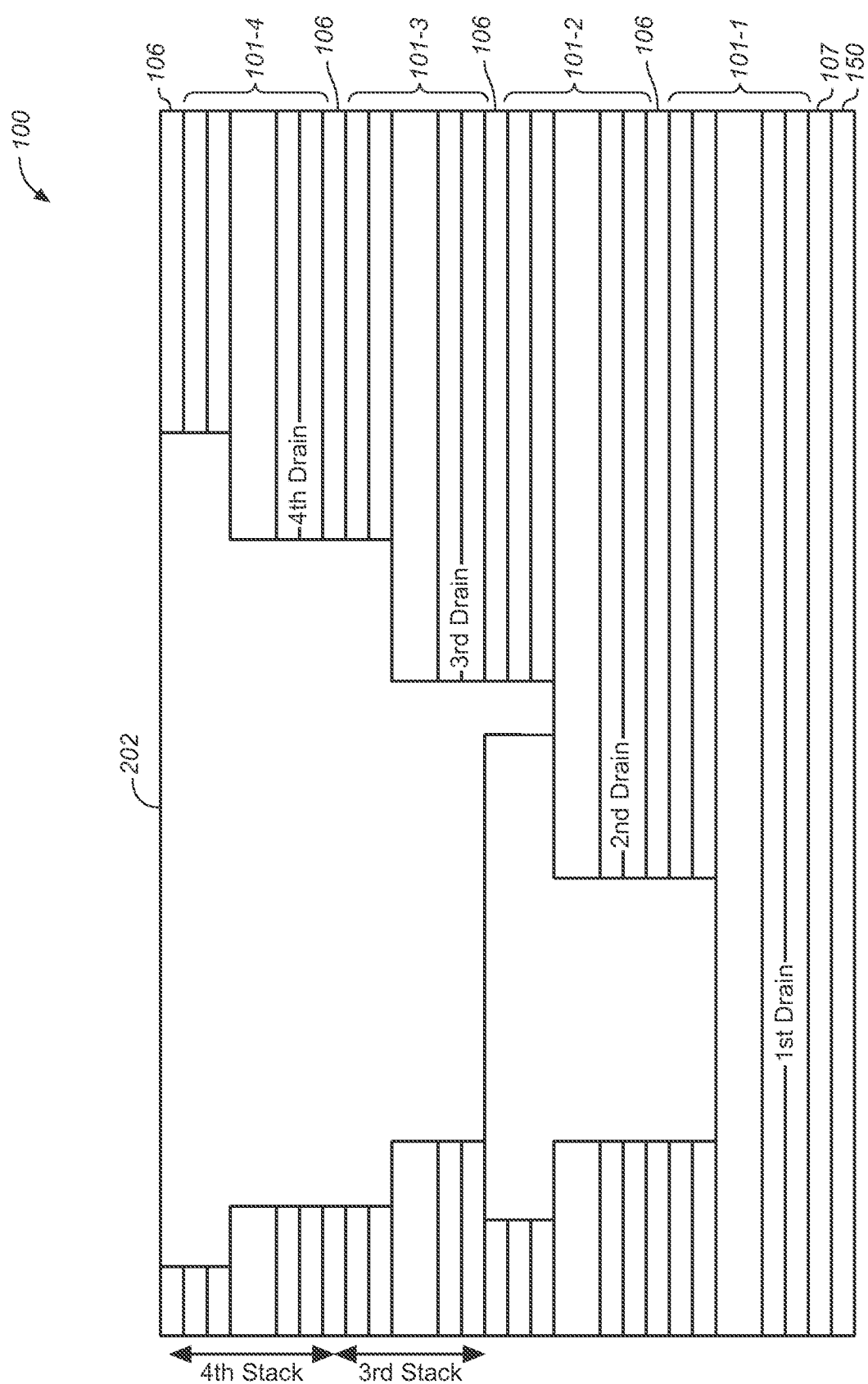
Figure 2X:
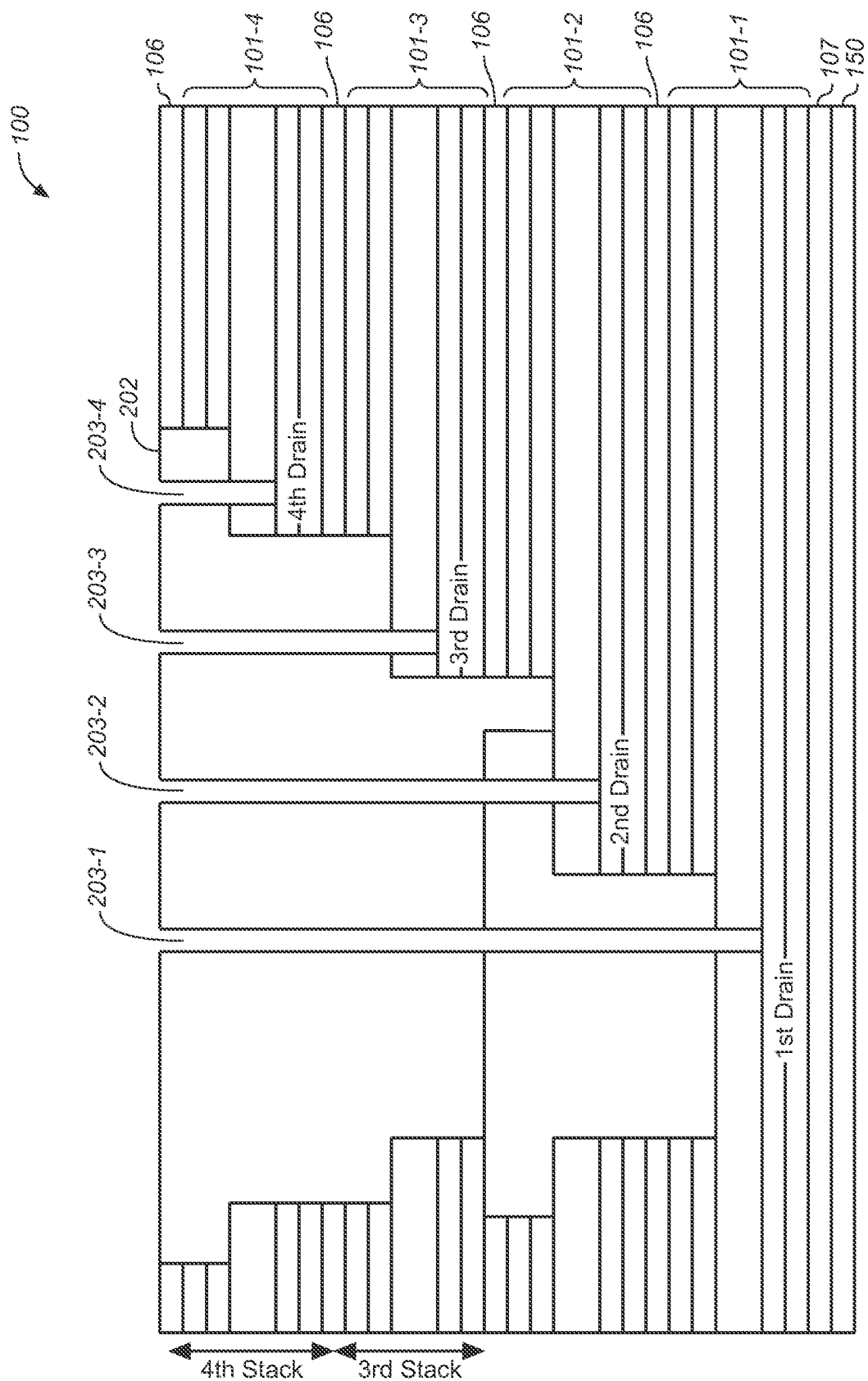
Figure 2X:
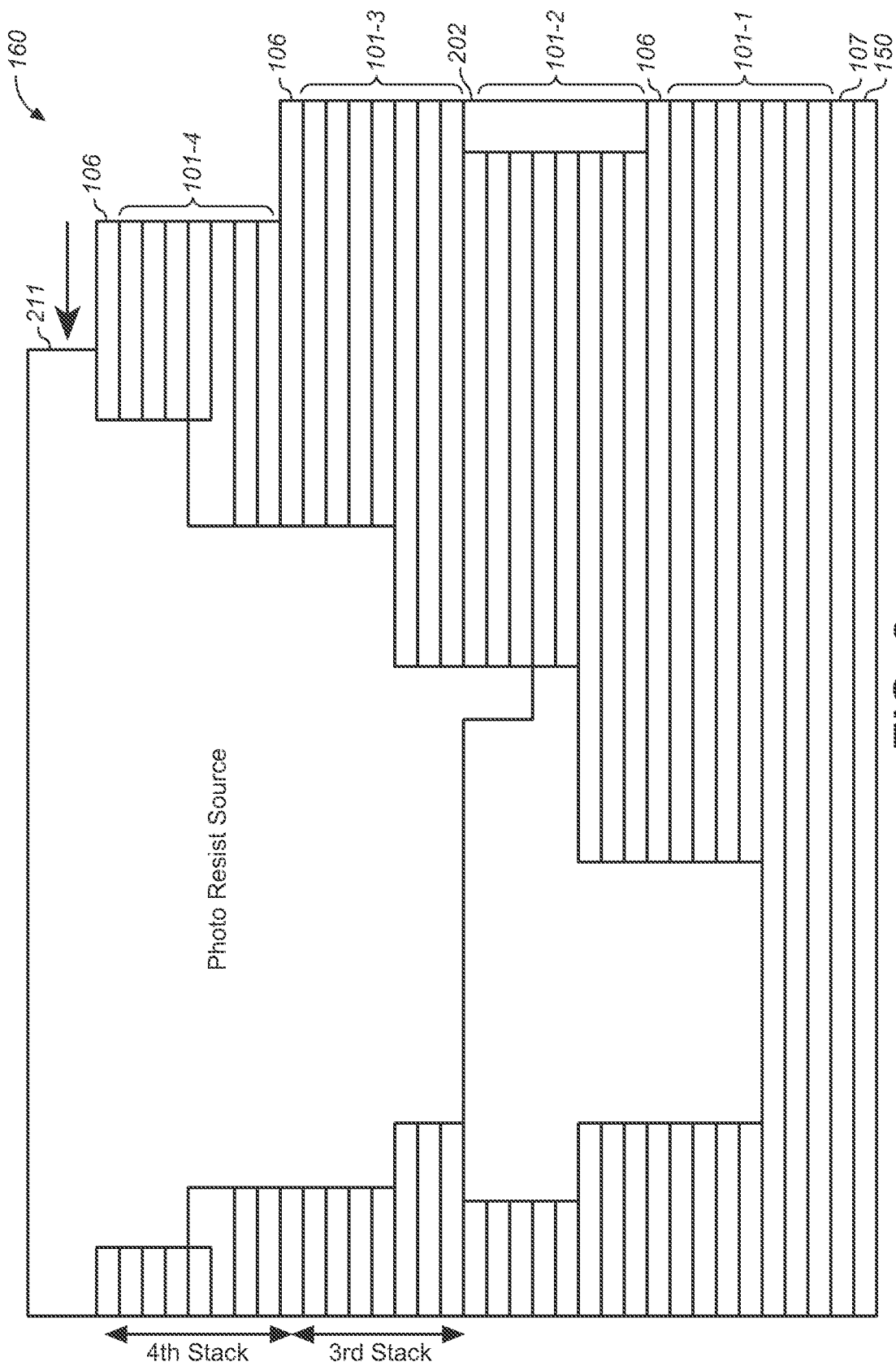
Figure 3I:
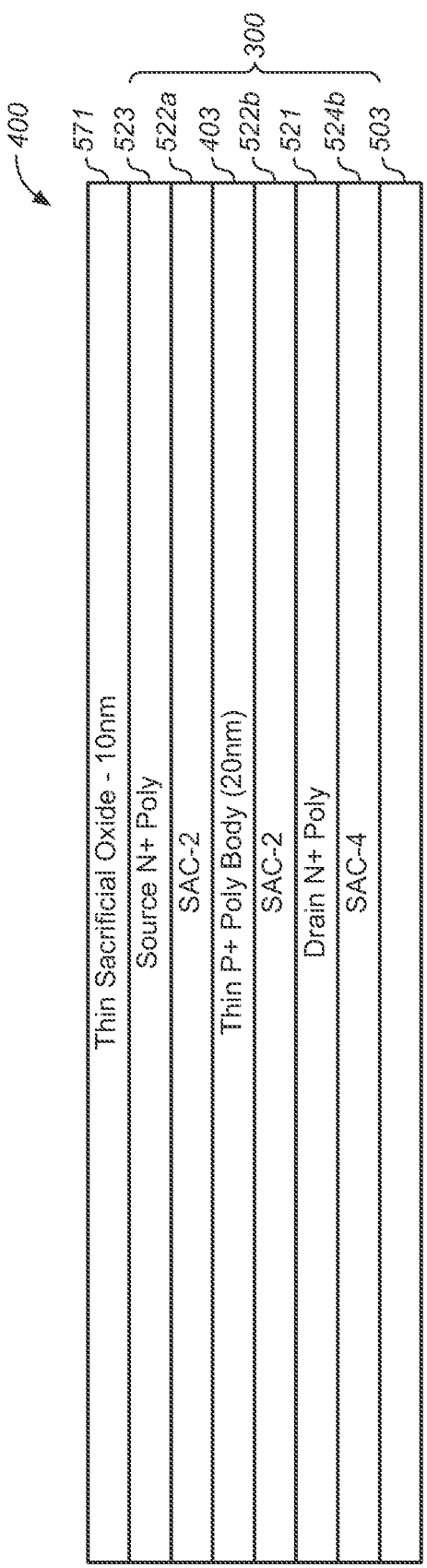
FIGS. 3(i) to 3(ix) illustrate a method for fabricating a staircase structure in staircase portion 108 of memory structure 400, wherein P-doped polysilicon body layer 403 is shorted to source region 523, in accordance with one embodiment of the present invention.
Figure 3I:
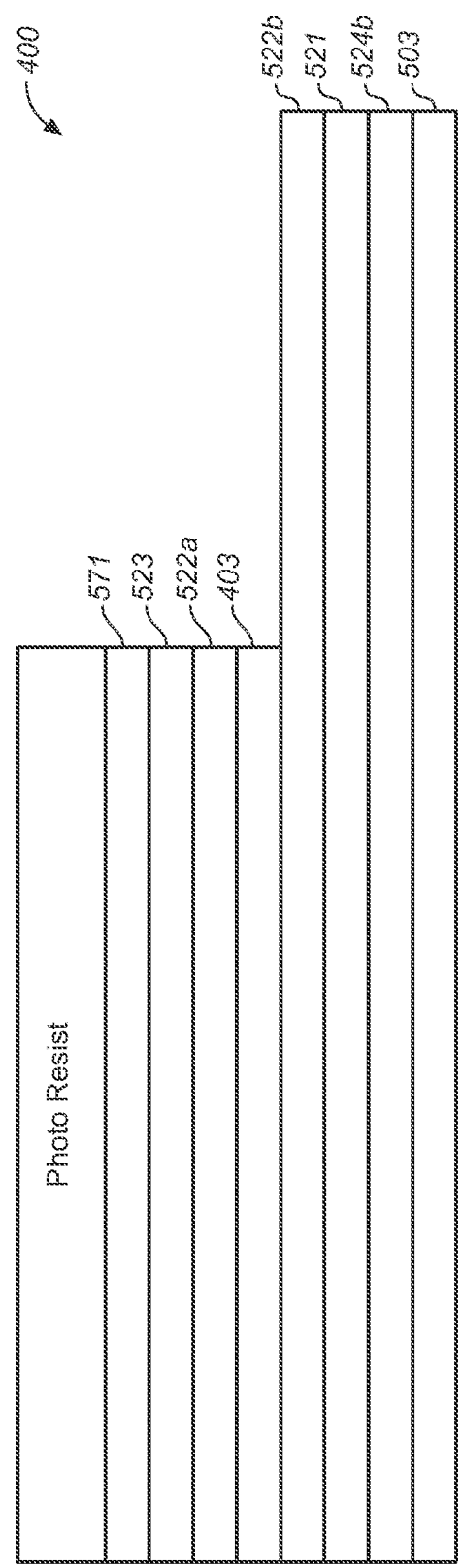
Figure 3V:
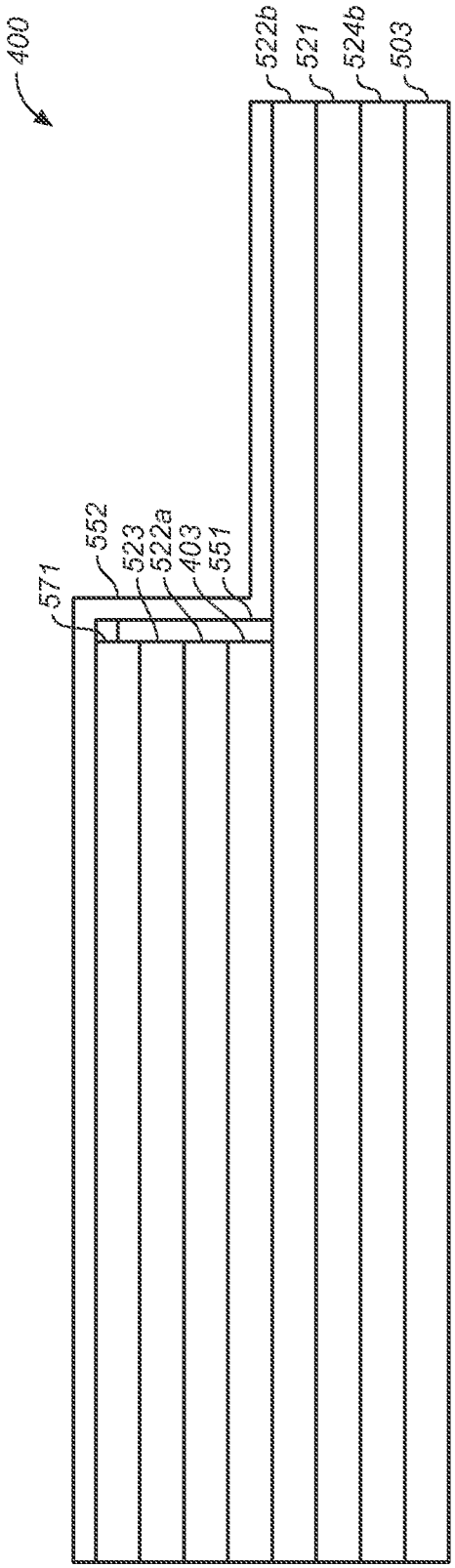
Figure 3V:
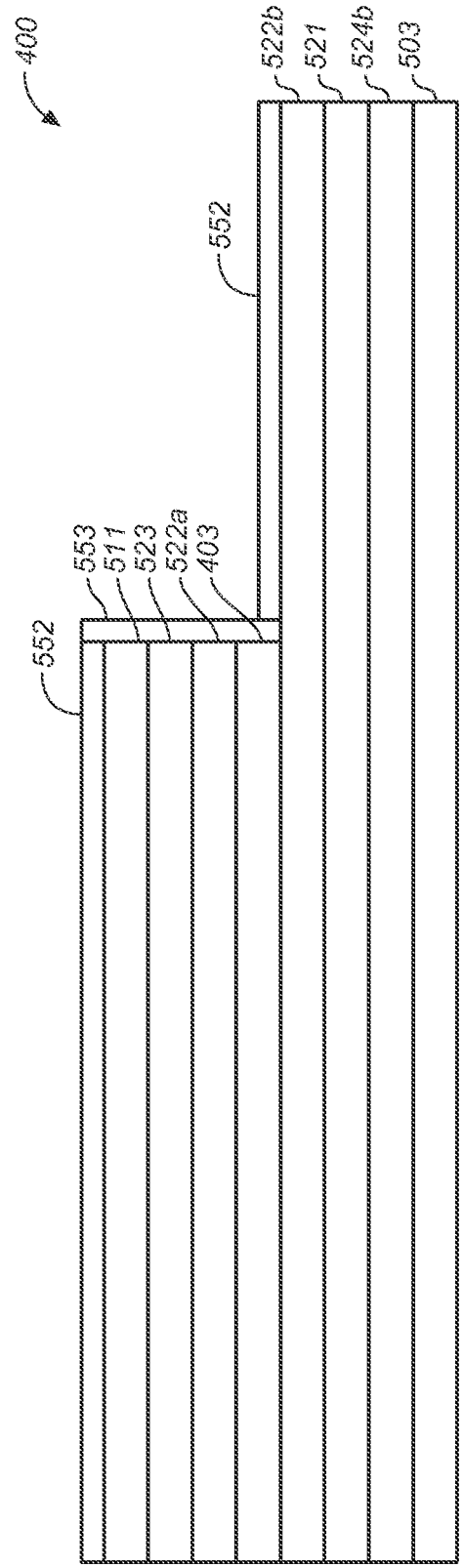
Figure 3I:
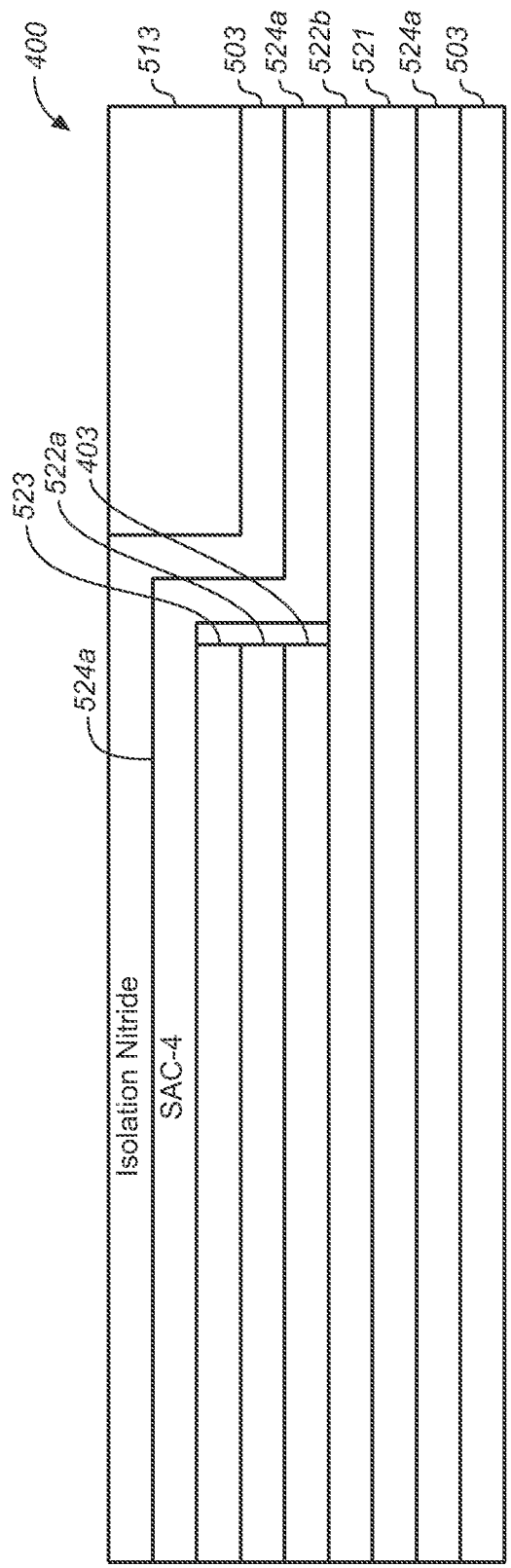
Figure 41:
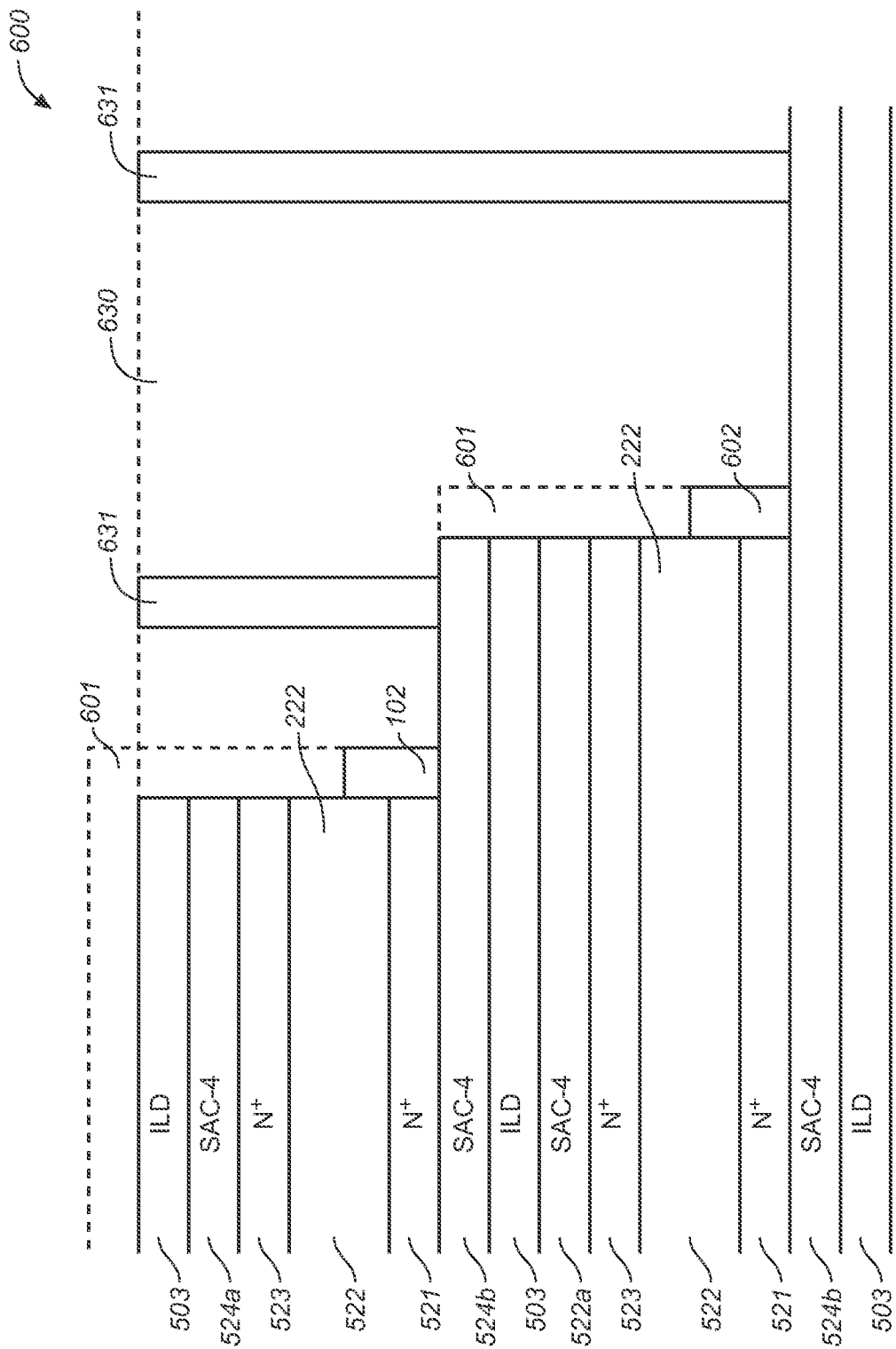

FIG. 1b illustrates schematically the dielectric, semiconductor and conductor layers of active strip 101. As shown in FIG. 1b, active strip 101 includes (i) $N^+$ semiconductor layers 103 and 104 (e.g., phosphorus- or arsenic-doped polysilicon) which may provide a common source region (or "source line") and a common drain region (or "bit line") for a NOR memory string; and (ii) intrinsic or lightly doped P-type ($P^-$, typically boron) semiconductor layer 102, which may provide channel regions for the storage transistors of the NOR memory string. Between the dashed lines and separated from each active strip by charge storage material layer 121 are provided conductors (not shown) that serve as gate electrodes for the storage transistors of the NOR string. The dashed lines in FIG. 1b indicate the positions of conductors 122-($k$−1), 122-$k$, and 122-($k$+1) which are representative of such conductors. In addition, as shown in FIG. 1b, conductor layers 105 (e.g., any refractory metal, such as tungsten, customarily with adhesion and barrier films) are provided adjacent and in contact with $N^+$ semiconductor layers 103 and 104. Conductor layers 105 reduce resistance in the common source and drain regions of the NOR memory string. Isolation layers 106 (e.g., silicon nitride or silicon oxide) electrically isolate the active strips in the active stack from adjacent active strips.

Various processes may be used, such as those disclosed in Provisional Applications I, II and III, illustrate various exemplary ways to form the NOR memory strings of the memory structure. For example, FIGS. 3-11 and 12A-12D of Non-provisional Application II, in conjunction with the description of the specification therein, illustrate a process that forms NOR memory strings that extend along a direction (e.g., y-direction) parallel to the surface of a semiconductor substrate.

According to one embodiment of the present invention, a process is provided by which a staircase structure in a memory structure containing NOR memory strings may be formed over a planar surface of a semiconductor substrate. Initially, various types of support circuitry may be formed in—or at the surface of—the semiconductor substrate (e.g., power supply circuits, address decoders, sense amplifiers, input and output circuits, comparators, and control and other logic circuits are fabricated).

An isolation layer (e.g., silicon oxide) may be formed on the planar surface. Buried contacts may be formed in the isolation layer for connection to the circuitry underneath. One or more global interconnect layers may then be formed above the isolation layer. (In the following detailed description, these layers are collectively referred to as substrate 150.)

Thereafter, base oxide film 107 (e.g., 50-nm silicon oxide film) is provided (see, e.g., FIG. 2(*i*) described in the following description). The semiconductor and conductor layers of an active strip (collectively, an "active layer") are then provided. Multiple active layers may be provided, layer by layer, with each active layer being isolated from the next active layer by isolation films 106 (e.g., a 30-nm nitride layer). In one embodiment, in order of deposition, each active layer may include (a) sacrificial layer 105*s-b* ("SAC4 layer 105*s-b*"; e.g., a 40-nm layer of silicon germanium); (b) N$^+$ doped polysilicon layer 104 ("drain polysilicon 104"; e.g., 30-nm in situ arsenic-doped polysilicon film); (c) silicon oxide layer 102*o* ("sacrificial channel oxide or SAC2 layer 102*o*"; 80-nm silicon oxide film), which is to be recessed at a later time to accommodate a suitable channel material; (d) N$^+$ polysilicon layer 103 ("source polysilicon 103"; e.g., 30-nm in situ arsenic-doped polysilicon film); and (e) sacrificial layer 105*s-t* ("SAC4 layer 105*s-t*"; e.g., a 40-nm layer of silicon germanium). SAC4 layers 105*s-b* and 105*s-t* are sacrificial layers that would each subsequently be replaced by a metallic conductor layer, as discussed below.

During depositions of the active layers, a staircase structure for electrically accessing drain polysilicon 104 of each active strip is formed in staircase portions. This detailed description focuses on describing staircase structures for electrically contacting drain polysilicon 104 and source polysilicon 103. These staircase structures are understood to be provided in the staircase portions of the memory structure (e.g., staircase portion 108 of FIG. 1*a*). Unless specifically stated, FIGS. 2(*i*) to 2(*xxiii*), FIGS. 3(*i*) to 3(*ix*), FIGS. 4(*i*)-4(*ii*), FIGS. 5*a*-5*c* and FIGS. 6(*i*) to 6(*xi*) in this detailed description are each understood to be showing a part one of staircase portions 108. The storage transistors are formed in memory arrays in array portions 109 of the memory structure. For reasons of clarity, array portions 109—which structures and fabrication methods are described in detail, for example, in Non-provisional Application III—are not shown in any of these figures. Array portion 109 is protected from the staircase formation steps by appropriate masking over array portion 109. According to one embodiment of the present invention, a staircase structure may be formed using one photolithography step for every two active layers. FIGS. 2(*i*) to 2(*xi*) illustrate staircase structure formation in staircase portions 108 of memory structure 100, in accordance with that embodiment of the present invention.

FIG. 2(*i*) shows memory structure 100 after depositions of active layers 101-1 and 101-2. Thereafter, photoresist layer 201 is deposited and patterned over memory structure 100. A first etching step removes from the exposed area that is not protected by photoresist 201: (a) isolation layer 106 and (b) active layer 101-2 (i.e., "SAC4 layer 105*s-tb*; source polysilicon 103, sacrificial SAC2 102*o*, drain polysilicon 104, and SAC4 layer 105*s-b* of active layer 101-2). This first etching step stops at isolation 106 immediately above active layer 101-1. The resulting structure is shown in FIG. 2(*ii*).

Photoresist layer 201 is then recessed by slimming a predetermined amount (indicated by the arrow) as is known to a person of ordinary skill in the art, to further expose addition areas of active layer 101-2. The resulting structure is shown in FIG. 2(*iii*). Thereafter, a second etching step removes the exposed portions of isolation films 106 immediately above active layers 101-1 and 101-2, and further etches (a) SAC4 layers 105*s-t* of both active layers 101-1 and 101-2, and (b) source polysilicon 103 of both active layers 101-1 and 101-2. This second etching step stops at sacrificial SAC2 layers 102*o* of both active layers 101-1 and 101-2. The resulting structure, which is a two-step staircase structure, is shown in FIG. 2(*iv*). Photoresist layer 201 is then removed.

Silicon oxide 202 is then provided to fill the cavities created by the first and second etching steps, which is then followed by a planarization step (e.g., chemical-mechanical polishing (CMP)) that planarizes the resulting surface. The resulting structure is shown in FIG. 2(*v*). Vias can then be created in silicon oxide 202 and the underlying sacrificial SAC2 102*o* of each of active layers 101-1 and 101-2 to allow access (not shown in FIG. 2(*v*)) to drain polysilicon 104 of each of active layers 101-1 and 101-2. These vias may be created in a subsequent oxide etch after all active layers are formed, as discussed below.

FIGS. 2(*vi*) to 2(*x*) illustrate extending staircase portions 108 of memory structure 100 to two additional active layers. FIG. 2(*vi*) shows staircase portions 108 of memory structure 100 after deposition of active layers 101-3 and 101-4. Thereafter, photoresist layer 201 is deposited and active layer 101-4 is etched in the same manner as the etching of active layer 101-2 illustrated by FIG. 2(*ii*). The resulting structure of etching active layer 101-4 is shown in FIG. 2(*vii*).

Thereafter, photoresist layer 201 is recessed and a second etch is performed on the exposed areas of active layers 101-3 and 101-4 under this recessed photomask. Unlike the etch of active layer 101-1 illustrated by FIG. 2(*iv*), etching of active layer 101-3 does not stop at sacrificial SAC2 layers 102*o* of active layers 101-3 and 101-4. Exposed portions of drain polysilicon 104 and SAC4 layers 105*s-b* of both active layers 101-3 and 101-4 are also removed. The resulting structure is shown in FIG. 2(viii). Removal of exposed portions of drain polysilicon 104 and SAC4 layers 105*s-b* of both active layers 101-3 and 101-4 allows vias to reach from above active layers 101-3 and 101-4 to reach drain polysilicon 103 of active layers 101-1 and 101-2. (Removal of portions of drain polysilicon layer 103 and SAC4 layer 105*s-b* of active layer 101-1 is not required as no via is expected to go through space occupied by these layers.)

Photoresist layer 201 is then further recessed a second time and the exposed areas of isolation films 106 immediately above active layers 101-4. 101-3 and 101-2, (a) SAC4 layers 105*s-t* of active layers 101-4, 101-3 and 101-2, and (b) source polysilicon 103 of active layers 101-4, 101-3 and 101-2 are removed to expose drain polysilicon 104 of active layers 101-4, 101-3 and 101-2. The resulting structure is shown in FIG. 2(*ix*).

Photoresist layer 201 is then removed. Silicon oxide 202 is then provided to fill the cavities created by the etching steps of FIGS. 2(*vii*)-2(*ix*), which is then followed by a planarization step (e.g., CMP) that planarizes the resulting surface. The resulting structure is shown in FIG. 2(*x*).

The steps described in conjunction with FIGS. 2(*vi*) to 2(*x*) may be repeated every two active layers deposited. Note that, these staircase formation steps discussed in conjunction with FIGS. 2(*i*) to 2(*x*) require one photolithography ("photomasking") step every two active layers deposited, which is more advantageous than staircase formation steps used previously, which require one or more photolithography steps for every active layer deposited.

After all active layers of memory structure 100 are deposited and the cavities from the last first and second etching steps on the final two active layers are filled, an oxide etch may be performed at an appropriate time to create vias to reach drain polysilicon layer 104 of each active layer. The resulting structure is shown in FIG. 2(xi). In FIG. 2(xi), only for exemplary purposes, four active layers 101-1, 101-2, 101-3 and 101-4 are shown. In FIG. 2(xi), vias 203-1, 203-2, 203-3 and 203-4 may be created to access any of the semiconductor or conductor material layer in each active layer present.

In some embodiments, after the planarization step that creates memory structure 100 of FIG. 2(xi), staircase portion 108 is protected by a mask during a substantial portion of the remaining processing in array portion 109, except for etching of trenches to create the active stacks, the oxide etch that creates memory structure 100 of FIG. 2(xi), and replacement of SAC4 layers 105s-b and 105s-t by a metal or another conductor. One example of a fabrication process that includes the remaining processing steps is disclosed, for example, in Provisional Application I. One of ordinary skill in the art would understand that the present invention is applicable to any structure with any number of active layers and vias desired. When filled with a conductor material (e.g., barrier material and any refractory metal, such as tungsten or another conductive material), these vias provide electrical connectivity between drain polysilicon 104 and circuitry in semiconductor substrate 150 through the conductors in one or more global interconnect layers to be formed above memory structure 100.

According to various embodiments, one or more P-type semiconductor layers (e.g., $P^+$ or $P^{++}$ polysilicon layer, with dopant concentration between $5.0 \times 10^{18}$ cm$^{-3}$-$5.0 \times 10^{21}$), including a P-type body layer, may be provided in each active layer to supply charge carriers to a depleted channel region during an erase operation. In such embodiments, it is desirable to connect the P-type body layer electrically to a bias voltage source. In some embodiments, the P-type body layer is shorted to source polysilicon layer 103. FIGS. 2(xii) to 2(xxiii) illustrate one method for fabricating staircase structures in staircase portions 108 of memory structure 160, for connecting to both source and drain polysilicon layers in the active layers, in accordance with one embodiment of the present invention.

FIG. 2(xii) shows memory structure 160 after depositions of active layers 101-1 and 101-2. In FIG. 2(xii), each of active layers 101-1 and 101-2 may include (a) sacrificial layer 105s-b ("SAC4 layer 105s-b"; e.g., a layer of silicon germanium); (b) $N^+$ doped polysilicon layer 104 (drain (c) silicon oxide layer 102a ("sacrificial channel oxide or SAC2 layer 102a"; 30-nm silicon oxide film); (d) P-body region 403, e.g., a 20 nm Pt-doped polysilicon layer; (e) silicon oxide layer 102b ("sacrificial channel oxide or SAC2 layer 102b"; 30-nm silicon oxide film); (f) $N^+$ polysilicon layer 103 (source; and (g) sacrificial layer 105s-t ("SAC4 layer 105s-t"; e.g., a layer of silicon germanium). SAC4 layers 105s-b and 105s-t are sacrificial layers that would each subsequently be replaced by a metallic conductor layer, as discussed below. Each of SAC2 layers 102a and 102b are to be subsequently recessed to accommodate a channel material to be deposited (e.g., a lightly-doped P-type polysilicon). Such P$^-$ channel regions are in contact with and shared by P$^+$ body region 403 (which is typically more heavily doped than the P$^-$ channel regions). P$^+$ body region 403 facilitates an efficient erase operation by providing electrical charge carriers ("holes") to the channel regions. In some embodiments, an ultrathin dielectric layer—as thin as a few monolayers of dielectric material, but typically no thicker than 2-3 nanometers—can be deposited or grown thermally between P$^+$ body region 403 and the P$^-$ channels. This optional ultrathin layer inhibits auto-doping of boron from P$^+$ body region 403 to the P$^-$ channels during a high temperature process step, while still allowing the plentiful holes in P$^+$ body region 403 be provided (e.g., by tunneling) to the relatively depleted P$^-$ channels, when an appropriately high voltage is applied during an erase operation.

A photoresist layer is then deposited and patterned over memory structure 160. The steps described above in conjunction with FIGS. 2(i) to 2(iv) are then carried out. (Here, of course, SAC2 102a, P-body layer 403 and SAC2 102b layers are removed where sacrificial SAC2 102o is removed in FIGS. 2(i) to 2(iv).) The resulting structure after removing the photoresist layer is shown in FIG. 2(xiii). Photoresist layer 210 is then provided to cover the surface of memory structure 160 and to fill the cavities created by the etching steps of FIGS. 2(i) to 2(iv). Photoresist layer 210 is then patterned to expose a region in staircase portion 108 at the surface of memory structure 160. An anisotropical etch removes from the exposed regions of isolation film 106 above active layer 101-2 and each of the material layers of active layer 101-2, as illustrated by the resulting structure shown in FIG. 2(xiv). Photoresist 210 is then removed and silicon oxide layer 202 is then deposited over memory structure 160, filling the cavities formed from the etching steps, and planarized, as shown in the resulting structure of FIG. 2(xv).

The next two active layers, i.e., active layers 101-3 and 101-4, are then deposited on memory structure 160. Thereafter, the steps described above with respect to FIGS. 2(vi) to 2(ix) are carried out to create the staircase features for contacting drain polysilicon 103 in each of active layers 101-3 and 101-4. (Here, also, SAC2 102a, P-body layer 403 and SAC2 102b layers are removed where sacrificial SAC2 102o is removed in FIGS. 2(vi) to 2(ix).) The resulting structure is shown in FIG. 2(xvi).

Photoresist layer 211 is provided over the surface of memory structure 160, filling the cavities formed by the steps of FIGS. 2(vi) to 2(ix), and patterned, as illustrated by the resulting structure in FIG. 2(xvii). An isotropic etching step removes the exposed regions of isolation film 106 above active layer 101-4 and each of the material layers of active layer 101-4, as illustrated by the resulting structure in FIG. 2(xix). Photoresist layer 211 is then recessed, as illustrated in FIG. 2(xx). Thereafter, an isotropic etch removes the exposed areas of isolation films 106 and the material layers of active layers 101-3 and 101-4, forming the exposed two-step structure illustrated in FIG. 2(xx). Photoresist layer 211 is then removed, as illustrated in the resulting structure of FIG. 2(xxi).

Silicon oxide 202 is then provided to fill the cavities created by the etching steps and planarized. The resulting structure is shown in FIG. 2(xxii).

The steps described in conjunction with FIGS. 2(xvi) to 2(xxii) may be repeated every two active layers deposited.

After all active layers of memory structure 100 are formed and the cavities from the last first and second etching steps on the final two active layers are filled, a first oxide etch may be performed at an appropriate time to create vias to reach drain polysilicon layer 104 of each active layer. A second oxide etch may be carried out to form vias reaching P-body layer 403. The resulting structure is shown in FIG. 2(xxiii). The first and second oxide etches may be tuned to stop at different layers (e.g., N+ doped drain polysilicon 104 and source metal strap layer 105*t* respectively, as is known to a person of ordinary skill in the art).

In FIG. 2(xxiii), only for exemplary purposes, four active layers 101-1, 101-2, 101-3 and 101-4 are shown. In FIG. 2(xxiii), vias 203-1, 203-2, 203-3 and 203-4 may be created to access drain polysilicon 104 in each active layer present and vias 204-1, 204-2, 204-3 and 204-4 to reach P-body layer 403. Vias 204-1 to 204-4 also each go through source polysilicon 103 along the way to P-body layer 403, thereby shorting source polysilicon 103 to P-body layer 403 when the via is filled with a conductive core.

(Alternatively, a staircase structure for contacting a P-type body layer may be formed in other embodiments using the process steps illustrated in FIGS. 3(*i*)-3(*ix*). For example, FIG. 3(*i*) shows, in staircase portion 108, a P-doped polysilicon body layer 403 is included in each active layer.)

According to another embodiment of the present invention, FIGS. 7(*i*) to 7(*ix*) illustrate yet another method for fabricating a staircase structure in staircase portion 108 of memory structure 100, in accordance with one embodiment of the present invention. FIG. 7(*i*) shows memory structure 800 after depositions of active layers 101-1, 101-2, 101-3 and 101-4. In FIG. 7(*i*), each of active layers 101-1 to 101-4 may include (a) sacrificial layer 105*s*-*b* ("SAC4 layer 105*s*-*b*"; e.g., a layer of silicon germanium); (b) N+ doped polysilicon layer 104 (drain); (c) silicon oxide layer 102 ("SAC2 102"; 30-nm silicon oxide film); (d) N+ polysilicon layer 103 (source); and (e) sacrificial layer 105*s*-*t* ("SAC4 layer 105*s*-*t*"; e.g., a layer of silicon germanium). SAC4 layers 105*s*-*b* and 105*s*-*t* are sacrificial layers that would each subsequently be replaced by a metallic conductor layer, as discussed below. SAC2 layers 102 is to be subsequently recessed to accommodate a channel material to be deposited (e.g., a lightly-doped P-type polysilicon). Active layers 101-1 to 101-4 are isolated from each other by isolation films 106. FIG. 7 shows a cross section of memory structure 800 along the lengthwise direction of an active stack to be formed that includes 4 active strips. The two ends of the active stack, indicated by reference numerals 801 and 802, respectively, are provided for electrical connections to the conductive layers (e.g., N+ polysilicon layer 103 and N+ polysilicon layer 104) of each active of active layers 101-1 to 101-4. FIGS. 7(*i*)-7(*ix*) are not drawn to scale. The portion of memory structure 800 between portions 801 and 802, which is provided for formation of memory cells is schematic represented by portion 803. In an actual implementation, portion 803 would accommodate a large number (e.g., 8196 or greater) of memory cells.

As shown also in FIG. 7(*i*), photoresist layer 806 has been deposited and patterned over memory structure 800. Using this pattern of photoresist layer 806, the exposed portion of active layer 101-4 is removed, i.e., successive selective etchings are carried out on isolation film 106, SAC4 layer 105*s*-*t*, N+ polysilicon layer 103, SAC2 layer 102, N+ polysilicon layer 104 and SAC4 layer 105*s*-*b*. The resulting structure is shown in FIG. 7(*ii*). Thereafter, photoresist layer 806 is recessed to further expose underlying portions of memory structure 800, as shown in FIG. 7(*iii*). Then, the exposed portion of active layers 101-3 and 101-4 are removed i.e., successive selective etchings are carried out on isolation film 106, SAC4 layer 105*s*-*t*, N+ polysilicon layer 103, SAC2 layer 102, N+ polysilicon layer 104 and SAC4 layer 105*s*-*b* in each of active layers 101-3 and 101-4. The resulting structure is shown in FIG. 7(*iv*). The recess and active layer etching steps of FIGS. 7(*iii*) and 7(*iv*) are then repeated to remove exposed portions of active layers 101-2, 101-3 and 101-4. Thereafter, photoresist layer 806 is replaced by a new photoresist layer 807, which filled the cavities resulting from the active layer removals. Photoresist layer 807 is then patterned, as shown in FIG. 7(*v*). Note that the patterning of photoresist layer 807 protects portion 801 of memory structure 800 (i.e., portion reserved for electrical connections to the source layer).

Successive selective etches are then carried out to remove from each active layer exposed portions of isolation thin 106, SAC4 layer 105*s*-*b*, and N+ polysilicon layer 103 to expose SAC2 layer 102 of each active layer. The resulting structure is shown in FIG. 7(*vi*). Photoresist layer 807 is then removed, and oxide layer 808 (e.g., SiO$_2$) is deposited over memory structure 800 and planarized by CMP, as shown in FIG. 7(*vii*).

At this point, active layers 101-1 to 101-4 may be etched to create the stacks of active strips. In addition, SAC2 layer 102 may be recessed to accommodate a channel material (e.g., a lightly-doped polysilicon or monocrystalline silicon) to be deposited in the resulting cavities along opposite sides of each active strip. See, for example, Non-Provisional Application III for suitable steps for etching of the active layers to form active steps, recessing the SAC2 layer of each active strip and providing the channel material to filled to cavities resulting from recessing the SAC2 layers.

Subsequently, bit line contacts may be photolithographically defined and an anisotropic oxide etch opens vias for electrical contact to N+ polysilicon layer 104 of each active layer. (The anisotropical oxide etch also etches through the remaining SAC2 layer 102 to expose the underlying N+ polysilicon layer 104.) The via openings may be filled by a conductive material (e.g., tungsten, tantalum or another refractory metal, with suitable barrier and adhesion films), such as illustrated in FIG. 7(viii). FIG. 7(viii) shows tungsten-filled representative via openings 810*a*, 810*b*, 810*c* and 810*d*. FIG. 7(viii) also shows that this cross-section cuts through, in portion 801 (i.e., source line contact portion), channel material 809*a*, 809*b*, 809*c* and 809*d* in the recessed portions of SAC2 layers 102 in active layers 101-4, 101-3, 101-2 and 101-1, respectively.

Thereafter, source line contacts may be lithographically defined and an successive anisotropical etches may be carried out to cut source line via openings through oxide layer 808, and isolation film 106, SAC4 layer 105*s*-*t*, and N+ polysilicon layer 103 in the exposed portions of each active layer, thereby exposing channel material 809*a*-809*d*. To ensure good contact to be made to channel material 809*a*-809*d*, an ion implantation step may be carried out to introduce dopant species (e.g., P-type dopant species, such as boron) at the contact points of channel material 809*a*-809*d*. The via openings may then be filled by a conductive material (e.g., tungsten, with suitable barrier and adhesion films), such as illustrated in FIG. 7(*ix*). FIG. 7(*ix*) shows tungsten-filled representative via openings 811*a*, 811*b*, 811*c* and 811*d*. In this manner, both N+ polysilicon layer 103 and the channel material in each active strip is electrically shorted to each other, providing a substrate bias voltage to be provided to channel material 809*a*, 809*b*, 809*c* and 809*d*, if desired. At this point, the staircase structures in portions 801 and 802 allows electrical connections to be made to each common source and common drain electrodes at each active strip formed out of active layers 101-1 to 101-4.

As mentioned above, a staircase structure for contacting a P-type body layer may be formed in other embodiments using the process steps illustrated in FIGS. 3(*i*)-3(*ix*). FIG.

3(*i*) shows, in staircase portion 108 of a memory structure 400, having multiple active layers isolated from each other by interlayer dielectric layer 503. To simplify this detailed description, only active layer 300 at the top of memory structure 400 is shown. It is understood that each active layer of memory structure 400 is processed as illustrated in the following description in conjunction with FIGS. 3(*i*)-3(*ix*). As shown in FIG. 3(*i*), active layer 300 includes (a) first sacrificial layer (SAC4) 524*b*, which is to be subsequently replaced by a metal or conductor layer; (b) N$^+$ common drain and source regions 521 and 523, respectively; (c) oxide layers 522*a* and 522*b*; (d) P-doped polysilicon body layer 403; and (e) thin sacrificial oxide layer 571. In this embodiment, N$^+$ common drain region 521 is connected to semiconductor substrate 150 (not shown) using buried contacts through metal plugs in the vias etched in interlayer dielectric 503. (See description below, in conjunction with FIGS. 3(viii)-3(*ix*).)

After thin sacrificial oxide 571 is deposited, as shown in FIG. 3(*ii*), sacrificial oxide layer 571 is patterned and etched, removing exposed portions of N$^+$ common source region 523, oxide layer 522*a*, and P-doped polysilicon body layer 403 to form a step, stopping at a surface of oxide layer 522*b*. A thin conductive polysilicon layer 551 is then conformally deposited on the exposed surface of memory structure 400 (FIG. 3(*iii*)). Thereafter, conductive polysilicon layer 551 is anisotropically etched, so that only a portion of conductive polysilicon layer 551 remains on the sidewall of the step of FIG. 3(*iii*), as shown in FIG. 3(*iv*). Nickel or nickel alloy metallic layer 552 is then deposited over the step (FIG. 3(*v*)). A salicidation step may then be carried out at 600° C. or lower to salicidize the remaining conductive polysilicon layer 551 (i.e., nickel silicide shunt 553) on the sidewall of the step (FIG. 3(*vi*)), which electrically shorts P-doped polysilicon body layer 403 to N$^+$ common source region 523. Remaining nickel or nickel metallic layer 552 may then be removed by an isotropic etch (FIG. 3(*vii*)). In preparation for deposition of the next active layer, interlayer dielectric 503 is deposited (FIG. 3(viii)). Thereafter, dielectric layer 513 (e.g., an oxide) is deposited and planarized, as shown in FIG. 3(*ix*)). Vias may be etched through interlayer dielectric 503 and dielectric layer 513 to reach designated buried contacts underneath interlayer dielectric 503. Sacrificial layer 524*a* (for subsequent replacement by a metallic conductor) of the next active layer may then be deposited in a conventional manner. Vias in dielectric layers 503 and 513 may be filled with a metal or conductor, which would connect the metal (e.g., any refractory metal, such as tungsten) or conductor that subsequently replaces sacrificial layer 524*b* and N$^+$ common drain region 521 of the next active layer.

In some embodiments, after planarizing dielectric layer 513 that fills the step-down in the last of the active layers, staircase portion 108 is protected by a mask during a substantial portion of the remaining processing in array portion 109, except for an "NIN" trench etch, which creates the active stacks, and replacement of sacrificial layers 524*a* and 524*b* each by a metal or another conductor. One example of a fabrication process that includes the remaining processing steps is disclosed in Provisional Application I, for example. One of ordinary skill in the art would understand that the present invention is applicable to any structure with any number of active layers and vias desired.

Figure 4I:
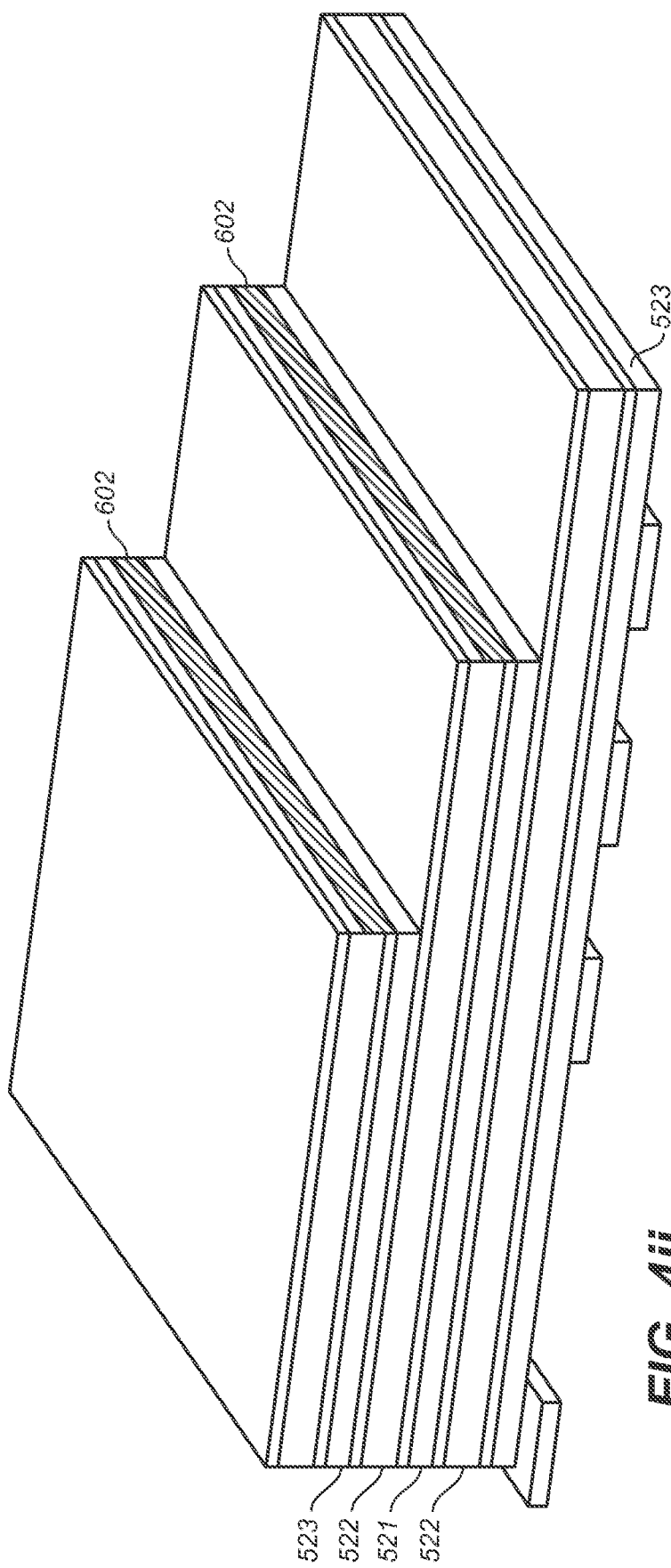
FIG. 4(i) shows a staircase structure in staircase portion 108 of memory structure 600, wherein conductive polysilicon spacer 602 is provided at a step cut in each active layer, after substantially all of conformally deposited conductive polysilicon layer 601 has been removed, in accordance with one embodiment of the present invention.

According to another embodiment of the present invention provides an alternative way to connect an N$^+$ common source region to a P-doped polysilicon body region. FIG. 4(*i*) shows staircase portion 108 of memory structure 600, in which each active layer includes: (a) sacrificial layers (SAC4) 524*a* and 524*b*, each to be subsequently replaced by a metal or conductor layer; (b) N$^+$ common source and drain layers 523 and 521, respectively; and (c) P-doped polysilicon body region 522. FIG. 4(*i*) shows that adjacent active layers are isolated by interlayer dielectric (ILD) 503. For illustrative purpose only, FIG. 4(*i*) shows only two steps from two active layers. One of ordinary skill in the art would understand that any suitable number of active layers can be processed in the fabrication processes illustrated herein. Like the fabrication process discussed above with respect to FIGS. 3(*i*) to 3(*ix*), the staircase structure in memory structure 600 of FIG. 4(*i*) is achieved by cutting one step during processing of each active layer deposited. Each active layer is patterned in a photomasking step and following etching steps that selectively remove exposed portions of SAC4 layer 524*a*, N$^+$ common source region 523, P-doped body region 522, N$^+$ common drain region 521 to result in cutting a step to expose sacrificial layer 524*b*. A conformal conductive polysilicon film 601 (e.g., 40 nm thick) is then deposited over the step. Polysilicon film 601 may have a boron dopant concentration of around $1.0 \times 10^{19}$ cm$^{-3}$-$5.0 \times 10^{19}$ cm$^{-3}$, or even higher. Thereafter, an anisotropic spacer etch removes conductive polysilicon film 601 almost everywhere, except as a spacer remaining on the side wall of each step. A further etch (e.g., a timed etch) of the spacers remaining from conductive polysilicon layer 601 may be carried out to provide conductive polysilicon spacer 602 that would serve as an ohmic contact, shorting N$^+$ common drain region 521 to P-doped body region 522. Conductive polysilicon spacer 602 may be, for example, between 40-50 nm thick. In this manner a body bias voltage may be provided to P-doped body region 522 from the bit line represented by N$^+$ common drain region 521. Oxide 630 is then provided to fill the step-down created in the active layer.

At a subsequent step, after all active layers have been processed, vias (represented in FIG. 4(*i*) by reference numerals 631) may be created to be subsequently filled to form a conductor plug that connects the metallic or conductive material replacing SAC4 layer 524*b*. These conductor plugs in vias 631 allows circuitry in semiconductor substrate 150 to be connected to a semiconductor or conductor layer of an active strip through a global interconnect layer to be formed above memory structure 600.

FIG. 4(*i*) shows conductive polysilicon spacer 602, after substantially all conductive polysilicon 601 has been removed.

FIG. 4(*ii*) shows a perspective view of staircase portion 108 of memory structure 600 of FIG. 4(*i*), in accordance with one embodiment of the present invention.

As discussed above, at least one photomasking step is required every two active layers in the methods for forming staircase structures associated with FIGS. 2(*i*) to 2(*vi*), at least one photomasking steps is required for each active layer for the method for forming staircase structures associated with FIGS. 3(*i*) to 3(*ix*), and at least two photomasking steps are required to form a reverse staircase using any of the methods disclosed in Non-provisional Application III. According to the following embodiments of the present invention, conductor columns that are used as word lines in array portions 109 may be similarly formed in staircase portions 108 and be used as conductors for connecting conductive layers in the active strips to circuitry in semiconductor substrate 150.

Figure 5A:
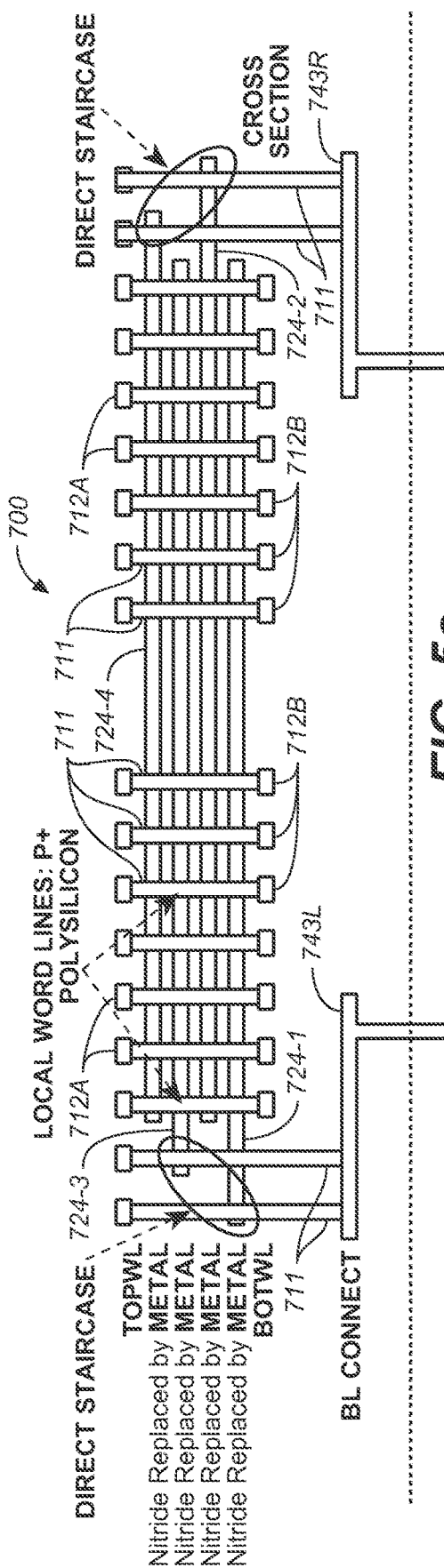
FIGS. 5(a)-5(c) show, respectively, illustrative cross-sectional view of memory structure 700, illustrative top view of semiconductor substrate 150 underneath memory structure 700 and illustrative perspective view of memory structure 700.

According to one embodiment of the present invention, FIGS. 5(*a*), 5(*b*) and 5(*c*) show, respectively, a simplified cross-sectional view of memory structure 700, a top view of semiconductor substrate 150 underneath memory structure 700, and a perspective view of memory structure 700 (showing staircase portion 108 and a portion of array portion 109). In FIG. 5(a), memory structure 700 is represented by N+ common drain regions 724-1, 724-2, 724-3 and 724-4 in active strips 101-1, 101-2, 101-3 and 1014-4. The other conductive and non-conductive layers are not shown to simplify this detailed description. Although only four active strips are shown in FIG. 5(a), it is understood that any suitable number of active strips may be provided. The principles and teachings herein are applicable to these other conductive layers in each active strip.

Figure 5B:
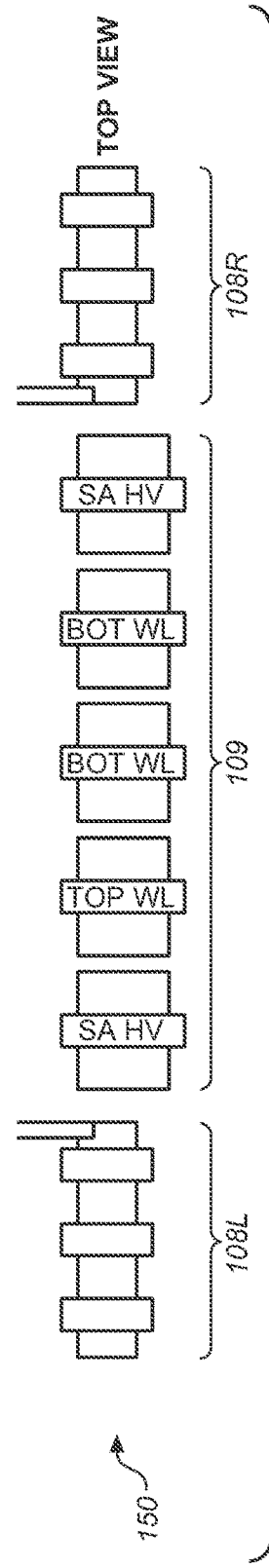

As shown schematically in FIG. 5(a), memory structure 700 includes array portion 109 provided between staircase portions 108L and 108R, which are located at opposite ends of memory structure 700. In array portion 109, conductor columns 711 serve as gate electrodes or word lines for the thin-film storage transistors formed along the active strips and each conductor column is connected to a conductor in either global interconnect layer 712A, provided above memory structure 700, or global interconnect layer 712B, provided underneath memory structure 150. FIG. 5(b) shows, schematically, the signals of the conductor columns in array portion 109 being routed by conductors in global interconnect layers 712A and global interconnect layers to various circuitry in semiconductor substrate 150. In addition, in each of staircase portions 108L and 108R, FIG. 5(a) represents using conductor columns 711 to connect N+ common drain regions 724-1, 724-2, 724-3 and 724-4 to circuitry in semiconductor substrate 150. Specifically, the staircase structures in staircase portions 108L and 108R allow a conductor plug in a via (e.g., any of conductor plugs 725, shown in FIG. 5(c)) above each of N+ common drain regions 724-1 to 724-4 to connect to one of conductor columns 711 through a section of a conductor in global interconnect layer 712A. Each conductor column is connected to a corresponding one of bit line segments[1] 743L and 743R, which may be selectively connected to sense amplifiers and voltage sources in semiconductor substrate 150. In this manner, connections of a conductive layer in an active strip to circuitry in semiconductor substrate 150 may take advantage of the same photomasking steps associated with connecting conductive columns 711 to global interconnect layer 712A. In FIGS. 5(a) and 5(b), N+ common drain regions 724-1 and 724-3 are connected to bit line segment 743L in staircase portion 108L at one end of memory structure 700, while N+ common drain regions 724-2 and 724-4 are connected to bit line segments 743R in staircase portion 108R on the opposite end of memory structure 700.

[1] Bit line segments in this context are disclosed, for example, in Provisional Application III.

Figure 5C:
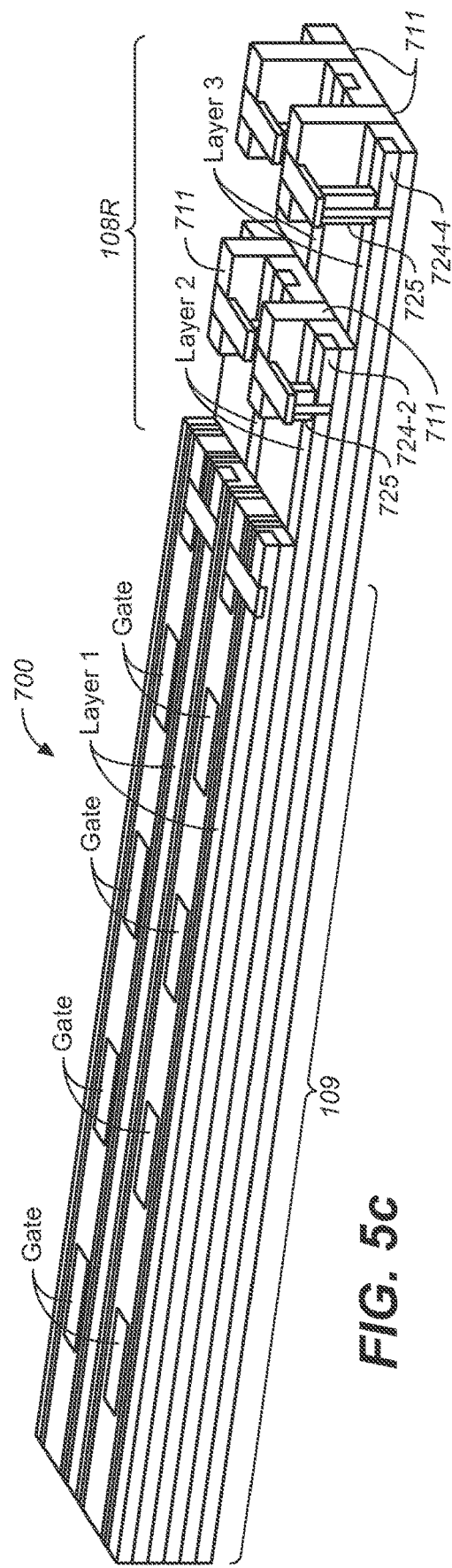
Figure 6I:
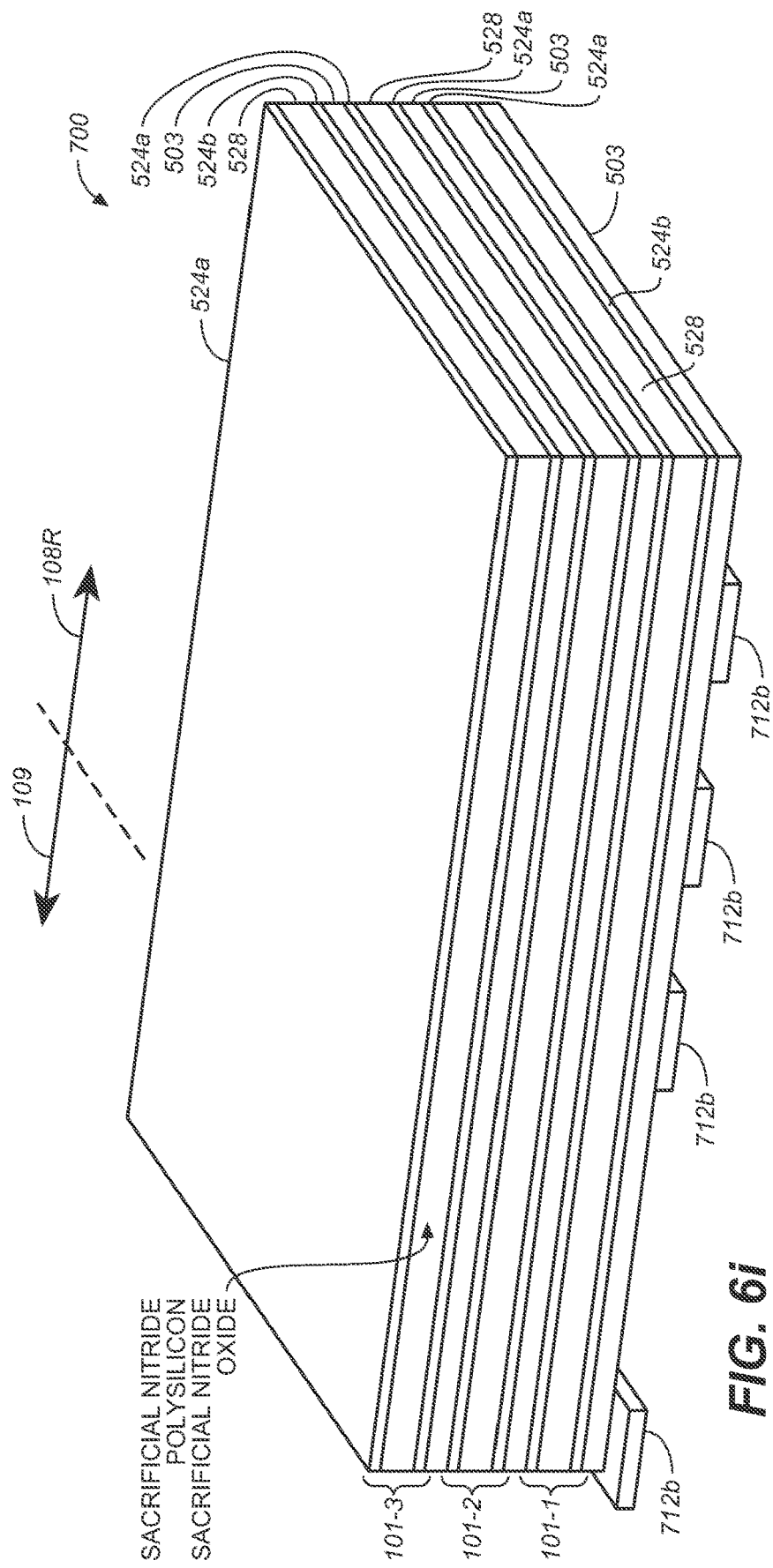
FIGS. 6(i)-6(xi) illustrate a fabrication process for forming staircase portion 108 of memory structure 700 of FIGS. 5(a)-5(c) above.
Figure 6I:
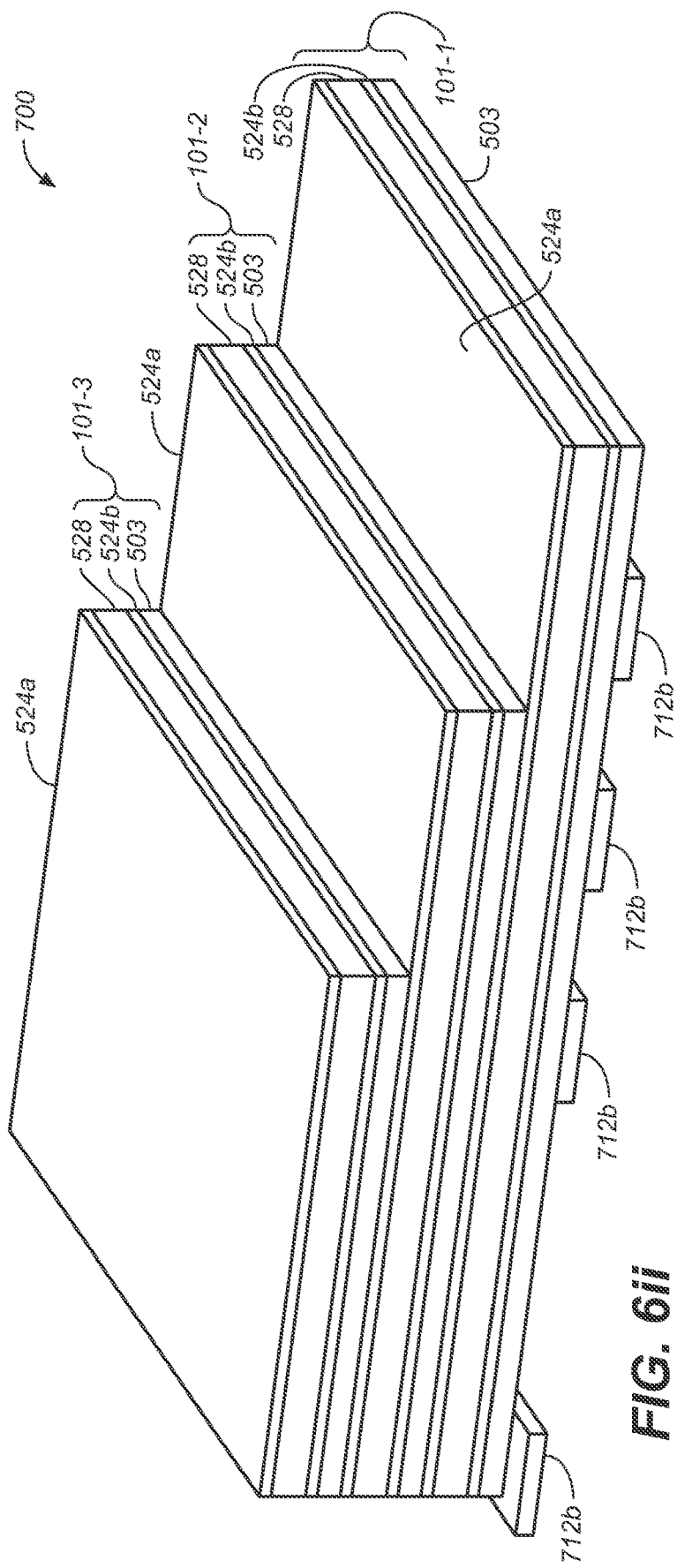
Figure 6I:
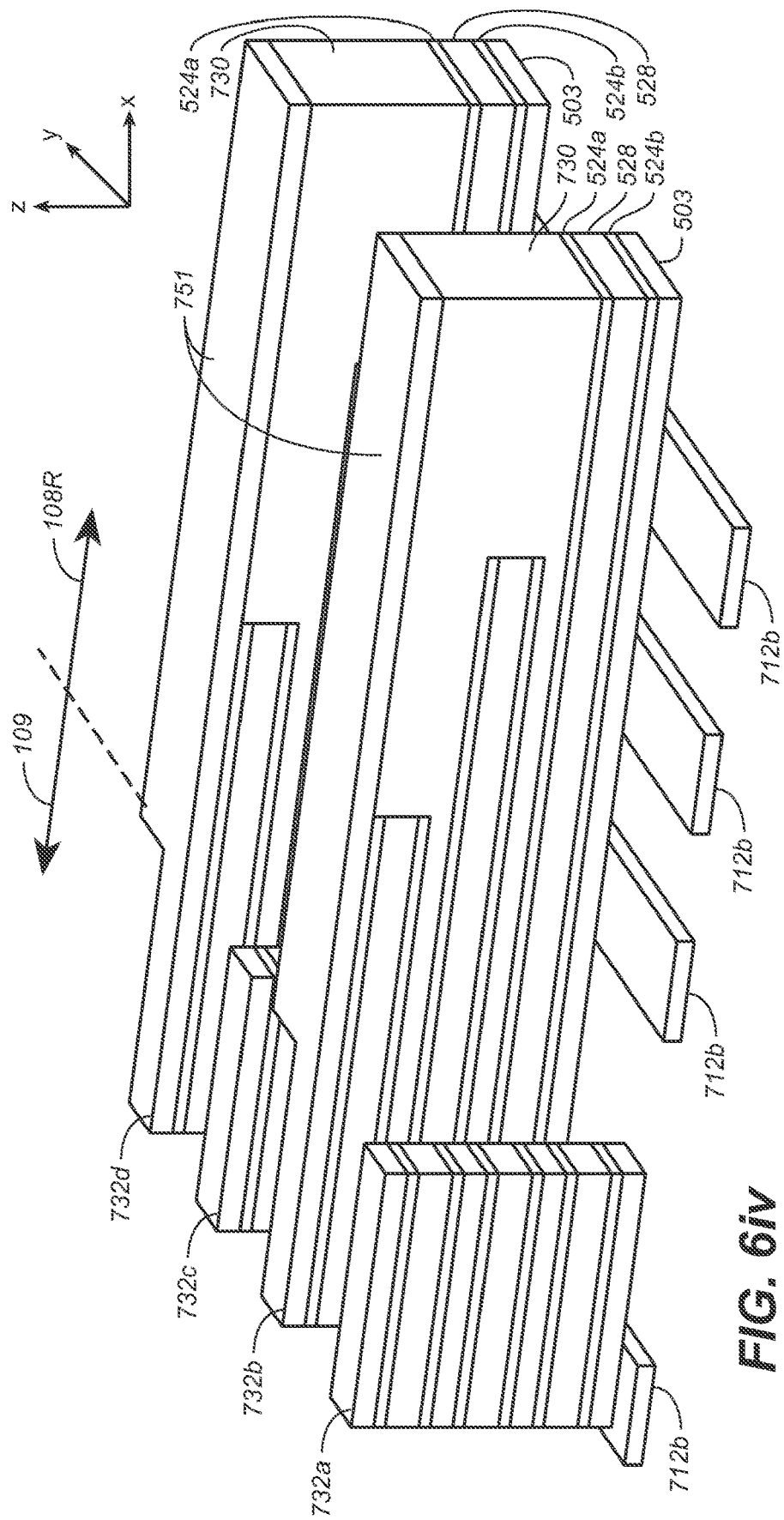

FIG. 6(i)-6(xi) show an illustrative fabrication process for forming memory structure 700, illustrated in FIGS. 5(a)-5(c) above.

Initially, as shown in FIG. 6(i), active layers 101-1 to 101-3 in memory structure 700 are provided over conductors 712B of a global interconnect layer above semiconductor substrate 150, using any suitable deposition steps. As shown in FIG. 6(i), only sacrificial layers (SAC4) layers 524a and 524b and semiconductor layers 528 are shown for each active layer. (SAC4 layers 524a and 524b may each be a nitride, oxide or other material sacrificial layer which is replaced by a metallic or conductor layer at a subsequent step.) One of ordinary skill in the art would understand that semiconductor layers 528 (e.g., polysilicon layers) may include N+ common drain region 521, channel region 522 and N+ common source region 523, which are not specifically individually drawn in FIG. 6(i)-(xi) to simplify this detailed description. Also, only three active layers are shown in FIGS. 6(i)-6(xi), but one of ordinary skill in the art would understand that any suitable number of active layers may be provided. In FIG. 6(i), adjacent active layers are isolated from each other by isolation layer 503. Further, FIG. 6(iv) shows only part of array portion 109 and staircase portion 108R.

Thereafter, active layer 101-1 to 101-3 are patterned and etched to create a staircase structure, which is shown in FIG. 6(ii). Oxide 731 (e.g., silicon oxide) is then deposited into the staircase structure and planarized. The resulting memory structure 700 is shown in FIG. 6(iii). At this time, hard mask 751 may be applied. Hard mask 751 provides structural integrity to memory structure 700 during the following high aspect ratio etch (trench or "NIN" etch) of the active layers to create active stacks. The resulting memory structure 700, showing active stacks 732a, 732b, 732c and 732d, is shown in FIG. 6(iv). FIG. 6(iv), active stacks 732b and 732d may be made wider in the x-direction, which allows for narrower active strips in array portion 109, but allows for larger, less resistive conductor plugs for vias in staircase portion 108R. It is understood that active stacks 732a and 732c are likewise wider in staircase portion 108L.

Figure 6V:
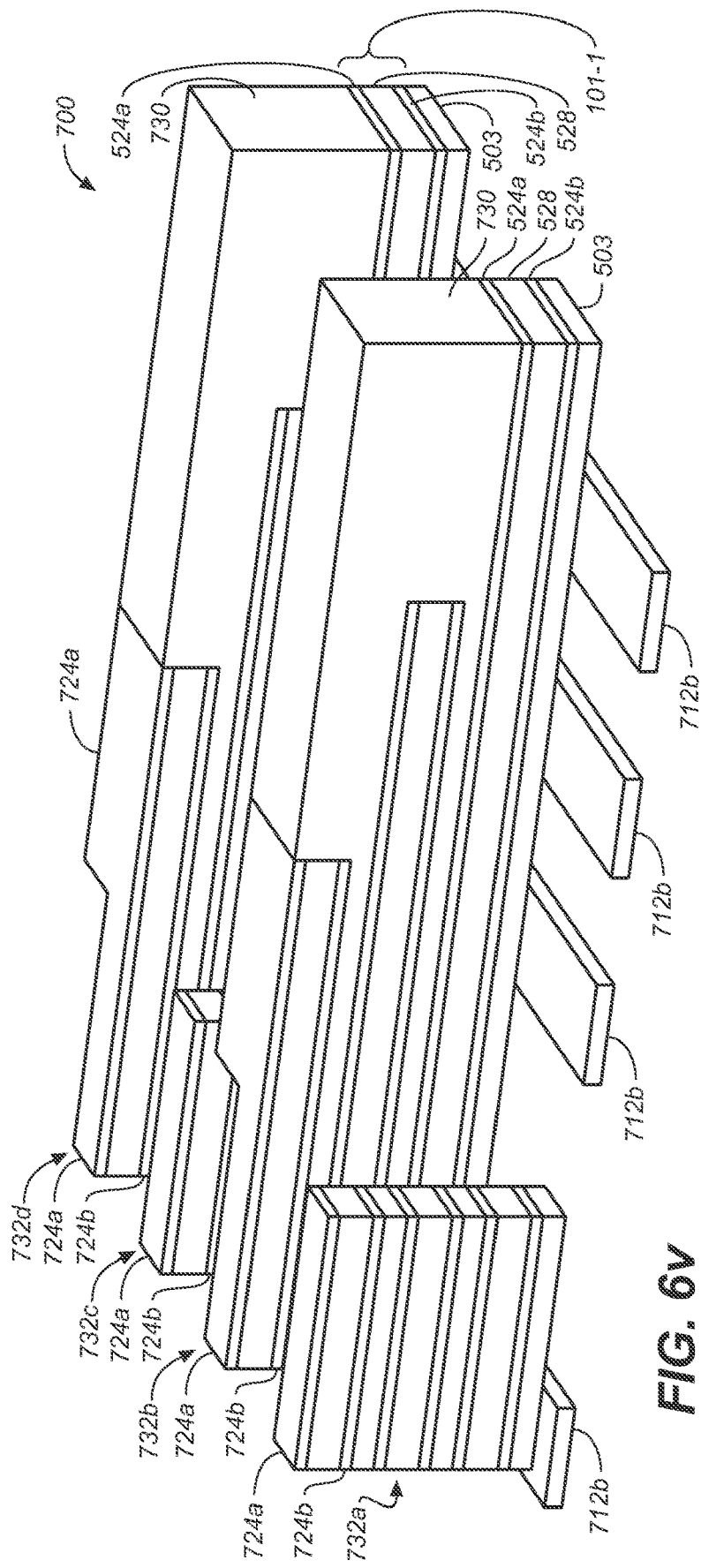
Figure 6V:
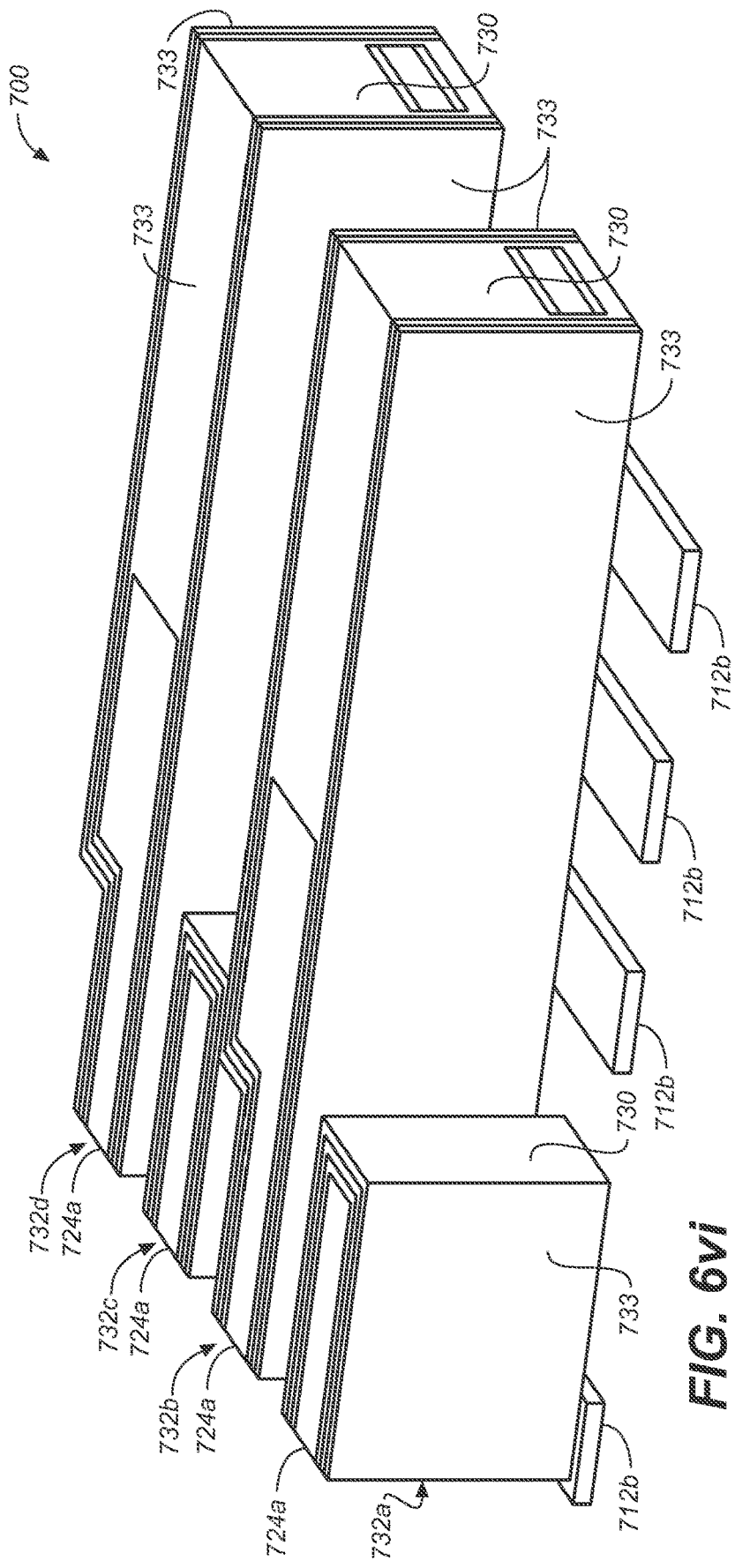
Figure 6I:
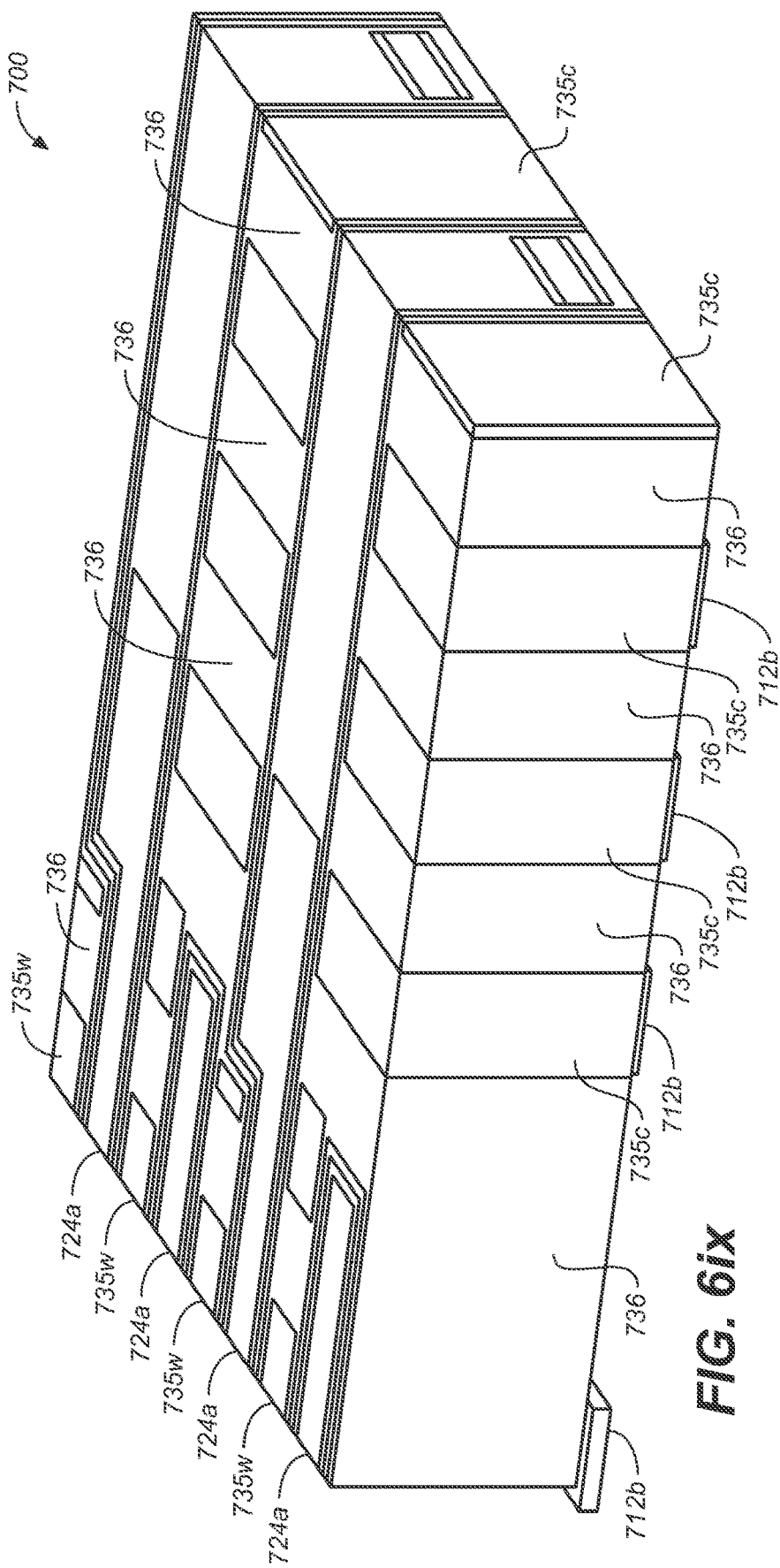

Hard mask 731 may then be removed. The NIN etch exposes on SAC4 layers 524a and 524b at the sidewalls of active stacks 732a, 732b, 732c and 732d. SAC4 layers 524a and 524b are then etched and replaced by a metal or other conductor. This metal or other conductor replacement is disclosed in detail, for example, in Non-provisional Application I. Provisional Application I further discloses providing supporting structures to ensure structural integrity in the active stacks if SAC4 layers 524a and 524b are to be completely removed. Resulting memory structure 700 is shown in FIG. 6(v).

Charge-trapping or storage material 733 (e.g., an oxide-nitride-oxide triple-layer) is then conformally deposited and planarized on memory structure 700. Resulting memory structure 700 is shown in FIG. 6(vi). Thereafter, P+ polysilicon 735 (e.g., dopant concentration between $5.0 \times 10^{19}$ cm$^{-3}$ and $1.0 \times 10^{21}$ cm$^{-3}$) or other conductive or metallic material is deposited to fill the trenches between the active strips and planarized. The resulting memory structure 700 is shown in FIG. 6(vii).

P+ polysilicon or the other conductive material 735 is then patterned and etched, as shown in FIG. 6(viii), to create conductive columns serving as local word lines 735W in array portion 109, and conductive columns 735C in staircase portion 108. The etching step creates trenches between adjacent conductive columns 735W or 735C. These trenches may then be filled by oxide 736 to provide electrical isolation between the conductive columns. Resulting memory structure 700 is shown in FIG. 6(ix). Vias are then created by an oxide etch that stops at metal layer 524a and filled with a conductor.

Figure 6X:
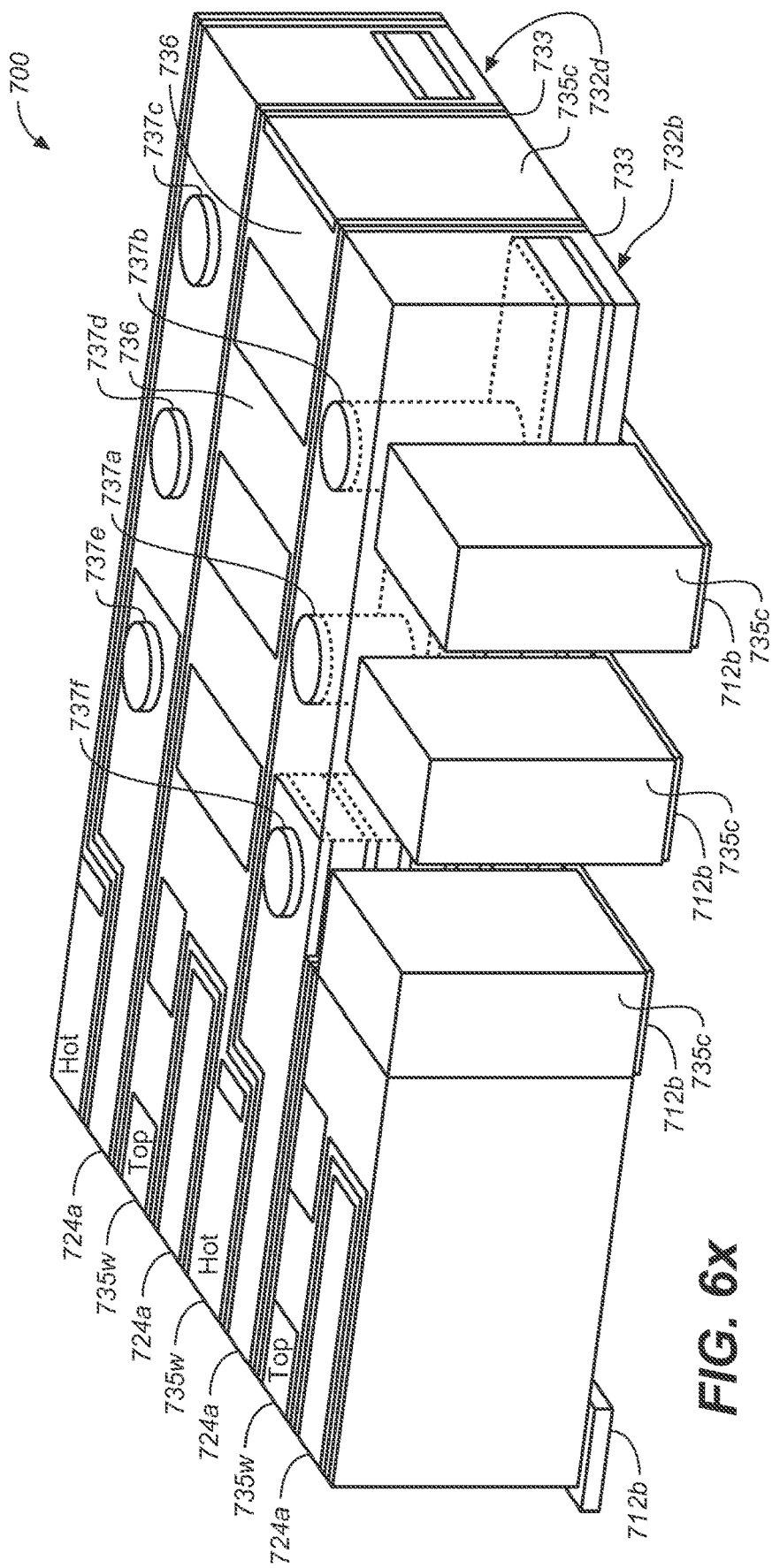
Figure 7I:
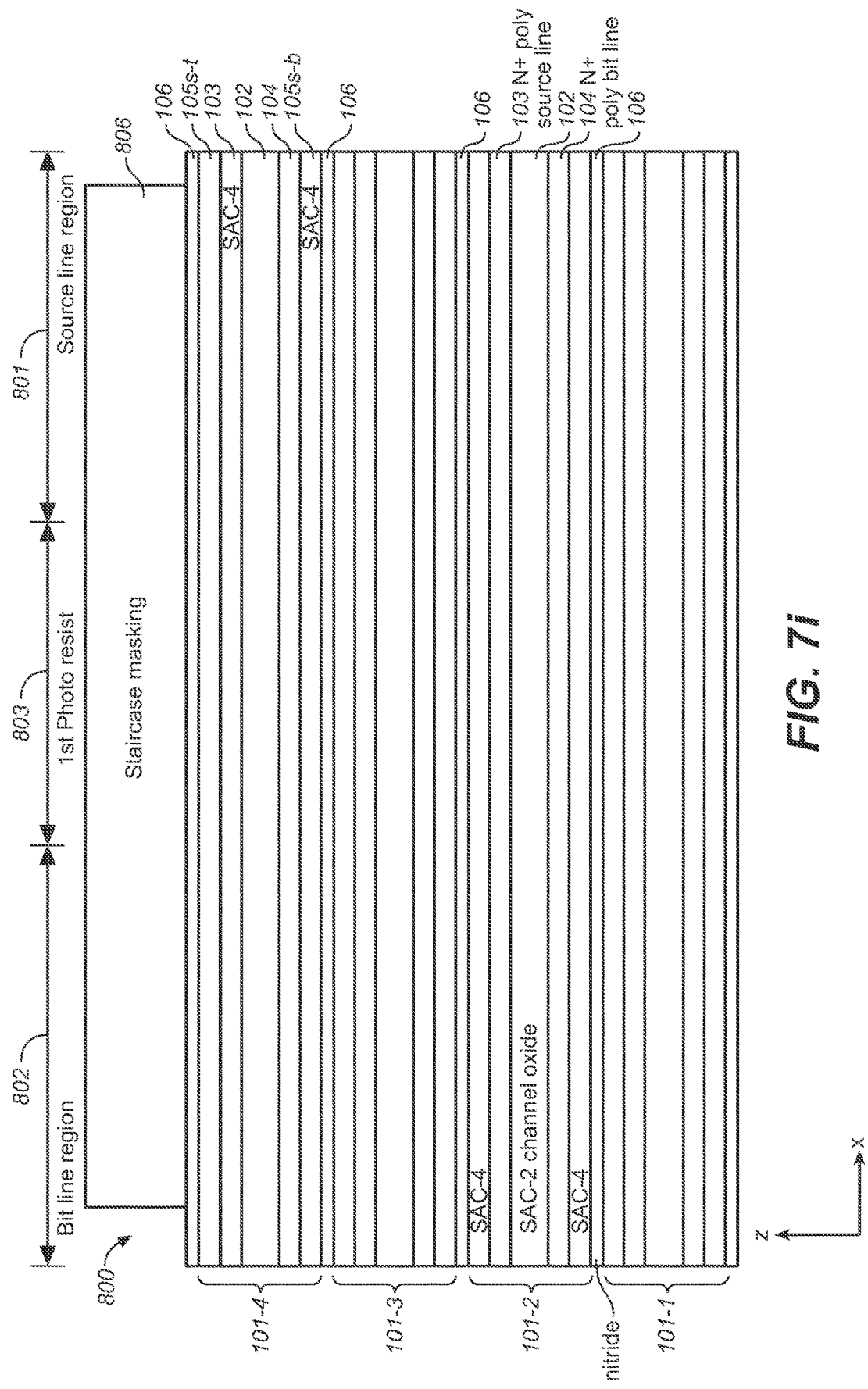
FIGS. 7(i) to 7(ix) illustrate yet another method for fabricating a staircase structure in staircase portion 108 of memory structure 100, in accordance with one embodiment of the present invention.
Figure 7I:
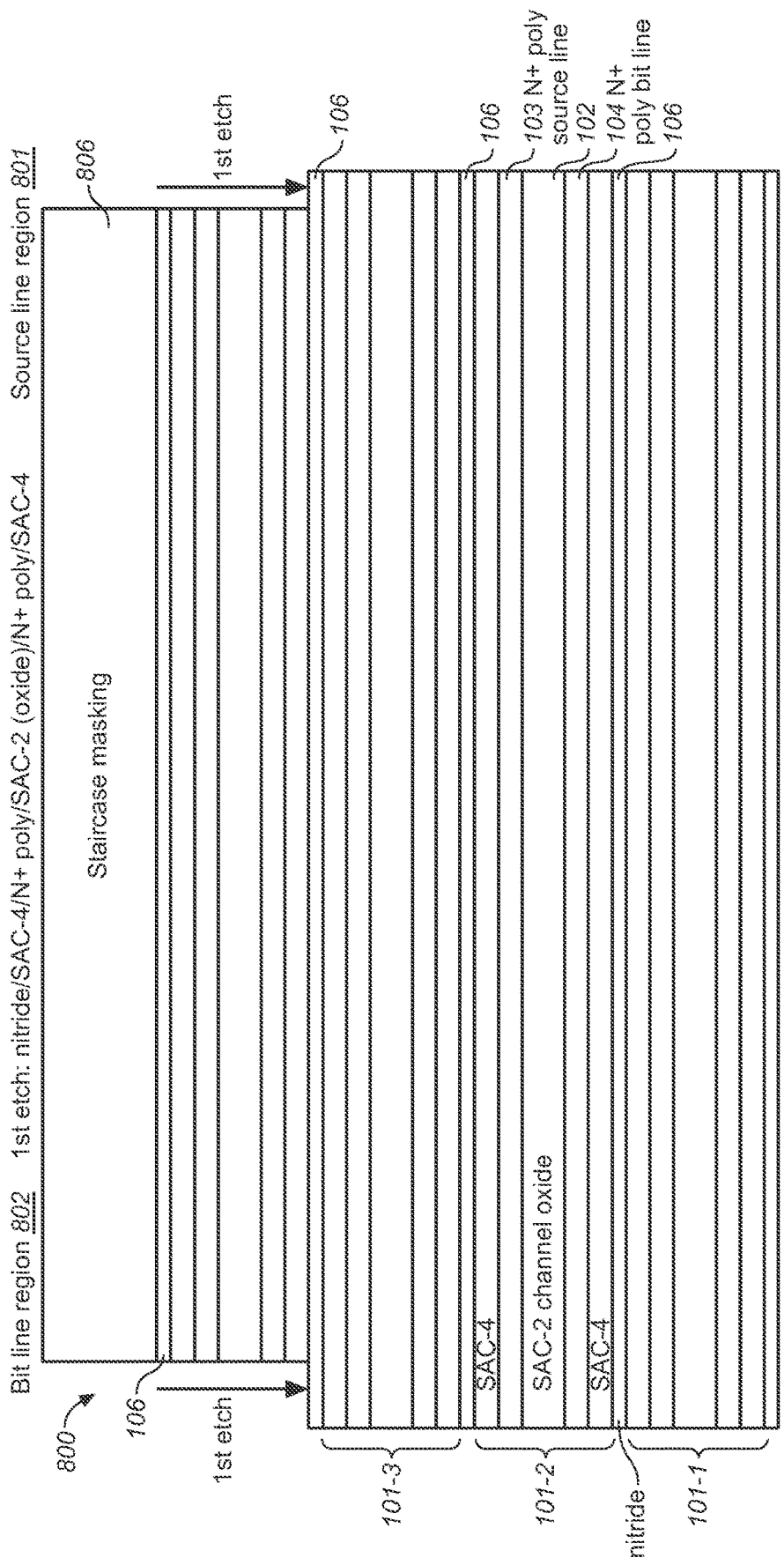
Figure 7I:
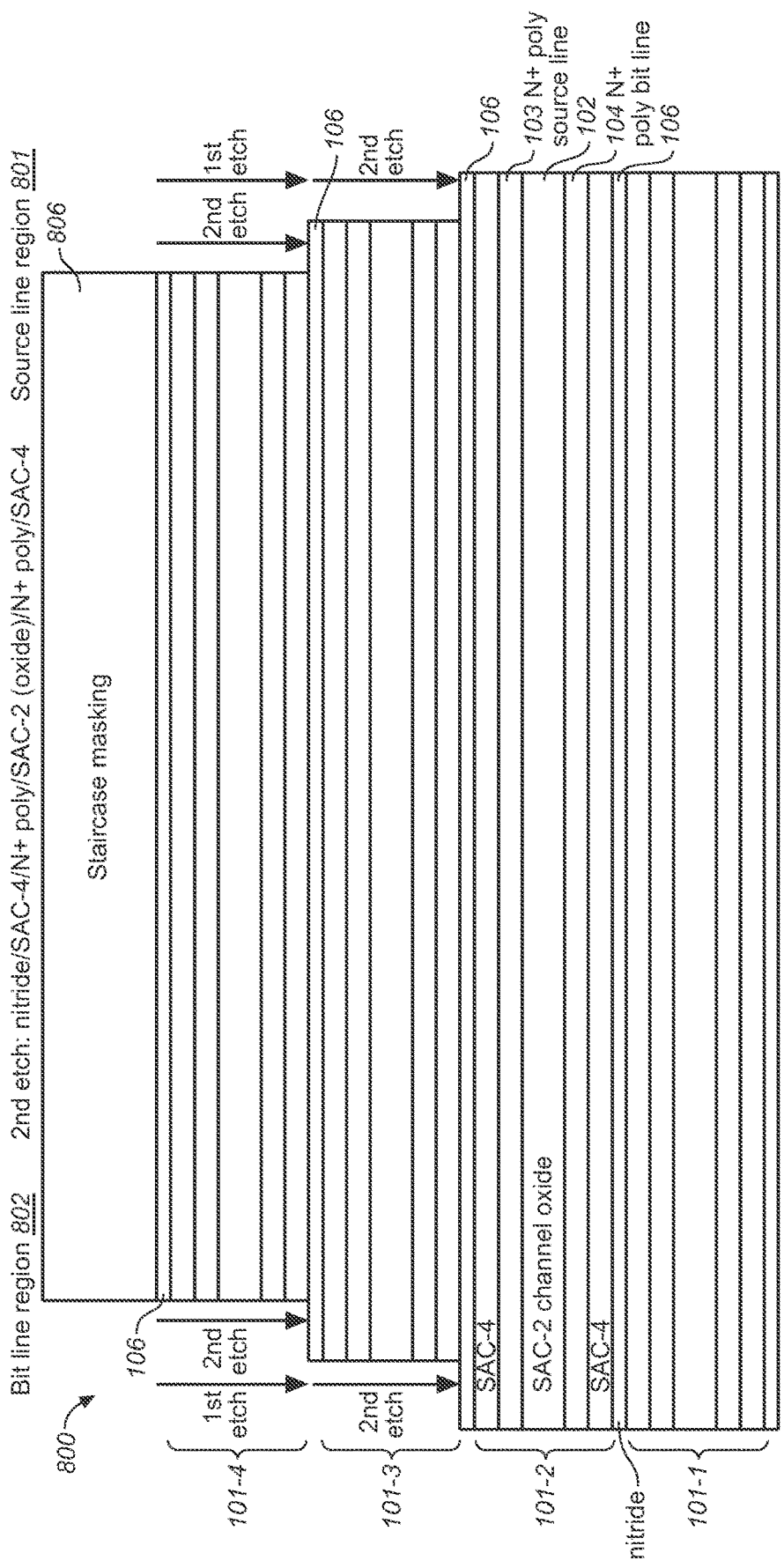
Figure 7V:
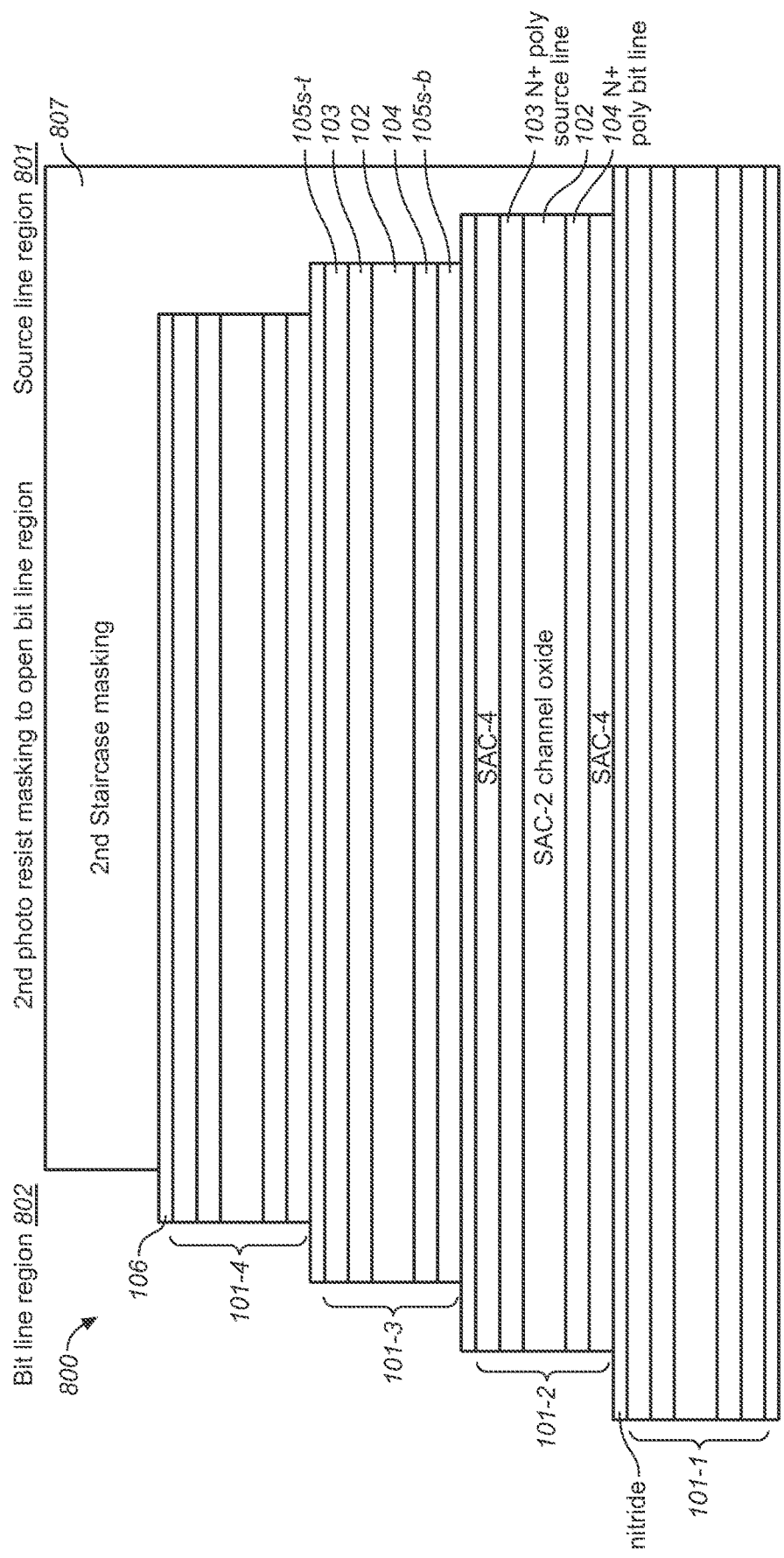
Figure 7V:
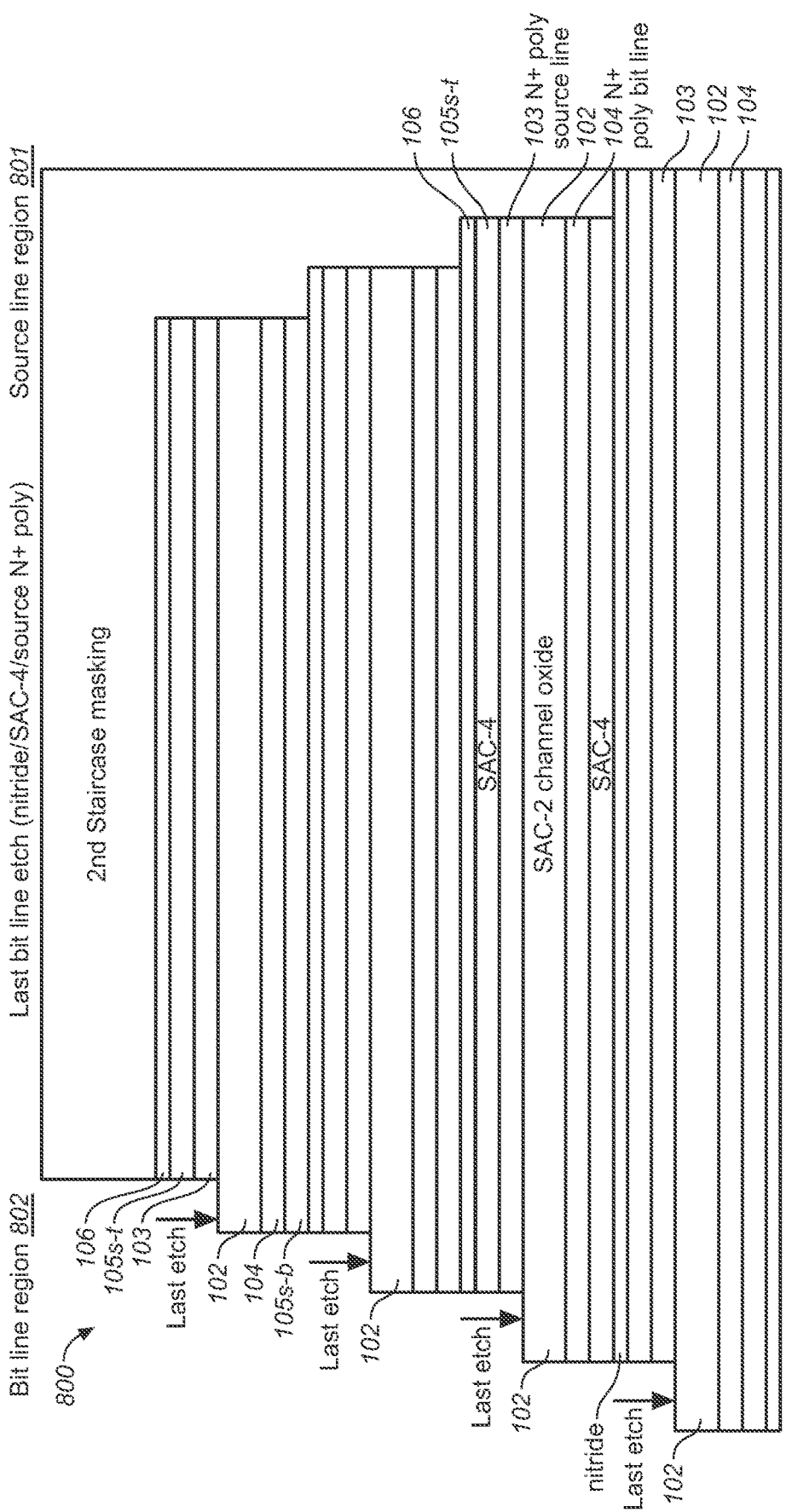
Figure 7I:
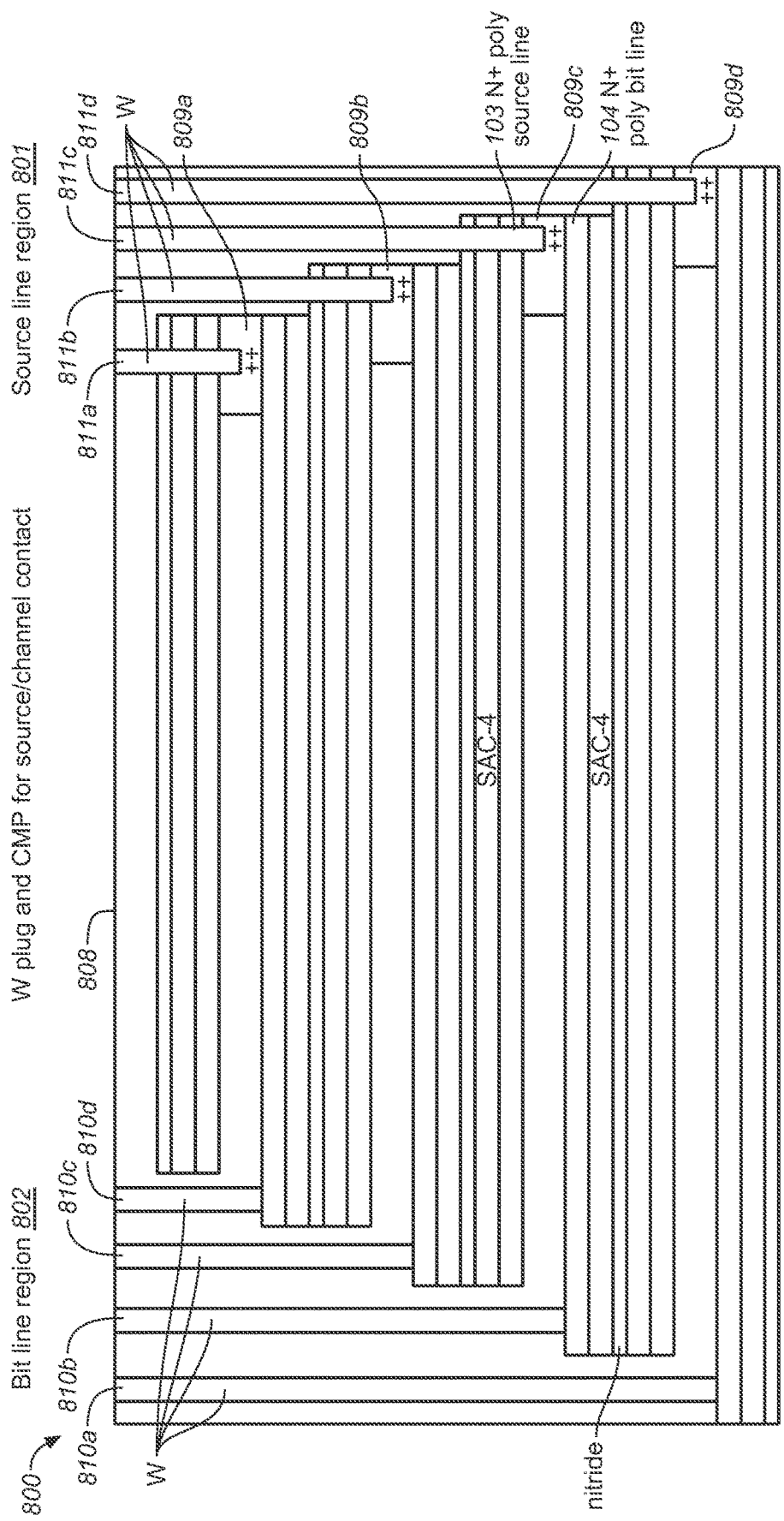

FIG. 6(x) show filled vias 737a-737f in the staircase structures of active stacks 732b and 732d in staircase portion 108R. Each of filled vias 737a may be connected by conductors in global interconnect layer 712A to an adjacent one of conductive column 735C which, in turn, may be connected to a conductor in global interconnect 712B, as shown in FIG. 6(xi), for signal routing to circuitry in semiconductor substrate 150 or a corresponding bit line segment (not shown).

Alternatively, rather than depositing, patterning and etching P+ polysilicon 735 to provide local word lines 735W in array portion 109, as taught above with respect to FIGS.

6(vi)-6(viii), a damascene-type process, described in detail in Provisional Application IV, may be used instead, in which local word lines 735W in array portion 109 are formed by depositing a conductive material into via-like cavities created in a dielectric material (e.g., charge-trapping or storage material 733). In that arrangement, via-like cavities may be provided for subsequent filling by a conductive material to form conductive columns 735C in the staircase portions 108 of memory structure 700. These via-like cavities may be left unfilled when local word lines 735W are formed in array portions 109 of memory structure 700. These unfilled via-like cavities may be subsequently filled simultaneously with filling vias 737a-737f, using the same material (e.g., tungsten). In this manner, if a $P^+$ polysilicon material is used to provide local word lines 735W, a lower resistivity material can be used to form conductive columns 735C. In that damascene process also, one may choose to provide low-resistivity conductors (e.g., tungsten) in both local word lines 735W and conductive columns 735C. In that case, local word lines 735W and conductive columns 735C may be formed simultaneously.

The above detailed description is provided to illustrate specific embodiments of the present invention and is not intended to be limiting. Numerous modifications and variations within the scope of the present invention are possible. The present invention is set forth in the accompanying claims.

We claim:

1. A memory structure, comprising:
   a semiconductor substrate having a planar surface, wherein the semiconductor substrate has a plurality of circuit elements formed therein;
   an array of NOR memory strings comprising a memory array structure and a staircase structure, the array being formed above the planar surface with the staircase structure comprising a plurality of steps ascending along a first direction that is substantially orthogonal to the planar surface, the memory array comprising a plurality of active strips, one on top of another along the first direction, wherein (i) the active strips each being a part of a respective one of the NOR memory strings in the array, (ii) each active strip includes a portion that extends lengthwise along a second direction that is substantially parallel to the planar surface, thereby providing a respective one of the steps in the staircase structure, and (iii) each active strip comprises: (1) a first conductive layer, providing a first common source or drain region for thin-film transistors in the respective NOR memory string; (2) a second conductive layer underneath or above the first conductive layer, providing a second common source or drain region for thin-film transistors in the respective NOR memory string; (3) a first dielectric layer of an insulative material between and isolating the first conductive layer from the second conductive layer; and (4) a third semiconductor layer, wherein the semiconductor layer is embedded in the first dielectric layer of the active strip and in electrical contact with both the first conductive layer and the second conductive layer;
   a second dielectric layer adjacent the staircase structure;
   a first plurality of interconnect conductors each extending lengthwise along a third direction that is both substantially parallel the planar surface and substantially orthogonal to the second direction;
   a plurality of conductive columns each extending lengthwise along the first direction and electrically connected to an associated one of the first plurality of interconnect conductors, wherein each conductive column is situated adjacent to and on a side that is along the length of an associated one of the active strips, such that the conductive column is separated in the third direction and electrically insulated from the associated active strip by the second dielectric layer; and
   a third dielectric layer provided over the staircase structure, the third dielectric layer having embedded therein a plurality of vias each containing conductive material electrically connecting the first common source or drain region in an active strip to the conductive column associated with the active strip through the interconnect conductors associated with the associated conductive column.

2. The memory structure of claim 1, wherein each conductive column is electrically connected to an associated circuit element in the semiconductor substrate.

3. The memory structure of claim 2, further comprising a second plurality of interconnect conductors formed between the semiconductor substrate and the staircase structure, wherein the second plurality of interconnect conductors each extend along the third direction and wherein each one of the second plurality of interconnect conductors electrically connect one of the conductive columns to the associated circuit element.

4. The memory structure of claim 2, further comprising a plurality of conductive segments formed between the staircase structure and the semiconductor substrate, wherein each conductive column is electrically connected to the associated circuit element through one of the conductive segments.

5. The memory structure of claim 4, wherein each conductive segment is electrically connected to the second conductive layers of a plurality of the active strips.

6. The memory structure of claim 1, wherein the conductive columns each comprise polysilicon.

7. The memory structure of claim 1, wherein the conductive material in the vias comprises a refractory metal.

8. The memory structure of claim 7, wherein the refractory metal comprises tungsten.

9. The memory structure of claim 1, wherein the first conductive layer and the second conductive layer of each active strip comprise doped semiconductor material, and wherein each active strip further comprises a third conductive layer adjacent one of the first and the second semiconductor conductive layers of the active strip, the third conductive layer having an electrical resistivity lower than that of its adjacent conductive layer.

10. The memory structure of claim 1, wherein the semiconductor layer forms one or more channel regions of one or more thin-film transistors in the respective NOR memory strings.

* * * * *